US009859905B2

(12) United States Patent
Shionoiri et al.

(10) Patent No.: US 9,859,905 B2
(45) Date of Patent: Jan. 2, 2018

(54) SEMICONDUCTOR DEVICE, WIRELESS SENSOR, AND ELECTRONIC DEVICE

(71) Applicant: Semiconductor Energy Laboratory Co., LTD., Atsugi-shi, Kanagawa-ken (JP)

(72) Inventors: Yutaka Shionoiri, Kanagawa (JP); Kiyoshi Kato, Kanagawa (JP); Tomoaki Atsumi, Kanagawa (JP)

(73) Assignee: Semiconductor Energy Laboratory Co., LTD., Kanagawa-ken (JP)

( * ) Notice: Subject to any disclaimer, the term of this patent is extended or adjusted under 35 U.S.C. 154(b) by 0 days.

(21) Appl. No.: 14/862,284

(22) Filed: Sep. 23, 2015

(65) Prior Publication Data
US 2016/0094236 A1 Mar. 31, 2016

(30) Foreign Application Priority Data

Sep. 26, 2014 (JP) ................................. 2014-195976
Sep. 30, 2014 (JP) ................................. 2014-199685
(Continued)

(51) Int. Cl.
H03M 1/00 (2006.01)
H03M 1/12 (2006.01)
(Continued)

(52) U.S. Cl.
CPC ......... H03M 1/002 (2013.01); H03M 1/1245 (2013.01); *G11C 27/02* (2013.01); *H03M 1/466* (2013.01)

(58) Field of Classification Search
CPC ................... H03M 1/002; H03M 1/38–1/406
(Continued)

(56) References Cited

U.S. PATENT DOCUMENTS 4,728,819 A * 3/1988 Vu .......................... G11C 27/02
327/424
5,059,982 A * 10/1991 Bacrania ............. H03M 1/0836
341/161
(Continued)

FOREIGN PATENT DOCUMENTS

EP    1737044 A    12/2006
EP    2226847 A     9/2010
(Continued)

OTHER PUBLICATIONS

Kamiya.T et al. "Carrier transport properties and electronic structures of amorphous oxide semiconductors: the present status" Solid State Physics, vol. 44 , No. 9 , pp. 621-633 dated in Sep. 2009.
(Continued)

*Primary Examiner* — Howard Williams
(74) *Attorney, Agent, or Firm* — Nixon Peabody LLP; Jeffrey L. Costellia

(57) ABSTRACT

An object is to reduce power consumption of an analog-digital converter circuit. An analog potential obtained in a sensor or the like is held in a sample-and-hold circuit including a transistor with an extremely low off-state current. In the sample-and-hold circuit, the analog potential is held in a node which is able to hold a charge by turning off the transistor. Then, power supply to a buffer circuit or the like included in the sample-and-hold circuit is stopped to reduce power consumption. In a structure where a potential is held in each node, power consumption can be further reduced when a transistor with an extremely low off-state current is connected to a node holding a potential of a comparator, a successive approximation register, a digital-analog converter circuit, or the like, and power supply to these circuits is stopped.

24 Claims, 44 Drawing Sheets

(30) Foreign Application Priority Data

Oct. 10, 2014 (JP) .................................. 2014-208851
Dec. 1, 2014 (JP) .................................. 2014-242747

(51) Int. Cl.
*G11C 27/02* (2006.01)
*H03M 1/46* (2006.01)

(58) Field of Classification Search
USPC ................................. 327/91, 94, 96; 365/149
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,656,774 B1* | 12/2003 | Chow | H01L 29/167 257/E29.086 |
| 6,727,522 B1 | 4/2004 | Kawasaki et al. | |
| 6,788,567 B2 | 9/2004 | Fujimori | |
| 6,944,045 B2 | 9/2005 | Fujimori | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,187,045 B2* | 3/2007 | Braddock | H01L 29/66462 257/410 |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,659,892 B2 | 2/2010 | Tanada et al. | |
| 7,674,650 B2 | 3/2010 | Akimoto et al. | |
| 7,701,376 B2* | 4/2010 | Oshima | H03M 1/1009 341/155 |
| 7,732,819 B2 | 6/2010 | Akimoto et al. | |
| 7,821,441 B2* | 10/2010 | Westwick | H03M 1/002 341/155 |
| 7,952,323 B2 | 5/2011 | Lamothe | |
| 8,289,753 B2* | 10/2012 | Yamazaki | G11C 11/405 365/149 |
| 8,446,171 B2 | 5/2013 | Takahashi | |
| 8,610,611 B2* | 12/2013 | Venkatraman | H03M 3/04 341/143 |
| 2001/1004602 | 11/2001 | Tai et al. | |
| 2002/1005683 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113565 A1 | 6/2006 | Abe et al. | |
| 2006/1011353 | 6/2006 | Sano et al. | |
| 2006/1011354 | 6/2006 | Den et al. | |
| 2006/0170111 A1 | 8/2006 | Isa et al. | |
| 2006/1016997 | 8/2006 | Isa et al. | |
| 2006/0197092 A1 | 9/2006 | Hoffman et al. | |
| 2006/1020897 | 9/2006 | Kimura | |
| 2006/0231882 A1 | 10/2006 | Kim et al. | |
| 2006/0238135 A1 | 10/2006 | Kimura | |
| 2006/1022897 | 10/2006 | Thelss et al. | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/1010844 | 5/2007 | Akimoto | |
| 2007/0172591 A1 | 7/2007 | Seo et al. | |
| 2007/1015221 | 7/2007 | Lai et al. | |
| 2007/0187760 A1 | 8/2007 | Furuta et al. | |
| 2007/0194379 A1 | 8/2007 | Hosono et al. | |
| 2007/1018767 | 8/2007 | Hirao et al. | |
| 2007/1025292 | 11/2007 | Ito et al. | |
| 2007/1027292 | 11/2007 | Kim et al. | |
| 2007/0287296 A1 | 12/2007 | Chang | |
| 2008/1000687 | 1/2008 | Mardilovich et al. | |
| 2008/0038929 A1 | 2/2008 | Chang | |
| 2008/1003888 | 2/2008 | Takechi et al. | |
| 2008/1005059 | 2/2008 | Nakagawara et al. | |
| 2008/0073653 A1 | 3/2008 | Iwasaki | |
| 2008/0083950 A1 | 4/2008 | Pan et al. | |
| 2008/1007956 | 4/2008 | Koyama | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/1018235 | 7/2008 | Cowdery-Corvan et al. | |
| 2008/1022413 | 9/2008 | Park et al. | |
| 2008/0254569 A1 | 10/2008 | Hoffman et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/1025813 | 10/2008 | Ito et al. | |
| 2008/1029656 | 12/2008 | Ryu et al. | |
| 2009/0068773 A1 | 3/2009 | Lai et al. | |
| 2009/1007332 | 3/2009 | Kuwabara et al. | |
| 2009/0134399 A1 | 5/2009 | Sakakura et al. | |
| 2009/1011491 | 5/2009 | Chang | |
| 2009/0152541 A1 | 6/2009 | Maekawa et al. | |
| 2009/1015250 | 6/2009 | Umeda et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0089975 A1 | 4/2011 | Yamazaki et al. | |
| 2011/0101332 A1 | 5/2011 | Yamazaki et al. | |
| 2011/0121878 A1 | 5/2011 | Kato et al. | |
| 2011/0148463 A1 | 6/2011 | Kato et al. | |
| 2011/0176357 A1 | 7/2011 | Koyama et al. | |
| 2011/0187410 A1 | 8/2011 | Kato et al. | |
| 2012/0112937 A1 | 5/2012 | Yamase et al. | |
| 2012/0248451 A1* | 10/2012 | Sone | H01L 29/4908 257/59 |
| 2012/0274356 A1 | 11/2012 | Takahashi | |
| 2016/0117584 A1 | 4/2016 | Yoneda et al. | |

FOREIGN PATENT DOCUMENTS

| | | | |
|---|---|---|---|
| JP | 58111528 A | * | 7/1983 |
| JP | 60-198861 A | | 10/1985 |
| JP | 63-210022 A | | 8/1988 |
| JP | 63-210023 A | | 8/1988 |
| JP | 63-210024 A | | 8/1988 |
| JP | 63-215519 A | | 9/1988 |
| JP | 63-239117 A | | 10/1988 |
| JP | 63-265818 A | | 11/1988 |
| JP | 05-251705 A | | 9/1993 |
| JP | 08-264794 A | | 10/1996 |
| JP | 10-078836 | | 3/1998 |

(56) References Cited

FOREIGN PATENT DOCUMENTS

| | | |
|---|---|---|
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-029931 A | 2/2006 |
| JP | 2007-006290 | 1/2007 |
| WO | WO-2004/114391 | 12/2004 |

OTHER PUBLICATIONS

Jeon.S et al. "180nm Gate Length Amorphous InGaZnO Thin Film Transistor for High Density Image Sensor Applications" IEDM 10: Technical Digest of International Electron Devices Meeting, pp. 504-507 dated on Dec. 6, 2010.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined with Ultra Low-Power Driving Technology", SID Digest '09: SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:AL and SN-Doped Zinc Indium Oxide Thin Film Transistors for AMOLED Back-Plane", SID Digest '09: SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 55, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZNO Thin-Film Transistors Produced at Room Temperature"Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous in In—Ga—Zn-Oxide TFT", SID Digest '09: SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08: SID International Symposium Digest of Technical Papers, May 20, 2008, vol. 39, pp. 621-624.

Hirao.T et al., "Novel Top-Gate Zinc Oxide Thin-Film Transistors (ZNO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07: SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08: SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04: SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08: SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic film and its Bending Properties", SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", ADV. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09: SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phase for Display Application", SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214TH ECS Meeting, 2008, No. 2317, ECS.

Kimizuka.N. et al., "Spinel,YBFE2O4, and YB2FE3O7 Types of Structures for Compounds in the IN2O3 and SC2O3-A2O3-BO System [A; FE, GA, or AL; B: MN, FE, NI, CU, or ZN] at Temperatures over 1000° C. ", Journal of Solid State Chemistry, 1985, vol. 60, pp. 382-384.

Kimizuka.N. et al., "Syntheses and Single-Crystal Data of Homologous Compounds, In2O3(ZnO)m (m=3, 4, and 5), InGaO3(ZnO)3, and Ga2o3(ZnO)m (m=7, 8, 9, and 16) in the In2O3-ZnGa2O4-ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06: Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08: SID International Symposium Digest of Technical Papers, May 20, 2008, vol. 39, pp. 625-628.

(56) References Cited

OTHER PUBLICATIONS

Lee.M et al., "15.4:Excellent Performance of Indium-Oxide-Based Thin-Film Transistors by DC Sputtering", SID Digest '09: SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07: SID International Symposium Digest of Technical Papers, 2007, vol. 38, pp. 1673-1676.

Mo.Y et al., "Amorphous Oxide TFT Backplanes for Large Size AMOLED Displays", IDW '08: Proceedings of the 6th International Display Workshops, Dec. 3, 2008, pp. 581-584.

Nakamura.M et al., "The phase relations in the In2O3-Ga2ZnO4-ZnO system at 1350°C.", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", May 23, 2003, vol. 300, No. 5623, pp. 1269-1272.

Nowatari.H et al., "60.2: Intermediate Connector with Suppressed Voltage Loss for White Tandem OLEDS", SID Digest '09: SID International Symposium Digest of Technical Papers, May 31, 2009, vol. 40, pp. 899-902.

Oba.F et al., "Defect energetics in ZnO: A hybrid Hartree-Fock density functional study", Phys. Rev. B. (Physical Review. B), 2008, vol. 77, pp. 245202-1-245202-6.

Oh.M et al., "Improving the Gate Stability of ZnO Thin-Film Transistors with Aluminum Oxide Dieletric Layers", J. Electrochem. Soc. (Journal of the Electrochemical Society), 2008, vol. 155, No. 12, pp. H1009-H1014.

Ohara.H et al., "21.3:4.0 IN. QVGA AMOLED Display Using In—Ga—Zn-Oxide TFTs with a Novel Passivation Layer", SID Digest '09: SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09: SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water"Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Syposium Digest of Technical Papers, May 20, 2008, vol. 39, pp. 629-632.

Prins.M et al., "A Ferroelectric Transparent Thin-Film Transistor", Appl. Phys Lett. (Applied Physics Letters), Jun. 17, 1996, vol. 68, No. 25, pp. 3650-3652.

Sakata.J et al., "Development of 4.0-In. AMOLED Display with Driver Circuit Using Amorphous In—Ga—Zn-Oxide TFTs", IDW '09: Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3-In2O3-ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08: Proceedings of the 15th International Display Workshops, Dec. 3, 2008, pp. 1637-1640.

Tsuda.K et al., "Ultra Low Power Consumption Technologies for Mobile TFT-LCDs", IDW '02: Proceedings of the 9th International Display Workshops, Dec. 4, 2002, pp. 295-298.

Ueno.K et al., "Field-Effect Transistor on SrTiO3 with Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

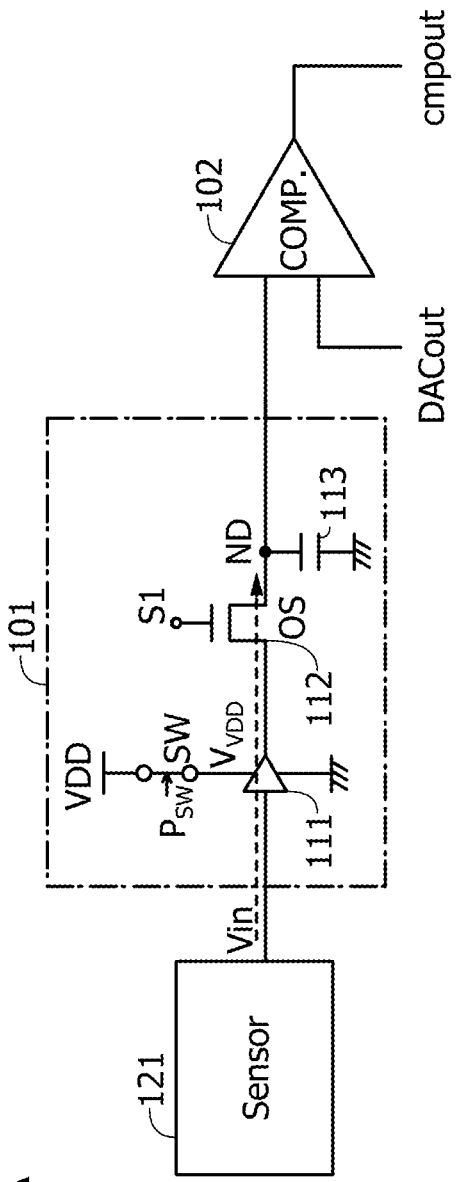
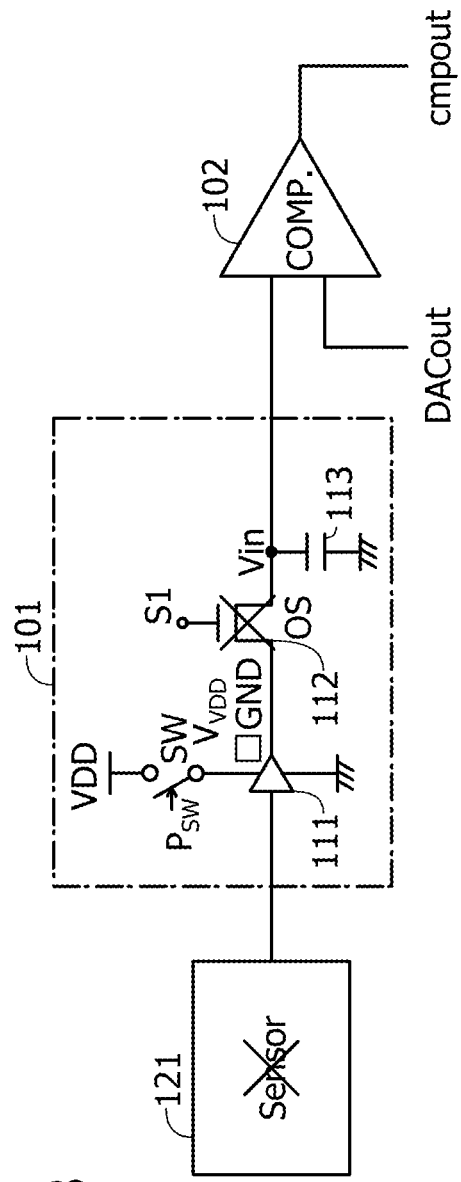

104

194,195,196

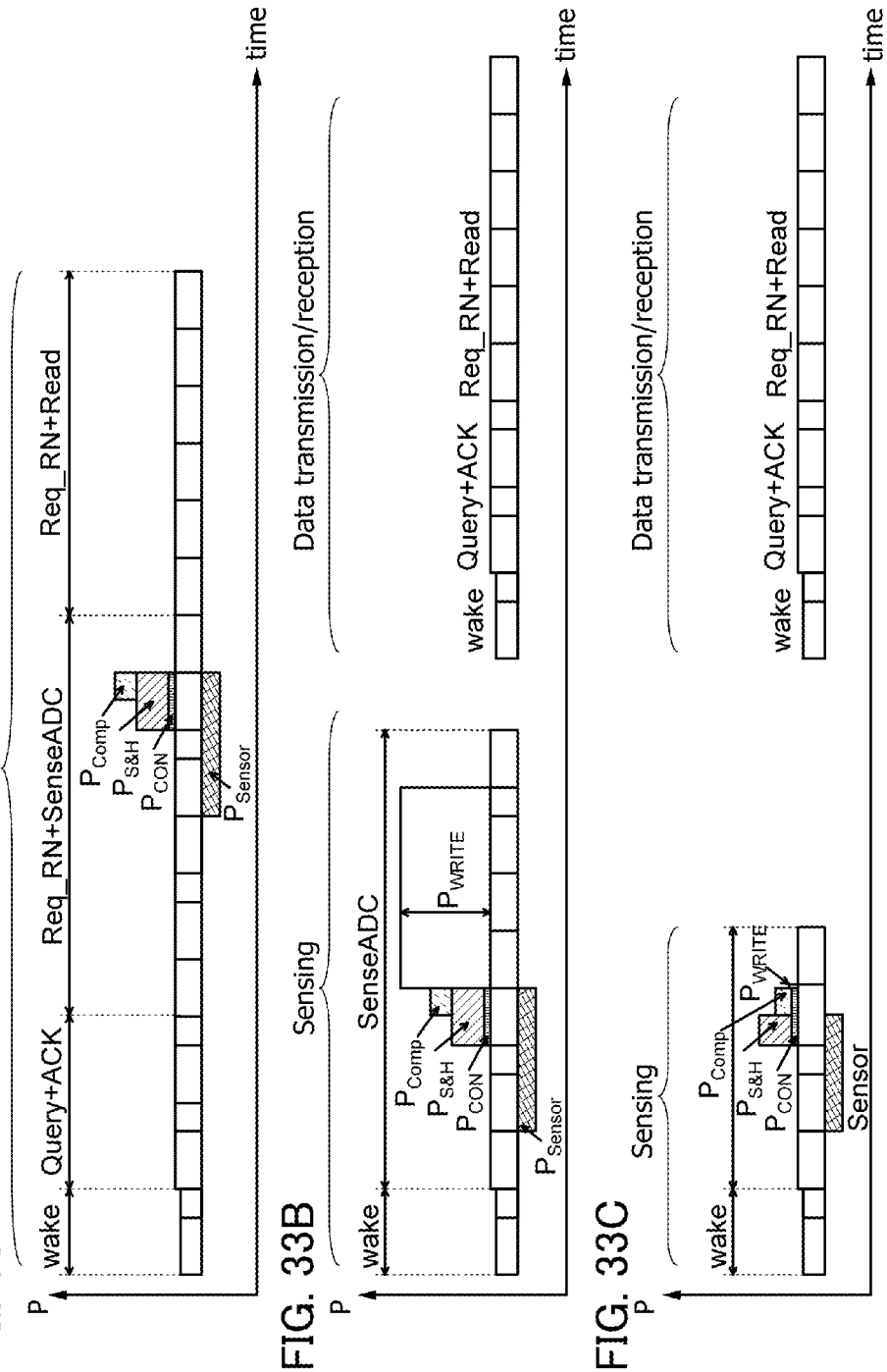

FIG. 37A
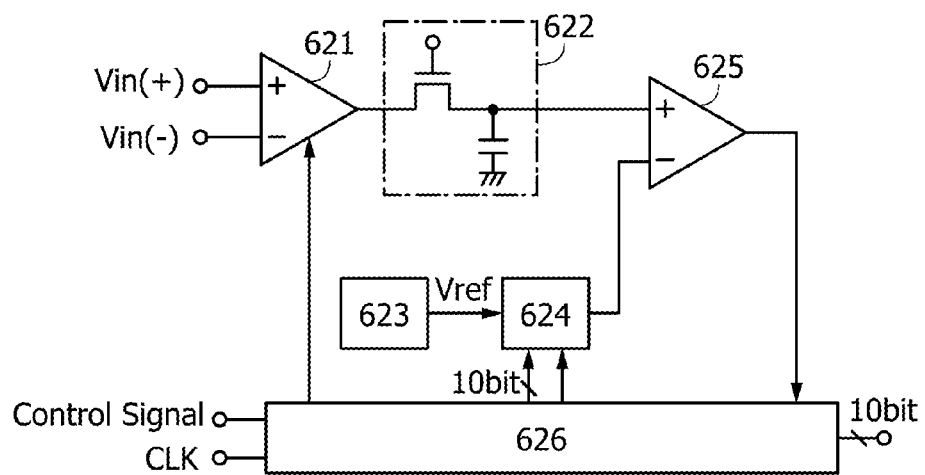
FIG. 37B-1 　　　FIG. 37B-2
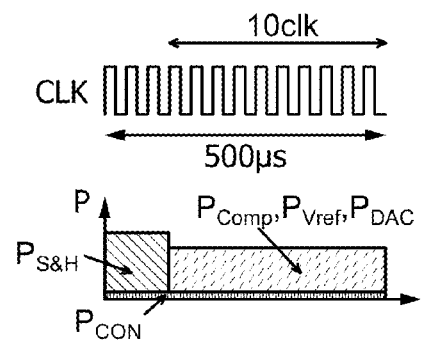 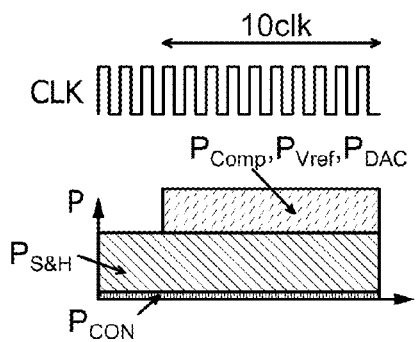

SEMICONDUCTOR DEVICE, WIRELESS SENSOR, AND ELECTRONIC DEVICE

BACKGROUND OF THE INVENTION

1. Field of the Invention

One embodiment of the present invention relates to a semiconductor device, a wireless sensor, and an electronic device.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specific examples of the technical field of one embodiment of the present invention disclosed in this specification include a semiconductor device, a display device, a light-emitting device, a power storage device, an imaging device, a memory device, a method for driving any of them, and a method for manufacturing any of them.

2. Description of the Related Art

An analog-digital converter circuit (hereinafter referred to as an AD converter), which is a kind of semiconductor device utilizing semiconductor characteristics, is mounted on various devices. Patent Document 1 discloses a structure of an AD converter that decreases power consumption.

REFERENCE

Patent Document

[Patent Document 1]
United States Patent Application Publication No. 2012/0112937

SUMMARY OF THE INVENTION

Generally, an AD converter is constantly supplied with power, and continues to output digital data while analog data is input. That is, the AD converter continuously consumes power while supplied with power.

Measures to reduce power consumption include decreasing a drive voltage, decreasing drive frequency and intermittently supplying power. However, decreasing a drive voltage and decreasing drive frequency are directly related to the resolution and sampling rate of the AD converter, therefore, decreasing a drive voltage or drive frequency leads to reduction in the performance of the AD converter. In addition, intermittently supplying power is available with the use of a flash memory for holding analog data, but additionally needs a dedicated high-voltage generation circuit and a dedicated peripheral circuit, which adversely leads to increase of power consumption.

In a wireless sensor or the like including an AD converter, increased power consumption of the AD converter causes a problem such as a shorter communication distance.

An object of one embodiment of the present invention is to provide a novel semiconductor device, a novel electronic device, or the like.

Another object of one embodiment of the present invention is to provide a low-power semiconductor device or the like having a novel structure. Another object of one embodiment of the present invention is to provide a semiconductor device or the like having a novel structure that does not decrease the performance of an AD converter, such as the resolution and sampling rate. Another object of one embodiment of the present invention is to provide a semiconductor device or the like having a novel structure that does not require a dedicated high-voltage generation circuit and a dedicated peripheral circuit for holding analog data. Another object of one embodiment of the present invention is to provide a wireless sensor with an AD converter or the like having a novel structure that enables extension of a communication distance.

Note that the objects of the present invention are not limited to the above objects. The objects described above do not disturb the existence of other objects. The other objects are the ones that are not described above and will be described below. The other objects will be apparent from and can be derived from the description of the specification, the drawings, and the like by those skilled in the art. One embodiment of the present invention is to solve at least one of the aforementioned objects and the other objects.

One embodiment of the present invention is a semiconductor device including a sample-and-hold circuit, a comparator, a successive approximation register, a digital-analog converter circuit, and a timing controller. The sample-and-hold circuit includes a buffer circuit and a first circuit. The first circuit includes a first transistor and a first capacitor. One of a source and a drain of the first transistor is supplied with an analog potential output from the buffer circuit. The other of the source and drain of the first transistor holds a charge corresponding to the analog potential when the first transistor is turned off. Supply of a power supply voltage to the buffer circuit is stopped after the analog potential is held.

In the semiconductor device of one embodiment of the present invention, the timing controller preferably outputs a signal for controlling an on/off state of the first transistor.

In the semiconductor device of one embodiment of the present invention, a channel formation region of the first transistor preferably includes an oxide semiconductor.

One embodiment of the present invention is a semiconductor device including a sample-and-hold circuit, a comparator, a successive approximation register, a digital-analog converter circuit, and a timing controller. The sample-and-hold circuit includes a buffer circuit and a first circuit. The digital-analog converter circuit includes a plurality of selectors and a second circuit. The first circuit includes a first transistor and a first capacitor. One of a source and a drain of the first transistor is supplied with an analog potential output from the buffer circuit. The other of the source and drain of the first transistor holds a charge corresponding to the analog potential when the first transistor is turned off. Supply of a power supply voltage to the buffer circuit is stopped after the analog potential is held. The second circuit includes a second transistor and a second capacitor. One of a source and a drain of the second transistor is supplied with a potential of a digital signal output from the successive approximation register. The other of the source and drain of the second transistor holds a charge corresponding to the potential of the digital signal when the second transistor is turned off. Supply of a power supply voltage to the successive approximation register, the comparator, and the digital-analog converter circuit is stopped after the analog potential is held.

In the semiconductor device of one embodiment of the present invention, the timing controller preferably outputs a signal for controlling on/off states of the first transistor and the second transistor.

In the semiconductor device of one embodiment of the present invention, channel formation regions of the first transistor and the second transistor each preferably include an oxide semiconductor.

One embodiment of the present invention is an electronic device including the above-described semiconductor device and a display portion.

One embodiment of the present invention is a wireless sensor including the above-described semiconductor device, an antenna, an integrated circuit portion, and a sensor circuit. The integrated circuit portion includes a memory circuit. The sensor circuit outputs an analog signal.

In the wireless sensor of one embodiment of the present invention, it is preferred that the memory circuit include a third transistor and a fourth transistor; one of a source and a drain of the third transistor be electrically connected to a gate of the fourth transistor, and hold a charge corresponding to data when the third transistor is turned off; and a channel formation region of the third transistor include an oxide semiconductor.

In the wireless sensor of one embodiment of the present invention, a channel formation region of the fourth transistor preferably includes silicon.

Note that other embodiments of the present invention will be described in Embodiments below and the drawings.

One embodiment of the present invention can provide a novel semiconductor device, a novel electronic device, or the like.

According to one embodiment of the present invention, it is possible to provide a low-power semiconductor device or the like having a novel structure. According to one embodiment of the present invention, it is possible to provide a semiconductor device or the like having a novel structure that does not decrease the performance of an AD converter, such as the resolution and sampling rate. According to one embodiment of the present invention, it is possible to provide a semiconductor device or the like having a novel structure that does not require a dedicated high-voltage generation circuit and a dedicated peripheral circuit for holding analog data. According to one embodiment of the present invention, it is possible to provide a wireless sensor with an AD converter or the like having a novel structure that enables extension of a communication distance.

Note that the effects of the present invention are not limited to the above effects. The effects described above do not disturb the existence of other effects. The other effects are the ones that are not described above and will be described below. The other effects will be apparent from and can be derived from the description of the specification, the drawings, and the like by those skilled in the art. One embodiment of the present invention is to have at least one of the aforementioned effects and the other effects. Therefore, one embodiment of the present invention does not have the effects described above in some cases.

BRIEF DESCRIPTION OF THE DRAWINGS

In the accompanying drawings:

FIGS. 2A and 2B are block diagrams for illustrating one embodiment of the present invention;

FIGS. 33A to 33C illustrate time dependence of power for illustrating one embodiment of the present invention;

FIGS. 37A, 37B1 and 37B2 are block diagrams for illustrating one embodiment of the present invention;

DETAILED DESCRIPTION OF THE INVENTION

Figure 1:
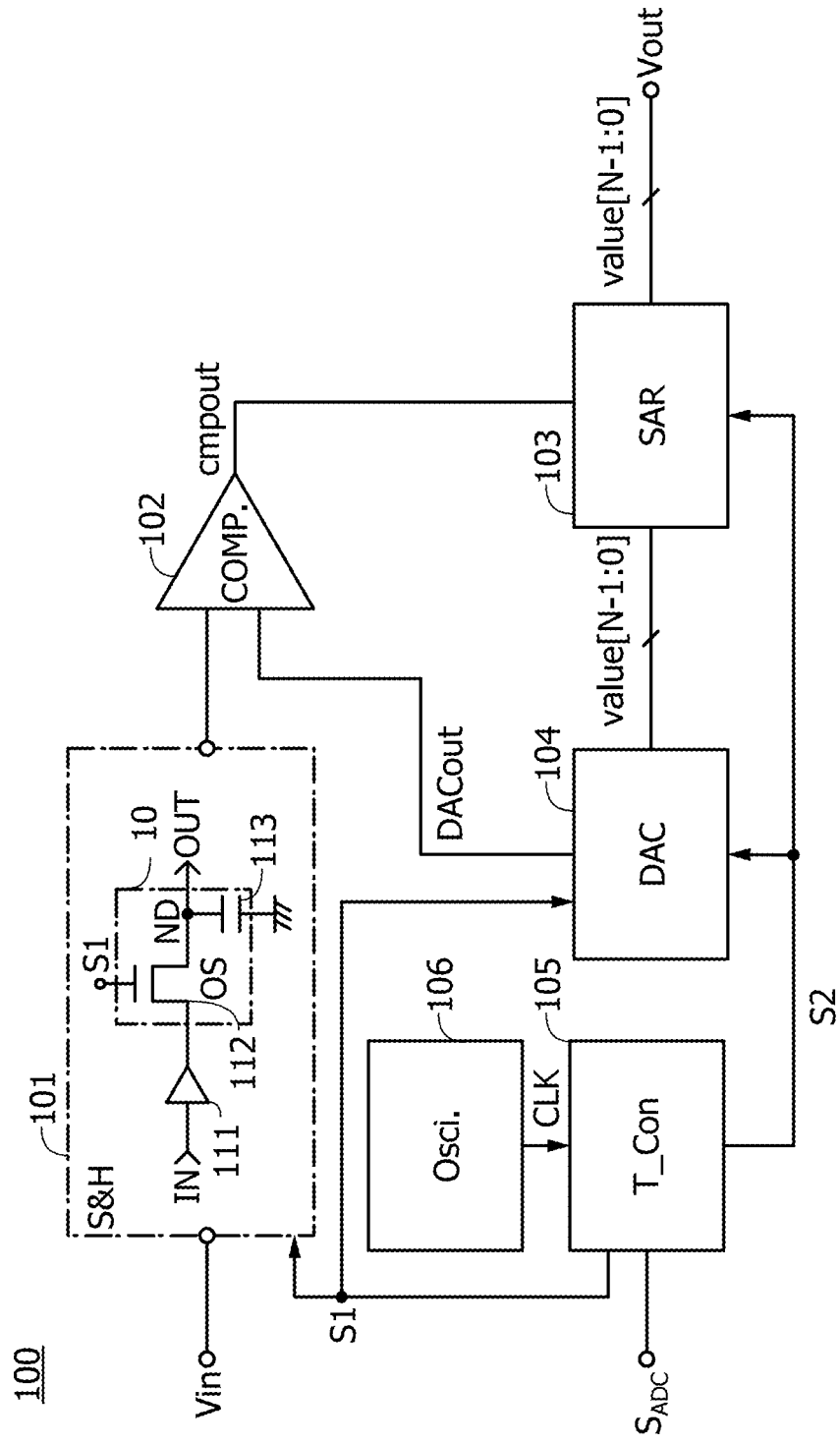
FIG. 1 is a block diagram for illustrating one embodiment of the present invention.

Embodiments will be described below with reference to the drawings. However, the embodiments can be implemented with various modes. It will be readily appreciated by those skilled in the art that modes and details can be changed in various ways without departing from the spirit and scope of the present invention. Therefore, the present invention should not be interpreted as being limited to the description of Embodiments below.

In this specification and the like, ordinal numbers such as first, second, and third are used in order to avoid confusion among components. Thus, the terms do not limit the number or order of components.

In the drawings, the same components, components having similar functions, components formed of the same material, or components formed at the same time are denoted by the same reference numerals in some cases, and description thereof is not repeated in some cases.

Embodiment 1

A structure of a semiconductor device of one embodiment of the present invention is described with reference to FIG. 1.

In this specification and the like, a semiconductor device generally means a device that has semiconductor characteristics. Furthermore, a semiconductor device sometimes means a circuit utilizing semiconductor characteristics or the whole of a system including the circuit.

FIG. 1 is a block diagram illustrating the structure of a semiconductor device in one embodiment of the present invention.

A semiconductor device 100 includes a sample-and-hold circuit 101 (denoted by S&H in the drawing), a comparator 102 (denoted by COMP in the drawing), a successive approximation register 103 (denoted by SAR in the drawing), a digital-analog converter circuit 104 (also referred to as a DA converter, and denoted by DAC in the drawing), a timing controller 105 (denoted by T_Con in the drawing), and an oscillator circuit 106 (denoted by Osci. in the drawing).

The sample-and-hold circuit 101, to which a potential of analog data (an analog potential Vin) is input, holds a charge corresponding to the analog potential Vin in accordance with control by a control signal S1. The control signal S1 is a signal supplied by the timing controller 105.

The sample-and-hold circuit 101 includes, for example, a buffer circuit 111, a transistor 112, and a capacitor 113. An input terminal of the sample-and-hold circuit 101 is connected to one of a source and a drain of the transistor 112. An output terminal of the sample-and-hold circuit 101 is connected to the other of the source and drain of the transistor 112. Note that a node at the other of the source and drain of the transistor 112 is referred to as a node ND for description.

The buffer circuit 111 amplifies a signal such as analog data input to the sample-and-hold circuit 101 and outputs the amplified signal. Although the buffer circuit 111 is provided between the input terminal of the sample-and-hold circuit 101 and the one of the source and drain of the transistor 112 in FIG. 1, the structure is not limited thereto and the buffer circuit 111 may be connected to a gate of the transistor 112.

The transistor 112 has an extremely low off-state current flowing between the source and drain. For such a transistor, a transistor whose channel formation region includes an oxide semiconductor (an OS transistor) is preferred. An OS transistor is described in detail in a below embodiment. In the drawings, "OS" is written beside a circuit symbol of an OS transistor for clarification. The one of the source and drain of the transistor 112 is connected to an output terminal of the buffer circuit 111. The gate of the transistor 112 is connected to a wiring for supplying a control signal S1. The other of the source and drain of the transistor 112 is connected to the output terminal of the sample-and-hold circuit 101 and the node ND.

The capacitor 113 holds a charge corresponding to the analog potential Vin when the transistor 112 is turned off. In FIG. 1, the capacitor 113 is connected to the other of the source and drain of the transistor 112, and connected to the node ND; however, the capacitor 113 is not necessarily provided and can be omitted when gate capacitance or the like in an input terminal of the comparator 102 is utilized. Note that a circuit including the transistor 112 and the capacitor 113 and holding the charge corresponding to the analog potential Vin is denoted by a first circuit 10 in the drawing.

The comparator 102 compares the level of the analog potential Vin held in the sample-and-hold circuit 101 and that of an analog potential DACout output by the digital-analog converter circuit 104, and outputs a signal cmpout in accordance with the comparison result.

The successive approximation register 103 holds a signal cmpout that changes in accordance with the analog potential DACout, as N-bit digital data (N is a natural number larger than or equal to 2), and outputs the data. The N-bit digital data, that is, the digital data from the 0th bit to the (N−1)-th bit (denoted by value[N−1:0] in the drawing), is output to the outside as Vout, and also output to the digital-analog converter circuit 104. The successive approximation register 103 includes a logic circuit including registers corresponding to respective bits, and can output digital data in accordance with control by a control signal S2. The control signal S2 is a signal supplied from the timing controller 105.

The digital-analog converter circuit 104 generates the analog potential DACout in accordance with the digital data, and outputs the potential. The digital-analog converter circuit 104 may be the conversion type with a capacitor (C-DAC) or the conversion type with a resistor (R-DAC). In particular, a C-DAC including an OS transistor is preferable to hold a digital value. Note that a structure of the C-DAC including an OS transistor is described in a below embodiment with a specific circuit structure.

Figure 9:
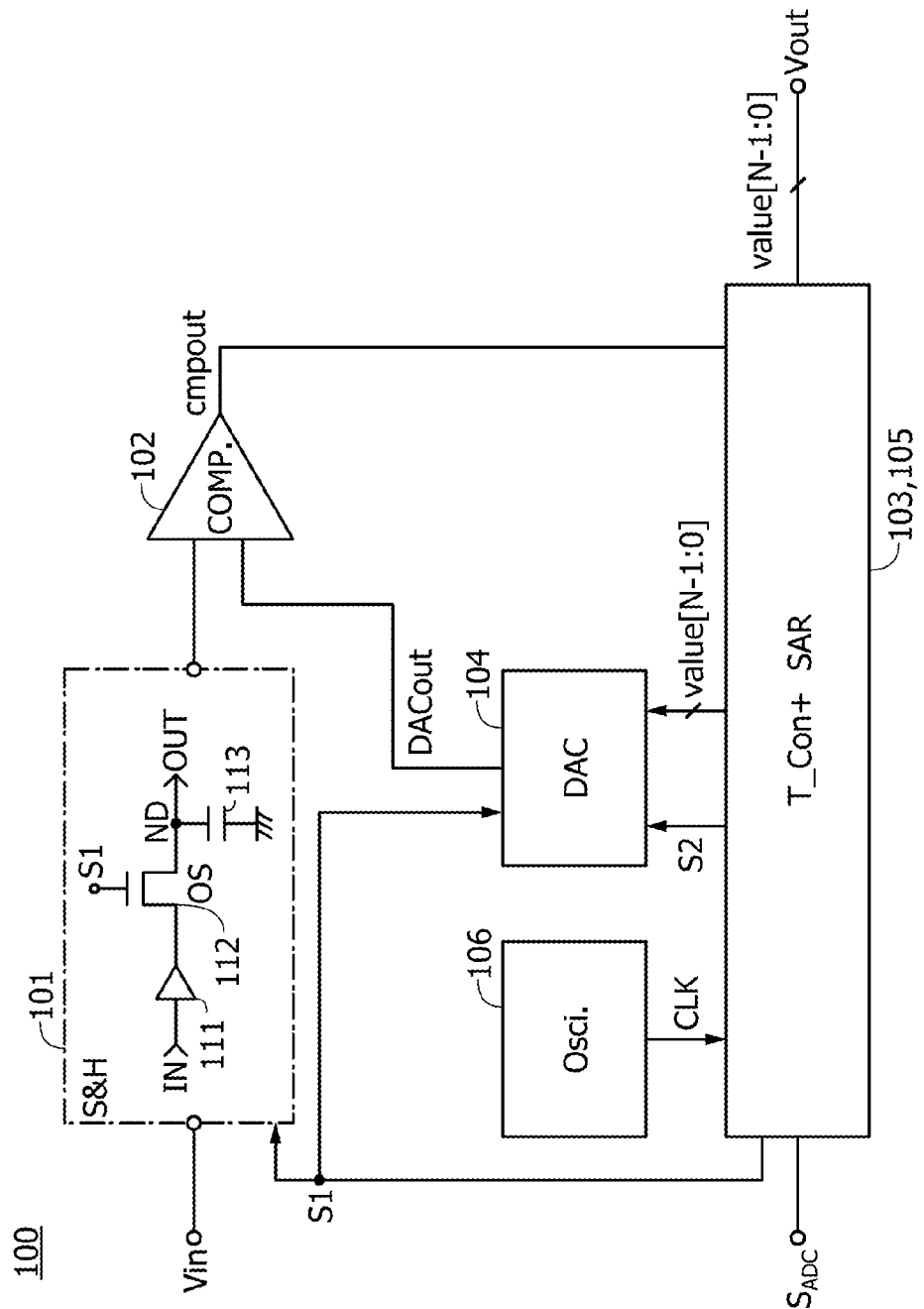
FIG. 9 is a block diagram for illustrating one embodiment of the present invention.

The timing controller 105 generates and outputs the control signals S1 and S2 in accordance with a signal $S_{CAD}$ and a clock signal CLK. The timing controller 105 includes a logic circuit, and can output the control signals S1 and S2 in accordance with the clock signal CLK and the signal $S_{ADC}$. The timing controller 105 including the logic circuit can be formed to be integral with the successive approximation register 103 including the logic circuit as shown in FIG. 9. The timing controller 105 is referred to as a control circuit in some cases.

The oscillator circuit 106 generates and outputs the clock signal CLK. The oscillator circuit 106 may be a crystal oscillator or a ring oscillator.

The semiconductor device 100 functioning as an AD converter in FIG. 1 makes the sample-and-hold circuit 101 including the transistor 112 with an extremely low off-state current hold the analog potential Vin obtained in the sensor circuit or the like. In the sample-and-hold circuit 101, the node ND that can hold a charge by turning off the transistor 112 holds the analog potential Vin. In one embodiment of the present invention, power consumption can be reduced by stopping power supply to the buffer circuit 111 included in the sample-and-hold circuit 101 or the like.

In one embodiment of the present invention, power consumption can be reduced without inhibiting the drive voltage or the frequency of the clock signal, so that it is possible to avoid decreasing the performance of the AD converter, such as the resolution or sampling rate. In one embodiment of the present invention, the analog data can be held without the use of a flash memory or the like, whereby power consumption can be reduced without the provision of a dedicated high-voltage generation circuit or a dedicated periphery circuit.

Next, an operation example of the semiconductor device 100 will be described, especially focused on the operation of the sample-and-hold circuit 101. In addition, effects due to one embodiment of the present invention will be described in detail.

FIGS. 2A and 2B illustrate a sensor circuit 121 that generates the analog potential Vin (denoted by Sensor in the drawings), the sample-and-hold circuit 101, and the comparator 102. The sample-and-hold circuit 101 includes a switch SW through which power is supplied to the buffer circuit 111.

The on/off state of the switch SW is controlled by a control signal $P_{SW}$. When the switch SW is turned on, a node $V_{VDD}$ has a potential VDD and then a potential difference between the potential VDD and a ground potential GND can be supplied as a power supply voltage. When the switch SW is turned off, the node $V_{VDD}$ has the ground potential GND, and power supply can be stopped.

As shown in FIG. 2A, when the switch SW is turned on and the transistor 112 is turned on by the control signal S1, the analog potential Vin is transmitted to the node ND (expressed by a dotted arrow in the drawing). Next, as shown in FIG. 2B, when the switch SW is turned off after the transistor 112 is turned off (a cross in the drawing), power supply to the buffer circuit 111 is stopped. As described above, since the transistor 112 has an extremely low off-state current, the analog potential Vin transmitted to the node ND can be continuously held by keeping the transistor 112 off even when the power supply to the buffer circuit 111 is stopped. Therefore, power supply to the sensor circuit 121 supplying the analog potential can also be stopped.

Figure 28A:
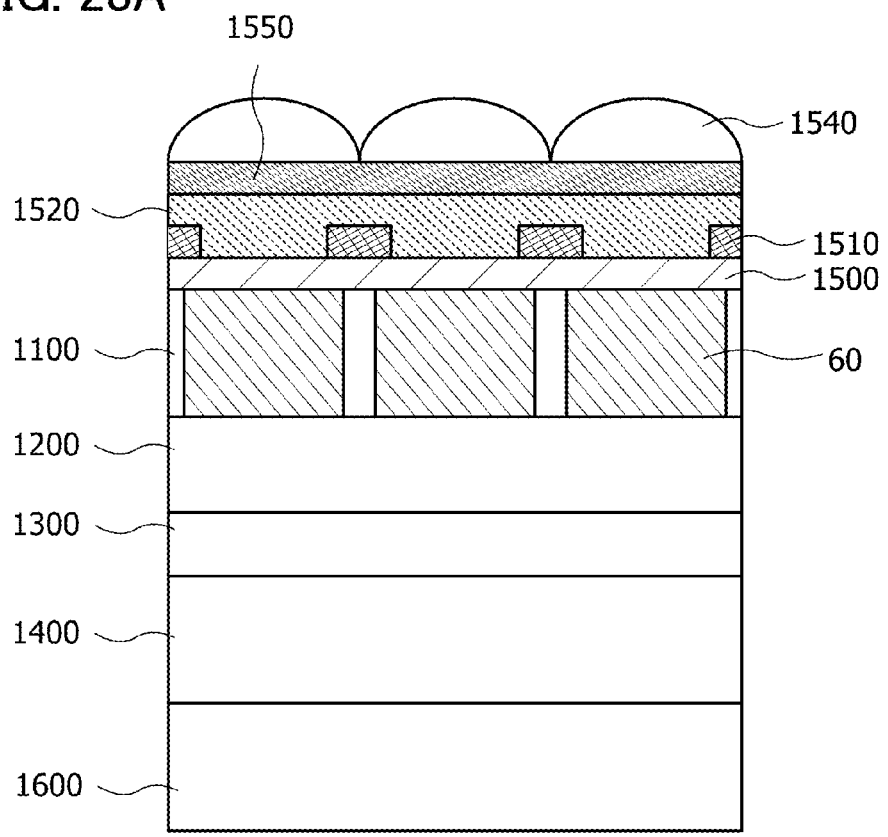
FIGS. 28A and 28B are each a schematic diagram for illustrating one embodiment of the present invention.
Figure 28B:
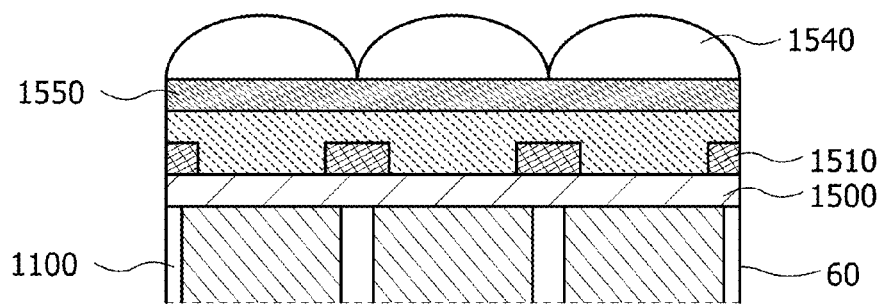
Figure 29A:
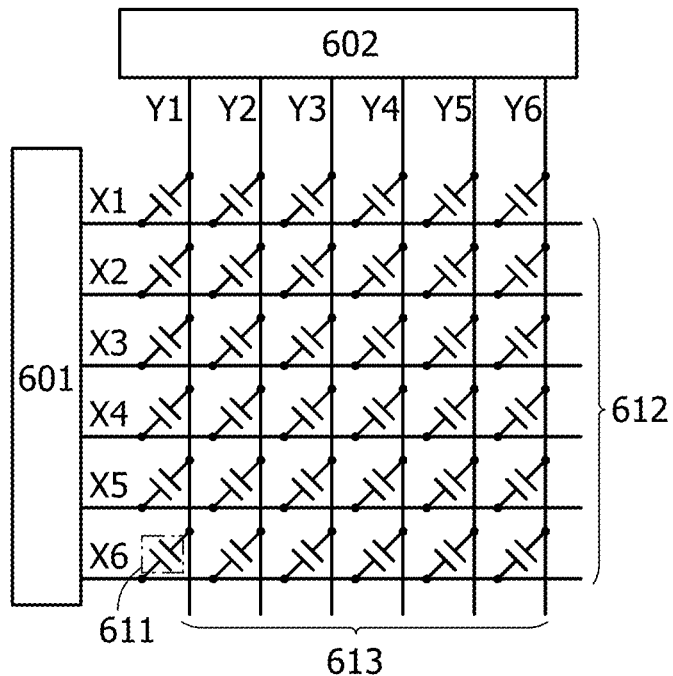
FIGS. 29A and 29B are a block diagram and a timing chart for illustrating one embodiment of the present invention.
Figure 29B:
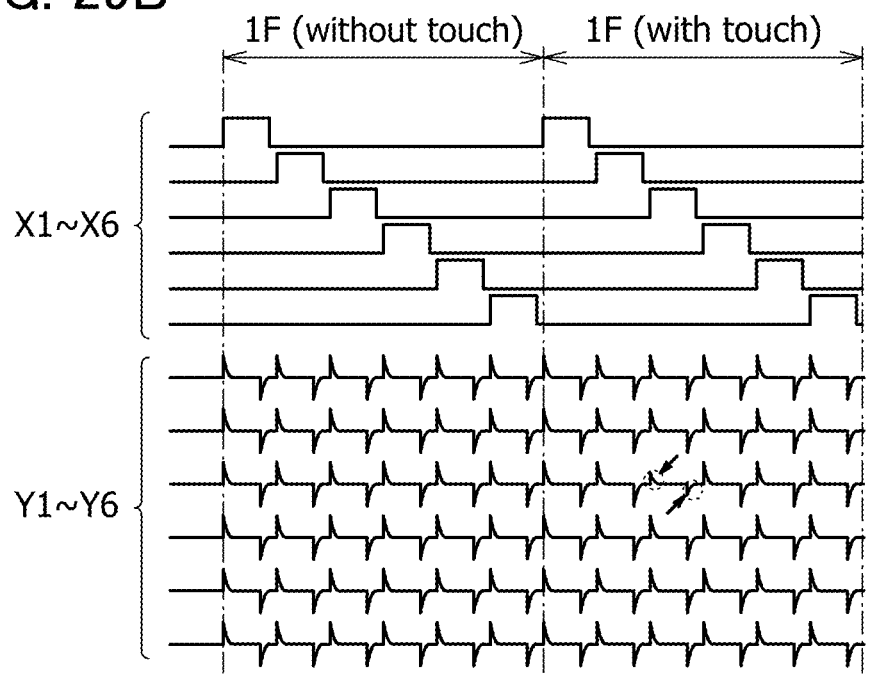

Note that the sensor circuit 121 outputs various data such as heat data or electromagnetic data as the analog data. For the sensor circuit, any of various sensors can be used as long as it can output an analog potential. As examples, a photosensor is shown in FIGS. 28A and 28B, and a touch sensor is shown in FIGS. 29A and 29B. Note that the sensor circuit may be formed in the same step as the semiconductor device or in a different step from that of the semiconductor device.

The photosensor shown in FIG. 28A includes a layer 1100 including a Si transistor and a photoelectric conversion element 60, a layer 1200 which is in contact with the layer 1100 and includes a wiring layer, a layer 1300 which is in contact with the layer 1200 and includes OS transistors, and a layer 1400 which is in contact with the layer 1300 and includes a wiring layer. An insulating layer 1500 is formed over the photoelectric conversion element 60 provided in the layer 1100. A supporting substrate 1600 is provided in contact with the layer 1400. Note that the layers 1200, 1300, and 1400 can be omitted as shown in FIG. 28B.

A light-blocking layer 1510 is formed over the insulating layer 1500. An organic resin layer 1520 is formed as a planarization film over the insulating layer 1500 and the light-blocking layer 1510. An optical conversion layer 1550 is formed over the organic resin layer 1520. A microlens array 1540 is provided over the optical conversion layer 1550, so that light penetrating a lens goes through the photoelectric conversion layer positioned therebelow to reach the photoelectric conversion element 60. Note that the layers over the insulating layer 1500, that is, the light-blocking layer 1510, the organic resin layer 1520, the optical conversion layer 1550, and/or the microlens array 1540 can be omitted.

Note that the OS transistors included in the layer 1300 may be provided in the layer including the transistor of the semiconductor device. In that case, reduction in cost or area can be achieved because the sensor circuit and the semiconductor device can be manufactured in the same step.

FIG. 29A is a block diagram illustrating a structure of a mutual capacitive touch sensor. FIG. 29A illustrates a pulse voltage output circuit 601 and a current detector circuit 602. Note that in FIG. 29A, six wirings X1 to X6 represent wirings 612 to which a pulse voltage is applied, and six wirings Y1 to Y6 represent wirings 613 that detect changes in current. FIG. 29A also illustrates a capacitor 611 formed using the wirings 612 and 613 overlapping with each other.

The pulse voltage output circuit 601 is a circuit for sequentially applying pulse voltages to the wirings X1 to X6. By application of pulse voltages to the wirings X1 to X6, an electric field is generated between the wirings 612 and 613 forming the capacitor 611. When the electric field between the wirings is shielded, for example, a change occurs in mutual capacitance in the capacitor 611. Proximity or contact of an object can be sensed by utilizing this change.

The current detector circuit 602 is a circuit for detecting changes in current flowing through the wirings Y1 to Y6 caused by the change in the mutual capacitance in the capacitor 611. No change in current value is detected in the wirings Y1 to Y6 when there is no proximity or contact of an object, whereas a decrease in current value is detected when the mutual capacitance is decreased owing to proximity or contact of an object. Note that an integrator circuit or the like is used for detection of current values.

FIG. 29B is a timing chart of input and output waveforms in the mutual capacitive touch sensor shown in FIG. 29A. In FIG. 29B, sensing an object is performed in all the rows and columns in one frame period (1F). FIG. 29B shows a period when an object is sensed and a period when an object is not sensed. For the wirings Y1 to Y6, detected current values are shown as waveforms of voltage values.

Pulse voltages are sequentially applied to the wirings X1 to X6, and waveforms of the wirings Y1 to Y6 change in accordance with the pulse voltages. When there is no proximity or contact of an object, the waveforms of the wirings Y1 to Y6 change in accordance with changes in the voltages of the wirings X1 to X6. When there is proximity or contact of an object, the current value is decreased at the point of proximity or contact of the object and accordingly the waveform of the voltage value changes.

By detecting a change in mutual capacitance in this manner, proximity or contact of an object can be sensed. The structure is not limited to that shown in FIGS. 29A and 29B, and another touch sensor may be used.

Figure 3:
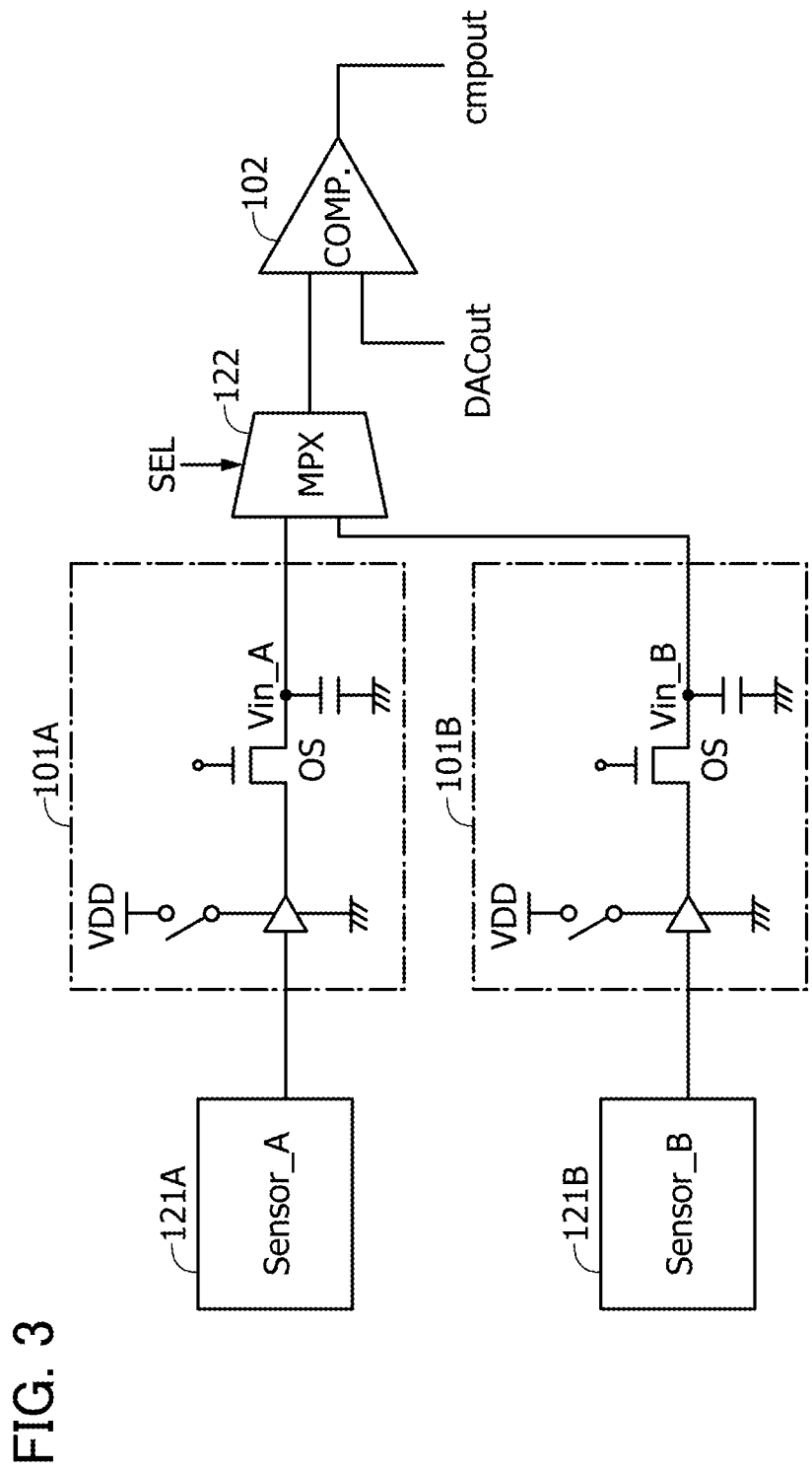
FIG. 3 is a block diagram for illustrating one embodiment of the present invention.

Although one sensor circuit is illustrated in FIGS. 2A and 2B, there may be a plurality of sensor circuits. For example, when sensor circuits 121A and 121B are provided as shown in FIG. 3, sample-and-hold circuits 101A and 101B are provided. In addition, a selector 122 (also referred to as a multiplexor, and denoted by MPX in the drawing) is provided between the comparator 102 and the sample-and-hold circuits 101A and 101B.

In accordance with a selection signal SEL, the selector 122 selects any one of the analog potentials of the sample-and-hold circuits 101A and 101B, and outputs the potential to the comparator 102. The sample-and-hold circuits 101A and 101B are each the same as the sample-and-hold 101 circuit described in FIG. 1 and FIGS. 2A and 2B, so that they can hold the analog potentials Vin_A and Vin_B obtained in the sensor circuits 121A and 121B, and power supply to the buffer circuit can be stopped. Accordingly, the operation can be performed to reduce power consumption. After once sampling the analog potentials Vin_A and Vin_B in the sample-and-hold circuits 101A and 101B, power supply to the sensor circuits 121A and 121B can be stopped to stop supply of the analog potentials Vin_A and Vin_B from the sensor circuits 121A and 121B. Accordingly, the power consumption of the sensor circuits 121A and 121B can be reduced.

The analog potential obtained in the sensor circuit may be constant or always be variable. When sampling a variable analog potential, the sampling may be performed with the use of a correlated double sampling (CDS) circuit. The CDS circuit is used to remove noise by obtaining relative difference between potentials in two timings.

Figure 4A:
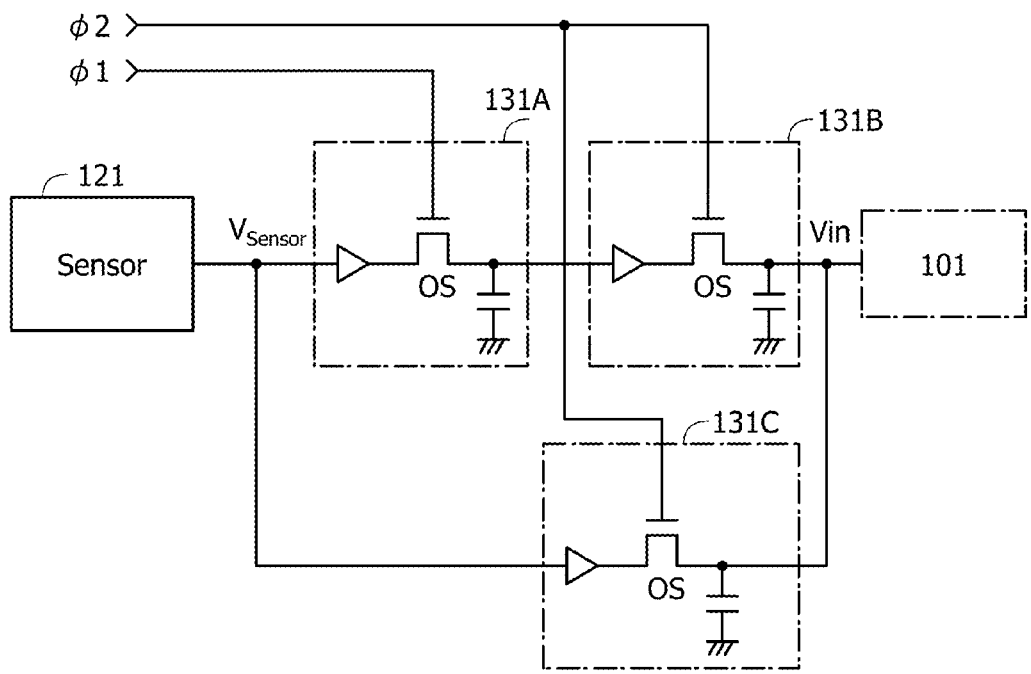
FIGS. 4A and 4B are a block diagram and a waveform diagram for illustrating one embodiment of the present invention.

FIG. 4A shows an example of the CDS circuit. The CDS circuit includes sample-and-hold circuits 131A to 131C. For the sample-and-hold circuits 131A to 131C, a circuit similar to the sample-and-hold circuit 101 shown in FIG. 1 or the like can be used. A control signal φ1 is supplied to a transistor of the sample-and-hold circuit 131A, and a control signal φ2 is supplied to transistors of the sample-and-hold circuits 131B and 131C.

The use of OS transistors as transistors that are turned off by the control signal φ1 and φ2 can reduce changes in the potential sampled for obtaining the difference. Thus, accuracy of the CDS circuit can be improved. In addition, after once sampling a potential, power supply to buffer circuits of the sample-and-hold circuits 131A to 131C can be stopped, whereby power consumption can be reduced.

Figure 4B:
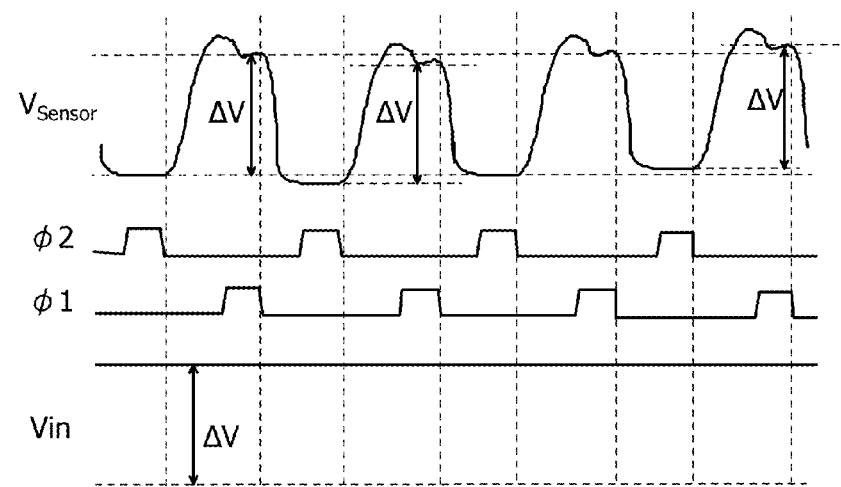

FIG. 4B shows a timing chart illustrating an operation example of the CDS circuit shown in FIG. 4A. Note that a potential $V_{Sensor}$ is a variable potential obtained in the sensor circuit 121, and the potential Vin is an analog potential transmitted through the CDS circuit. As shown in FIG. 4B, even when the potential $V_{Sensor}$ is variable, conducting sampling to obtain the difference in a regular cycle makes it possible to obtain the potential Vin as an analog potential that is constant at voltage ΔV.

Figure 5A:
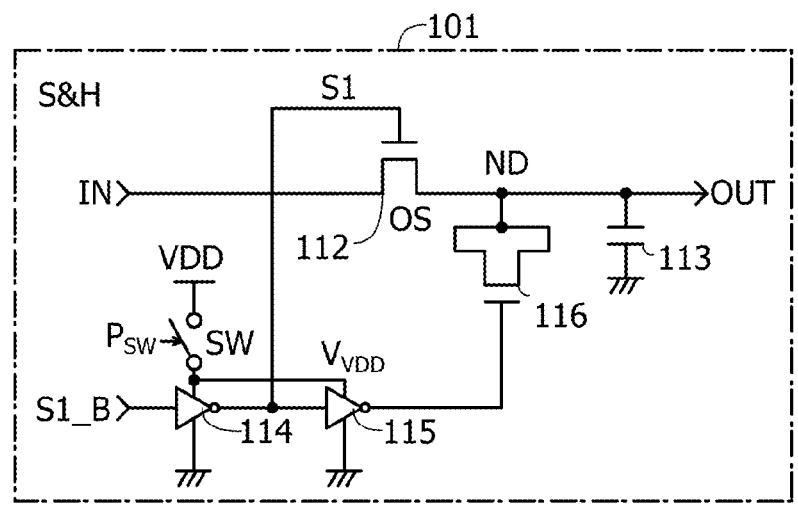
FIGS. 5A and 5B are a circuit diagram and a timing chart for illustrating one embodiment of the present invention.

FIG. 5A shows another structure example different from the sample-and-hold circuit shown in FIG. 1, FIGS. 2A and 2B, FIG. 3, and FIGS. 4A and 4B. The sample-and-hold circuit 101 shown in FIG. 5A includes inverter circuits 114 and 115 and an MOS capacitor 116 in addition to the transistor 112 and the capacitor 113. By including the MOS capacitor 116, the sample-and-hold circuit 101 can suppress charge injection.

As in the buffer circuit 111 illustrated in FIGS. 2A and 2B, the inverter circuits 114 and 115 are connected to the switch SW, and supplying or not supplying power is controlled by the control signal $P_{SW}$. A control signal S1_B whose logic is inverted from the logic of the control signal S1 is input to the inverter circuit 114, and the control signal S1 is supplied to the gate of the transistor 112 through the inverter circuit 114. To a gate of the MOS capacitor 116, a signal that is inverted from the control signal S1 through the inverter circuit 115 is supplied. A semiconductor layer of the MOS capacitor 116 is connected to the node ND.

Figure 5B:
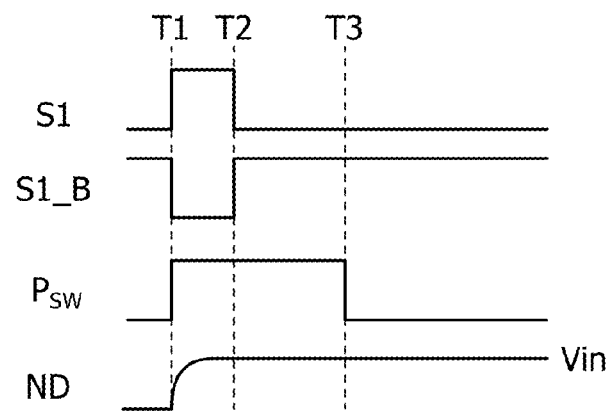

FIG. 5B is a timing chart illustrating an operation example of the sample-and-hold circuit in FIG. 5A.

First, the control signal $P_{SW}$ is set high in a period T1, whereby power is supplied to the inverter circuits 114 and 115. Conversely, if the control signal $P_{SW}$ is set low, power supply to the inverter circuits 114 and 115 will be stopped. In addition, the control signal S1 is set high and the control signal S1_B is set low, whereby the transistor 112 is turned on and the potential of the node ND increases to the potential Vin that is the potential of the input terminal IN.

In a period T2, the control signal S1 is set low and the control signal S1_B is set high, whereby the transistor 112 is turned off. Accordingly, the potential Vin of the node ND is held.

Next, in a period T3, the control signal $P_{SW}$ is set low. At this time, the control signal S1 is low and the control signal S1_B is high, whereby the potential Vin of the node ND is continuously held.

That is the operation example of the sample-and-hold circuit of FIG. 5A.

Figure 6:
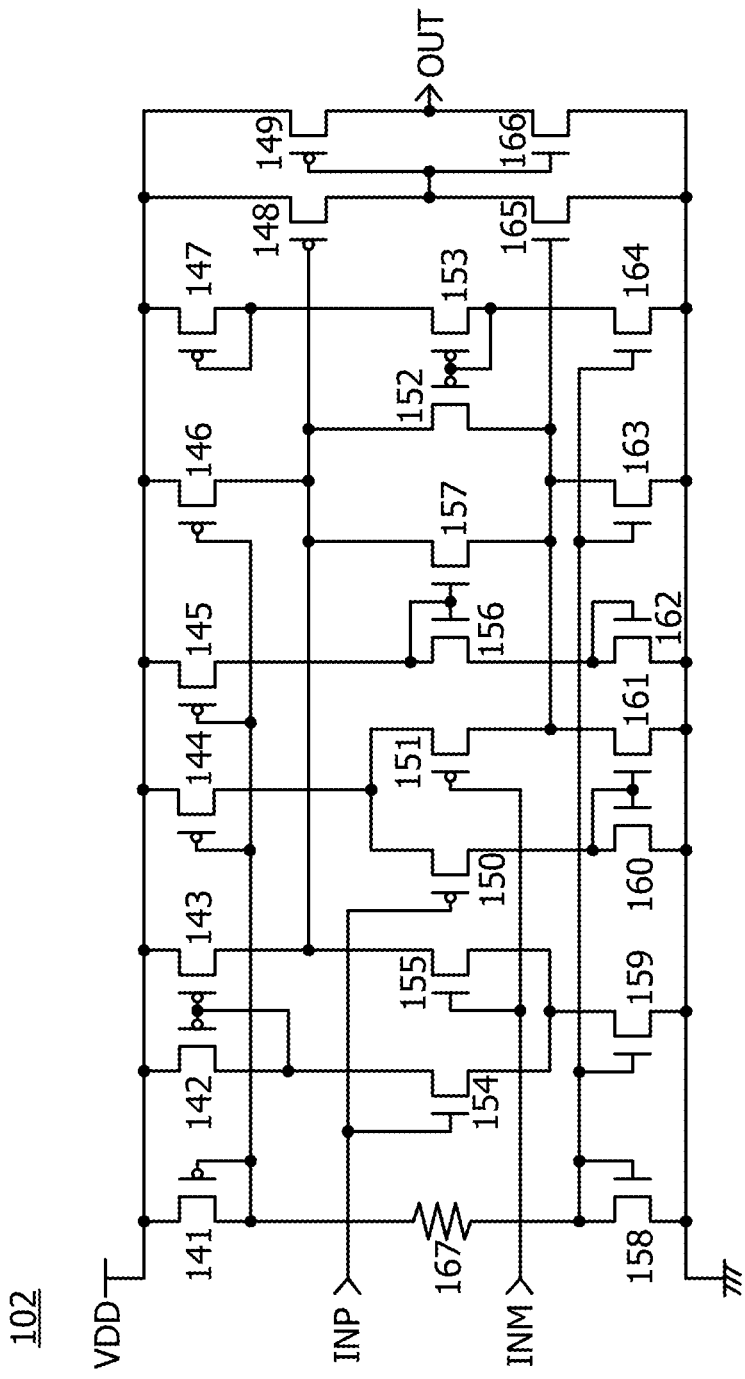
FIG. 6 is a circuit diagram for illustrating one embodiment of the present invention.

FIG. 6 shows a circuit structure example of the comparator 102. The comparator 102 shown in FIG. 6 includes p-channel transistors 141 to 153, n-channel transistors 154 to 166, and a resistor 167. In FIG. 6, a terminal INP corresponds to a non-inverting input terminal, and a terminal INM corresponds to an inverting input terminal.

Figure 7A:
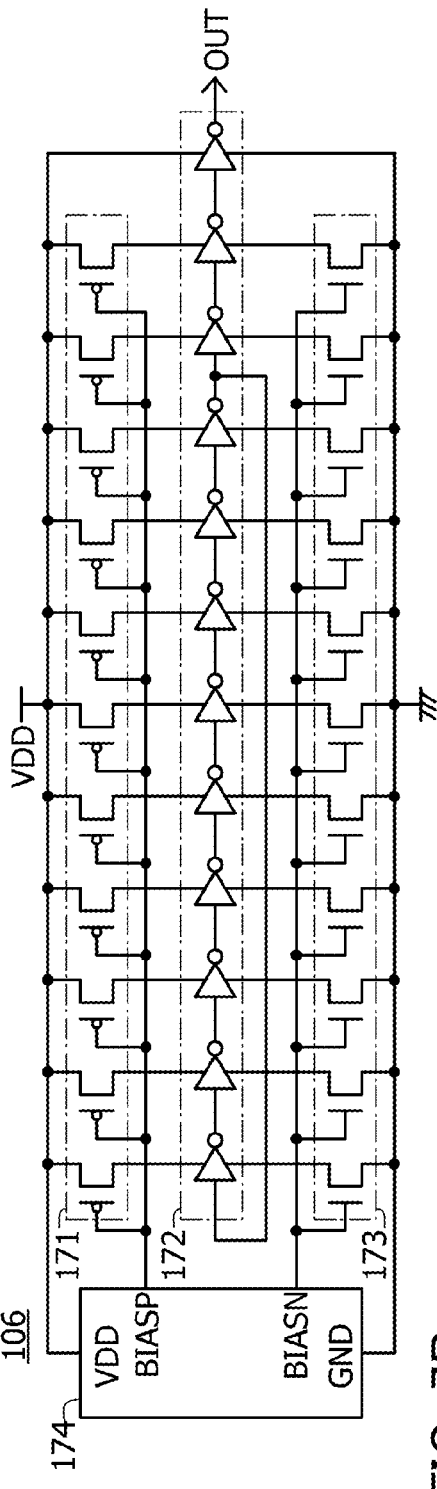
FIGS. 7A and 7B are circuit diagrams for illustrating one embodiment of the present invention.
Figure 7B:
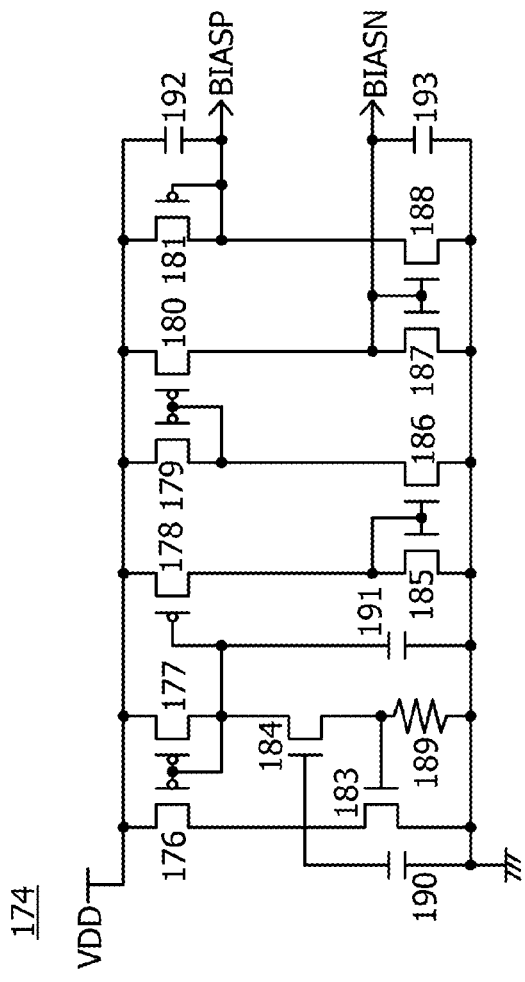

FIG. 7A shows a circuit structure example of the oscillator circuit 106. The oscillator circuit 106 shown in FIG. 7A includes p-channel transistors 171, inverter circuits 172, n-channel transistors 173, and a bias voltage generation circuit 174. In FIGS. 7A and 7B, a terminal BIASP corresponds to a terminal supplying a positive bias voltage, and a terminal BIASN corresponds to a terminal supplying a negative bias voltage.

FIG. 7B illustrates a circuit structure example of the bias voltage generation circuit 174 shown in FIG. 7A. The bias voltage generation circuit 174 of FIG. 7B includes p-channel transistors 176 to 181, n-channel transistors 183 to 188, a resistor 189, and capacitors 190 to 193.

Figure 8A:
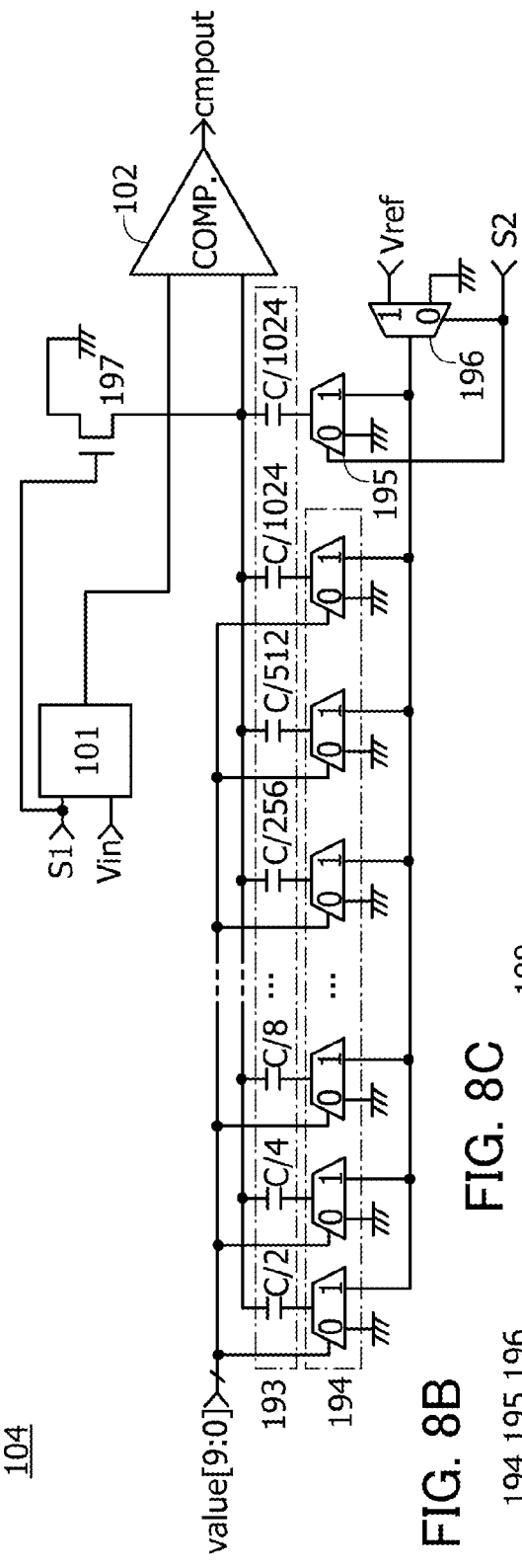
FIGS. 8A to 8C are circuit diagrams for illustrating one embodiment of the present invention.

FIG. 8A shows a circuit structure example of the digital-analog converter circuit 104. Note that FIG. 8A shows a 10-bit C-DAC. In FIG. 8A, in addition to the digital-analog converter circuit 104, the sample-and-hold circuit 101 and the comparator 102 are also shown for description. The digital-analog converter circuit 104 shown in FIG. 8A includes capacitors 193, selectors 194, 195, and 196, and a transistor 197. The capacitor 193 has capacitance corresponding to the bit number. Examples of the capacitance are written beside the capacitors 193 in FIG. 8A. The selectors 194 and 195 are provided corresponding to the capacitor 193.

Figure 8C:
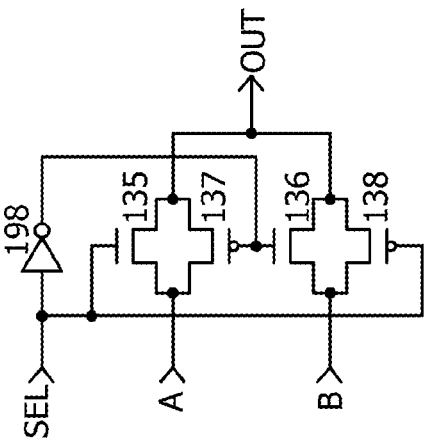
Figure 8B:
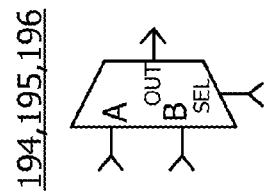

FIG. 8B shows a circuit structure example of the selectors 194, 195, and 196 of FIG. 8A. The control signal S2 is supplied to terminals SEL of the selectors 195 and 196. A potential selected by the selector 196 is supplied to terminals A of the selectors 194 and 195. A reference potential Vref is supplied to a terminal A of the selector 196. A ground potential is supplied to terminals B of the selectors 194, 195, and 196. Note that the reference potential Vref may be a potential generated by a constant voltage circuit or the like outside the semiconductor device, or be a potential generated inside the semiconductor device on the basis of a potential supplied from an external constant voltage circuit or the like.

FIG. 8C shows a more specific circuit structure example of the selectors of FIG. 8B. The selector shown in FIG. 8C includes an inverter circuit 198, n-channel transistors 135 and 136, and p-channel transistors 137 and 138.

The semiconductor device described in this embodiment that functions as an AD converter makes the sample-and-hold circuit 101 including the transistor with an extremely low off-state current hold the analog potential Vin obtained in the sensor or the like. In the sample-and-hold circuit 101, the node ND that can hold a charge by turning off the transistor 112 holds the analog potential Vin. In one embodiment of the present invention, power consumption can be reduced by stopping power supply to the buffer circuit 111 included in the sample-and-hold circuit 101 or the like.

In the semiconductor device of this embodiment, power consumption can be reduced without inhibiting the drive voltage or the frequency of the clock signal, so that it is possible to avoid decreasing the performance of the AD converter, such as the resolution or sampling rate. In the semiconductor device of this embodiment, the analog data can be held without the use of a flash memory or the like, whereby power consumption can be reduced without the provision of a dedicated high-voltage generation circuit or a dedicated periphery circuit.

Embodiment 2

In this embodiment, a circuit structure and an operation different from those of the semiconductor device shown in Embodiment 1 will be described.

Figure 10:
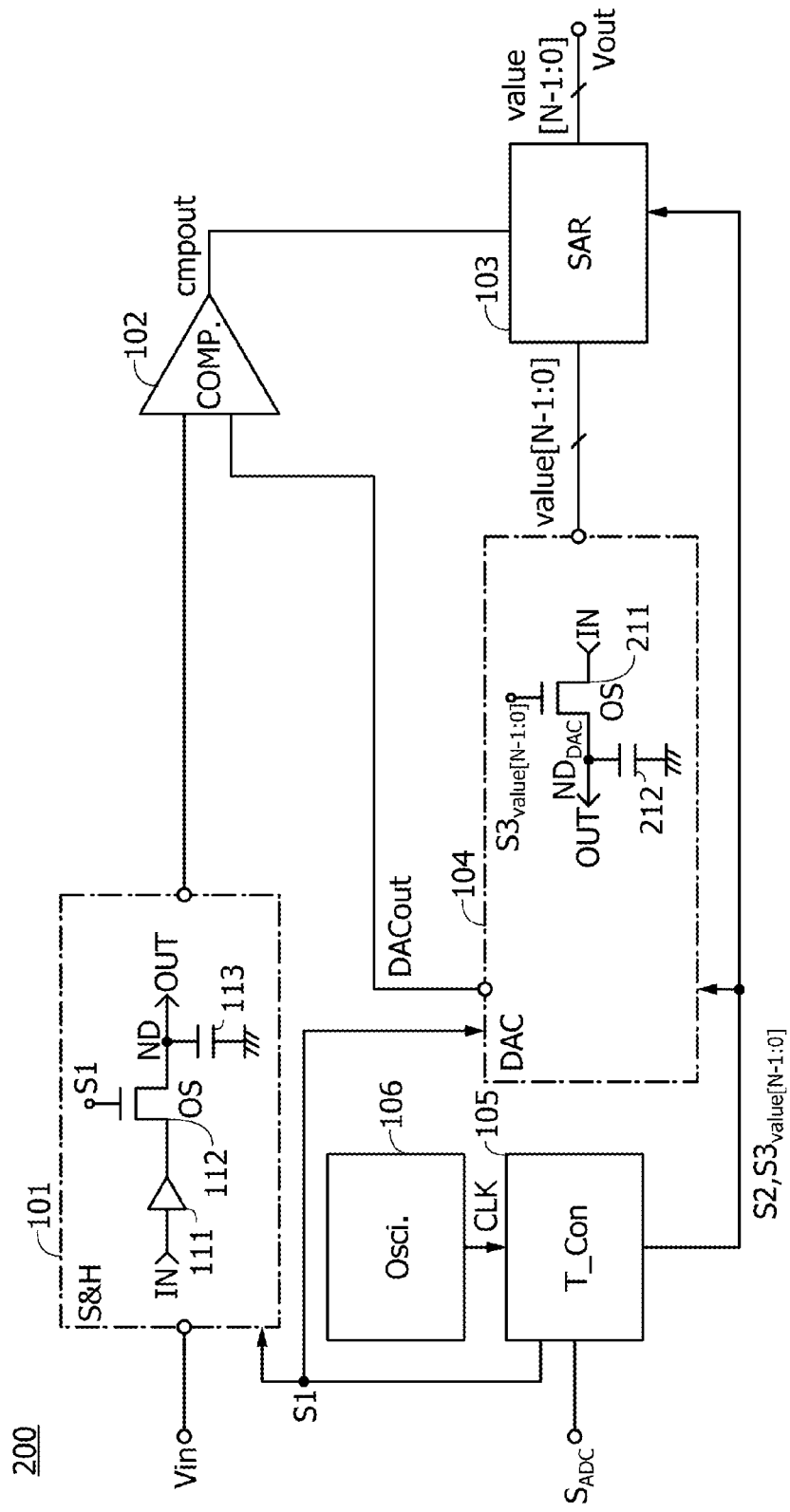
FIG. 10 is a block diagram for illustrating one embodiment of the present invention.

A semiconductor device 200 shown in FIG. 10 includes the sample-and-hold circuit 101, the successive approximation register 103, the digital-analog converter circuit 104, the timing controller 105, and the oscillator circuit 106.

The semiconductor device 200 of FIG. 10 is different from the semiconductor device of FIG. 1 in that the digital-analog converter circuit 104 includes a transistor 211 and a capacitor 212 for holding digital data. A gate of the transistor 211 is supplied with a control signal $S3_{value[N-1:0]}$ corresponding to each bit for controlling the on/off state from the timing controller 105. In this embodiment, different points from Embodiment 1 are described in detail, and a repeated explanation will be omitted.

When the transistor 211 is turned off, a charge corresponding to the potential of digital data is held in a node $ND_{DAC}$. In this way, the transistor 211 and the capacitor 212 hold the digital data. As is the case in the transistor 112, the transistor 211 is a transistor with an extremely low off-state current flowing between the source and drain, and is preferably an OS transistor.

Figure 11A:
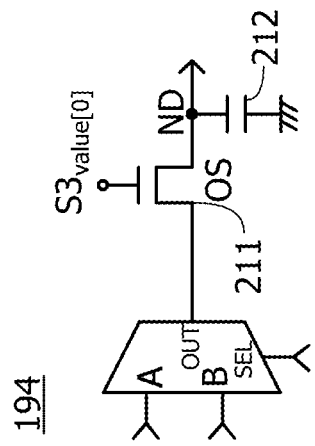
FIGS. 11A and 11B are circuit diagrams for illustrating one embodiment of the present invention.
Figure 11B:
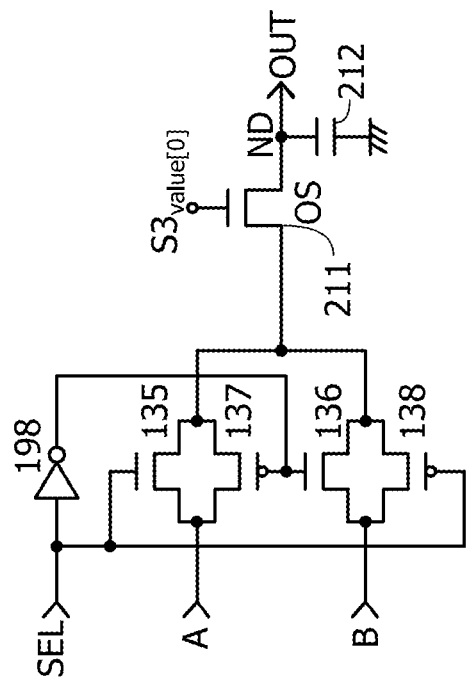

In the case where the digital data is held in the digital-analog converter circuit 104, the transistor 211 and the capacitor 212 may be added to the selector 194 of FIGS. 8A to 8C. FIGS. 11A and 11B show an example of a circuit diagram where the transistor 211 and the capacitor 212 are added to the selector 194. In the example of FIGS. 11A and 11B, as the control signal $S3_{value[N-1:0]}$, a control signal $S3_{value[0]}$ of the 0th bit is supplied to the gate of the transistor 211.

Figure 12:
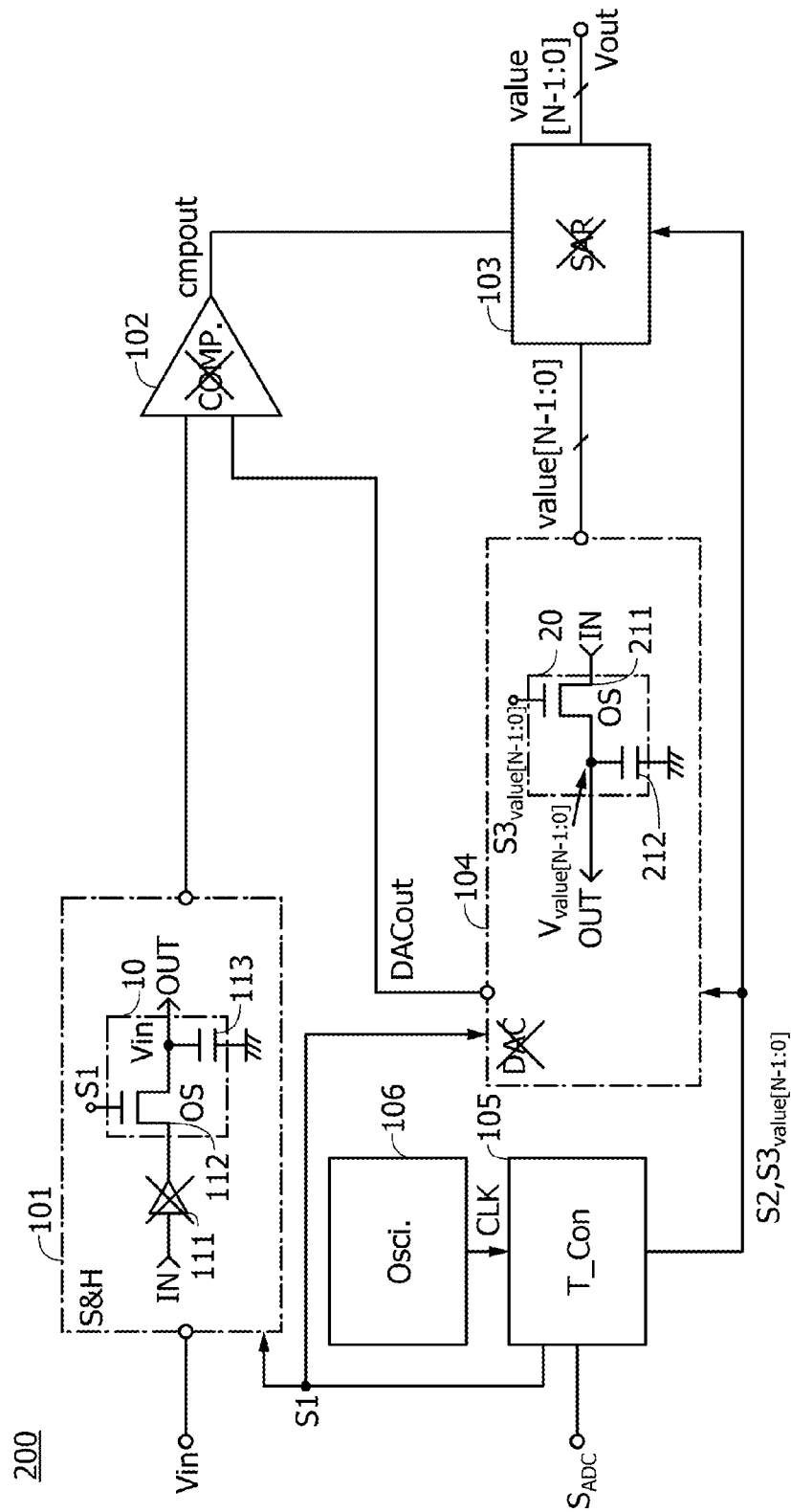
FIG. 12 is a block diagram for illustrating one embodiment of the present invention.

With the structure of FIG. 10, power consumption can be reduced by stopping power supply to the sample-and-hold circuit 101, the comparator 102, the successive approximation register 103, and the digital-analog converter circuit 104. Specifically, as shown in FIG. 12, when the analog potential Vin is held in the sample-and-hold circuit 101, power supply to the buffer circuit 111 can be stopped. In addition, at every time digital data of a certain bit is determined in the digital-analog converter circuit 104, power supply to the successive approximation register 103 or the corresponding register in the successive approximation register 103 can be stopped. Furthermore, power supply to the comparator 102 and the digital-analog converter circuit 104 can be stopped.

Figure 13:
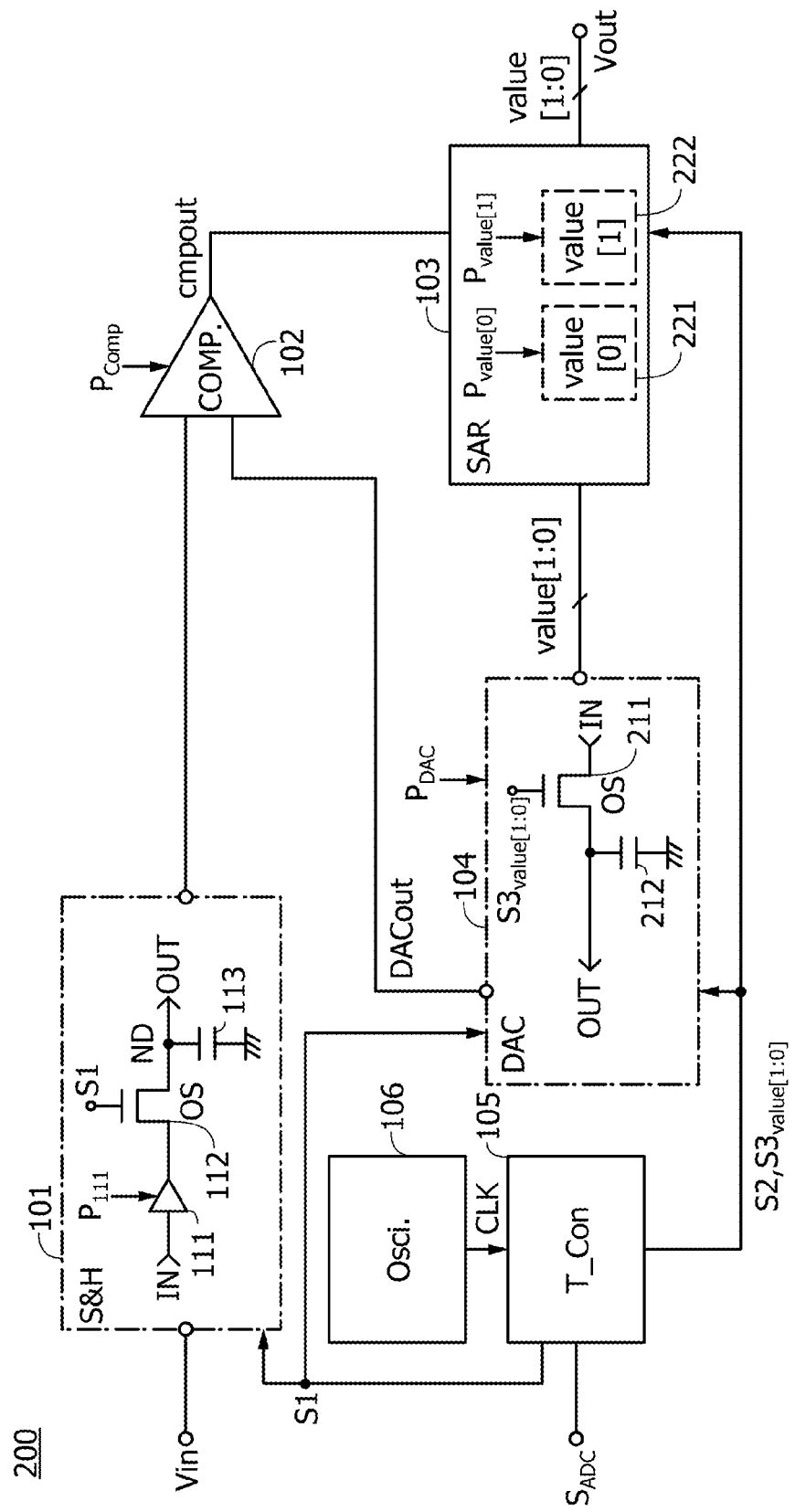
FIG. 13 is a block diagram for illustrating one embodiment of the present invention.

For describing a specific operation, FIG. 13 shows a circuit structure of when the structure of FIG. 10 constitutes a 2-bit AD converter. In FIG. 13, a register 221 for holding the 0th-bit digital data and a register 222 for holding the 1st-bit digital data are illustrated in the successive approximation register 103 in FIG. 13. In addition, a control signal $P_{value[0]}$ for controlling whether to supply power to the register 221, a control signal $P_{value[1]}$ for controlling whether to supply power to the register 222 are illustrated. A control signal $P_{111}$ for controlling whether to supply power to the buffer circuit 111, a control signal $P_{DAC}$ for controlling whether to supply power to the digital-analog converter circuit 104, and a control signal $P_{Comp}$ for controlling whether to supply power to the comparator 102 are also illustrated.

Figure 14:
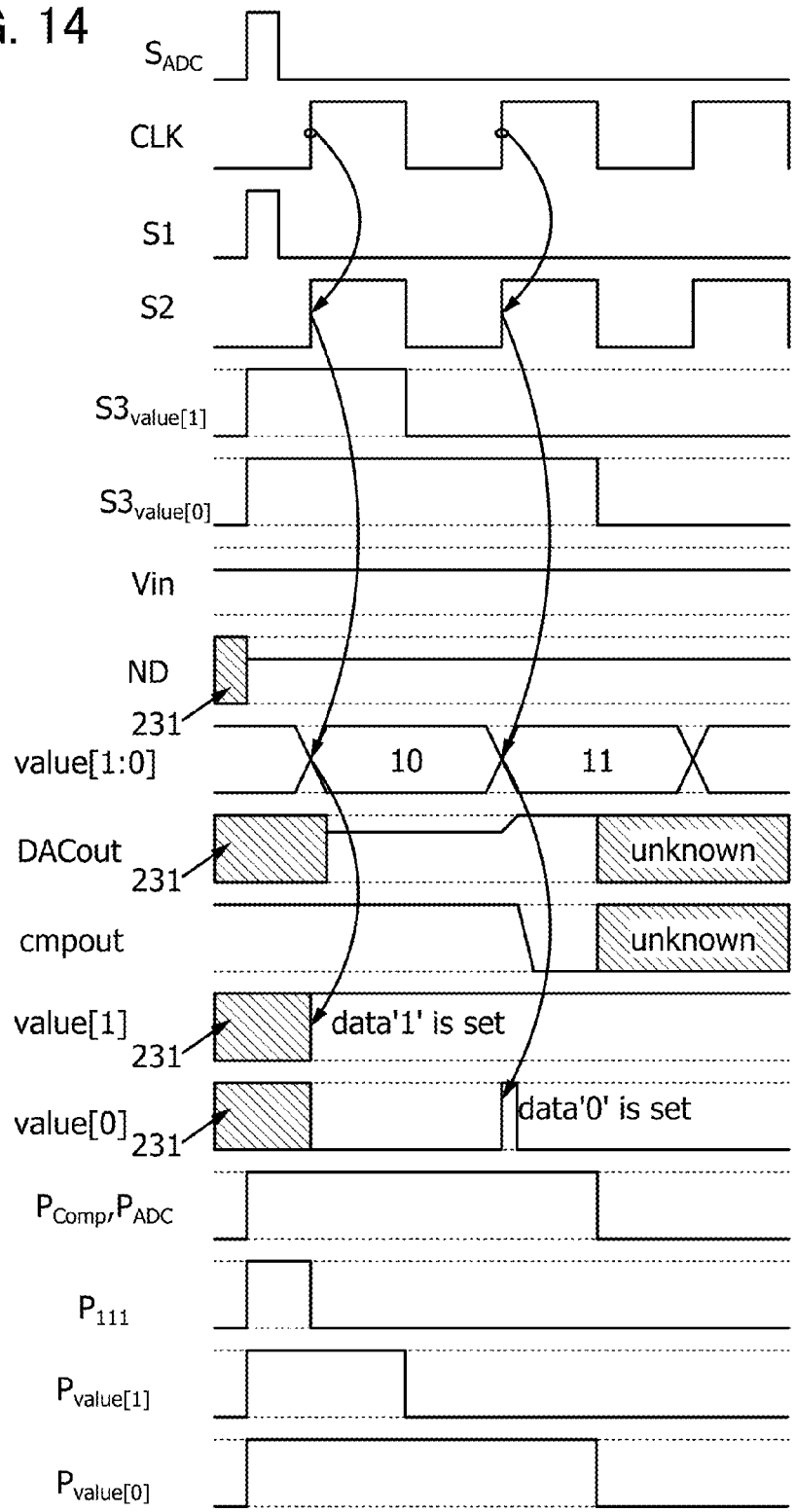
FIG. 14 is a timing chart for illustrating one embodiment of the present invention.

Next, operation of the semiconductor device 200 of FIG. 13 is described with the use of a timing chart of FIG. 14. Note that VDD is 3 V, VSS is 0 V, Vref is 2 V, and Vin is 1.5 V, as an example. Note that digital values of "00", "01", "10", and "11" are described as corresponding to analog values of 0.5 V, 1.0 V, 1.5 V, and 2.0 V, respectively. Note that a shaded portion 231 in the drawing represents a state where previous data is held.

When the signal $S_{ADC}$ is input to the timing controller 105, the timing controller 105 starts up the oscillator circuit 106 and makes it output the clock signal CLK. When the signal $S_{ADC}$ is input to the timing controller 105, the timing controller 105 outputs the control signal S1 to the sample-and-hold circuit 101. The timing controller 105 outputs the control signal S2 to the digital-analog converter circuit 104 and the successive approximation register 103. The timing controller 105 outputs the control signal $S3_{value[1:0]}$ to the digital-analog converter circuit 104 and the successive approximation register 103.

Although the control signal S1 has the same waveform as the signal $S_{ADC}$ in FIG. 14, the control signal S1 may have a different waveform as long as the semiconductor device 200 operates normally. The operation of the sample-and-hold circuit 101 is started by the control signal S1. The analog potential Vin at 1.5 V input to the sample-and-hold circuit 101 is amplified by the buffer circuit 111 and is supplied to the node ND by turning on the transistor 112, and then is held in the node ND as the analog potential at 1.5 V by turning off the transistor 112.

Although the control signal S2 has the same waveform as the clock signal CLK in FIG. 14, the control signal S2 may have a different waveform as long as the semiconductor device 200 operates normally. The successive approximation register 103 is reset by the control signal S2. In addition, the digital-analog converter circuit 104 is reset by the control signals S1 and S2.

Although the control signal $S3_{value[1:0]}$ is set high until digital data of each bit is determined in FIG. 14, the control signal $S3_{value[1:0]}$ may have a different waveform as long as the semiconductor device 200 operates normally. After digital data of each bit is determined by the control signal $S3_{value[1:0]}$, the on/off state of the transistor 211 is controlled so as to hold the digital data.

After the analog potential at 1.5 V is held in the node ND by turning off the transistor 112 with the control signal S1, power supply to the buffer circuit 111 of the sample-and-hold circuit 101 is stopped by the control signal $P_{111}$. Even when the power supply to the buffer circuit 111 is stopped, the analog potential can be held with power consumption reduced because the transistor 112 is off.

The successive approximation register 103 is reset by the control signal S2, whereby the registers 221 and 222 are reset to "00". Alternatively, the registers 221 and 222 may be reset to "11".

The transistor 211 is turned on by the control signal $S3_{value[1:0]}$, whereby digital data of each bit is supplied to the digital-analog converter circuit 104.

Next, the timing controller 105 set digital data of the 1st-bit (i.e., the highest-order bit) in the register 222 of the successive approximation register 103 to "1" at the first leading edge of the clock signal CLK. In addition, by the control signal S2, the digital-analog converter circuit 104 converts the digital data "10" of the successive approximation register 103 into the 1.5-V analog potential DACout and outputs the potential to the comparator 102. The comparator 102 compares 1.5 V of the analog potential Vin held in the node ND and 1.5 V of the analog potential DACout subjected to digital-analog conversion. The comparator 102 outputs a high-level signal cmpout when the analog potential Vin is higher than or equal to the analog potential DACout, and outputs a low-level signal cmpout when the analog potential Vin is lower than the analog potential DACout. Here, since the two analog potentials are 1.5 V, the signal cmpout is set high. The signal cmpout is input to the successive approximation register 103.

Next, since the digital data of the 1st-bit that is the higher-order bit is set to "1", the timing controller 105 set the control signal $S3_{value[1]}$ low at the first trailing edge of the clock signal CLK to turn off the transistor 211. This makes the 1st-bit digital data be held in the digital-analog converter circuit 104. In addition, the control signal $P_{value[1]}$ is set low, whereby power supply to the register 222 of the successive approximation register 103 is stopped. Even when the power supply to the register 222 is stopped, the digital data can be held in the digital-analog converter circuit 104 with power consumption reduced because the transistor 211 is off.

Next, the timing controller 105 set digital data of the 0th-bit (i.e., the lowest-order bit) in the register 221 of the successive approximation register 103 to "1" at the second leading edge of the clock signal CLK. In addition, by the control signal S2, the digital-analog converter circuit 104 converts the digital data "11" of the successive approximation register 103 into the 2.0-V analog potential DACout and outputs the potential to the comparator 102. The comparator 102 compares 1.5 V of the analog potential Vin held in the node ND and 2.0 V of the analog potential DACout subjected to digital-analog conversion. The comparator 102 outputs a high-level signal cmpout when the analog potential Vin is higher than or equal to the analog potential DACout, and outputs a low-level signal cmpout when the analog potential Vin is lower than the analog potential DACout. Here, since the 1.5-V analog potential Vin and the 2.0-V analog potential DACout are compared with each other, the signal cmpout is set low. The signal cmpout is input to the successive approximation register 103.

Next, since the digital data of the 0th-bit that is the lower-order bit is set to "0", the timing controller 105 set the control signal $S3_{value[0]}$ low at the second trailing edge of the clock signal CLK to turn off the transistor 211. This makes the 0th-bit digital data be held in the digital-analog converter circuit 104. In addition, the control signal $P_{value[0]}$ is set low, whereby power supply to the register 221 of the successive approximation register 103 is stopped. Even when the power supply to the register 221 is stopped, the digital data can be held in the digital-analog converter circuit 104 with power consumption reduced because the transistor 211 is off.

The timing controller 105 also sets the control signals $P_{Comp}$ and $P_{ADC}$ low at the second trailing edge of the clock signal CLK, whereby power supply to the comparator 102 and the digital-analog converter circuit 104 is stopped. Even when the power supply to the comparator 102 and the digital-analog converter circuit 104 is stopped, the digital data can be held in the digital-analog converter circuit 104 with power consumption reduced because the transistor 211 is off.

In this way, the 1.5-V analog potential Vin is converted into the 2-bit digital data "10".

The structure disclosed in this embodiment enables the potential of analog data or digital data to be held with the use of an OS transistor even after power supply is stopped; therefore, power supply to each circuit can be stopped to reduce power consumption. In addition, if power supply to the whole semiconductor device functioning as an AD converter is stopped after determination of digital data, power consumption can be reduced until another analog potential Vin is input.

As is the case in the semiconductor device in Embodiment 1, the semiconductor device described in this embodiment functioning as an AD converter makes the sample-and-hold circuit 101 including the transistor with an extremely low off-state current hold the analog potential Vin obtained in the sensor or the like. In addition, the determined digital data is held in the digital-analog converter circuit. According to one embodiment of the present invention, power supply to each circuit included in the semiconductor device can be stopped to reduce power consumption.

In the semiconductor device of this embodiment, power consumption can be reduced without inhibiting the drive voltage or the frequency of the clock signal, so that it is possible to avoid decreasing the performance of the AD converter, such as the resolution or sampling rate. In the semiconductor device of this embodiment, the analog data can be held without the use of a flash memory or the like, whereby power consumption can be reduced without the provision of a dedicated high-voltage generation circuit or a dedicated periphery circuit.

Embodiment 3

In this embodiment, as an application example of the semiconductor devices each functioning as an AD converter described in Embodiments 1 and 2, a wireless sensor will be described. Note that a wireless sensor is referred to as a radio frequency (RF) sensor or the like.

The wireless sensor receives a wireless signal from a wireless communication device and outputs data obtained in a sensor circuit to the wireless communication device. Note that any wireless communication device is acceptable as long as it can transmit and receive a wireless signal; for example, an interrogator, a smart meter, a mobile phone, a personal computer, or a wireless terminal that collects data can be used.

The wireless sensor is preferably a passive wireless sensor that operates with a received wireless signal used as power. The passive wireless sensor does not include a secondary battery, which leads to miniaturization and increase in the degree of arrangement freedom. Note that it may include a secondary battery that can generate power from the received wireless signal to be charged.

The frequency of the wireless signal is appropriately selected in accordance with the laws and the like. For example, a long wave band of a 135 kHz band, a short wave band of a 13.56 MHz band, an UHF band of a 900 MHz band, a microwave band of a 2.45 GHz band, or the like can be used. Depending on the frequency band of the wireless signal, the structure of an antenna included in the wireless sensor can be determined.

<Block Diagram of Wireless Sensor>

Figure 15:
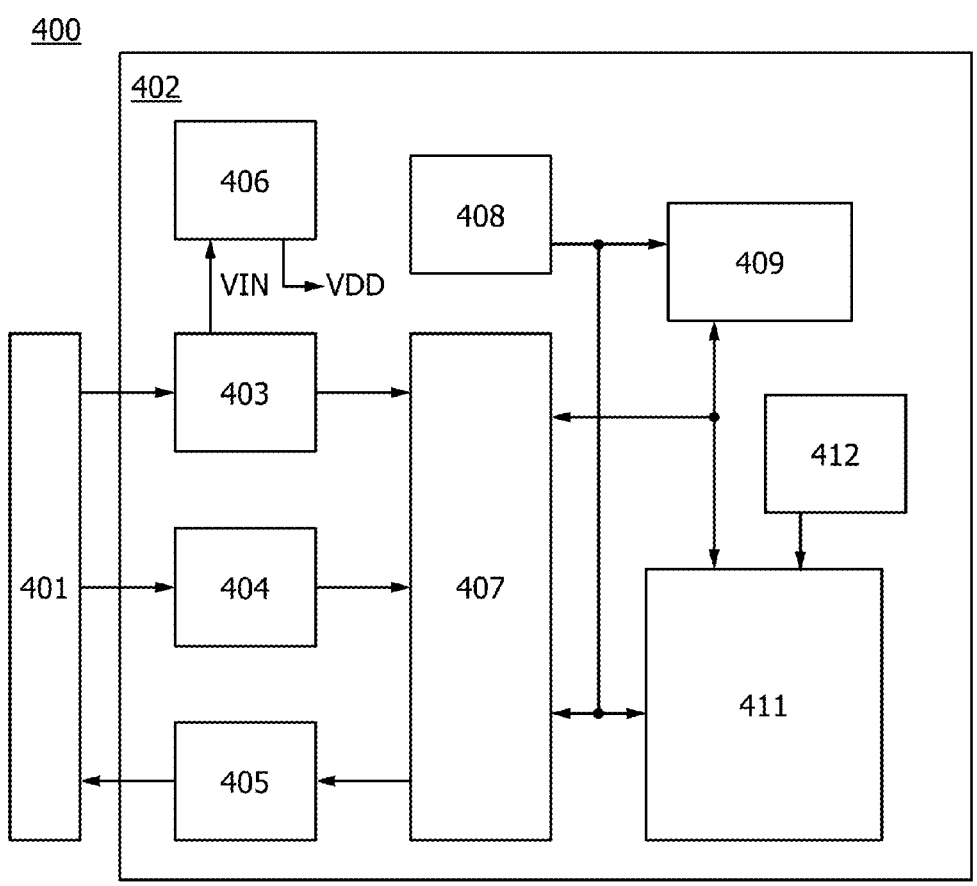
FIG. 15 is a block diagram for illustrating one embodiment of the present invention.

FIG. 15 is a block diagram of a wireless sensor 400. The wireless sensor includes an antenna 401, an integrated circuit portion 402 (also referred to as an IC portion or a circuit portion), and the like.

The antenna 401 converts a wireless signal into an electrical signal or converts an electrical signal into a wireless signal to receive and send a signal from/to an external terminal such as an interrogator. A plurality of antennas may be provided depending on the frequency band of the wireless signal carrying a signal. Modulation methods include analog modulation and digital modulation, for example, and any of amplitude modulation, phase modulation, frequency modulation, and spread spectrum may be used.

The integrated circuit portion 402 includes a circuit that operates with a voltage and an electrical signal that are generated by receiving a wireless signal. The integrated circuit portion 402 includes a circuit that transmits an electrical signal obtained by operation of the above circuit, through the antenna 401.

The integrated circuit portion 402 includes, for example, a rectifier circuit 403, a demodulation circuit 404, a modulation circuit 405, a constant-voltage circuit 406, a control circuit 407, an oscillator circuit 408, a memory circuit 409, an AD converter 411, and a sensor circuit 412.

The rectifier circuit 403 rectifies and smoothes an electrical signal from the antenna 401. A wireless signal rectified and smoothed becomes a voltage VIN having a certain potential. The voltage VIN is output to the constant-voltage circuit 406.

The rectifier circuit 403 may include a protection circuit (a limiter circuit). The protection circuit prevents the circuits in the integrated circuit portion 402 from being damaged in the case where the electrical signal from the antenna 401 has a high voltage.

The demodulation circuit 404 demodulates the electrical signal from the antenna 401. A demodulated signal is output to the control circuit 407.

The modulation circuit 405 modulates an electrical signal generated in the control circuit 407. A modulated electrical signal is sent as a wireless signal with a carrier wave through the antenna 401.

The constant-voltage circuit 406 generates a voltage on the basis of the voltage VIN. A voltage VDD generated in the constant-voltage circuit 406 is supplied to the circuits in the integrated circuit portion 402. Note that one or more voltages may be generated by the constant-voltage circuit 406.

The control circuit 407 generates a signal to be input to the circuits in the integrated circuit portion 402, a signal to be output from the circuits in the integrated circuit portion 402, a signal for operating the circuits in the integrated circuit portion 402, and the like, and controls the circuits in the integrated circuit portion 402.

The oscillator circuit 408 generates a clock signal used as reference. For example, the clock signal is supplied to the control circuit 407, the memory circuit 409, and the AD converter 411.

The memory circuit 409 holds data that is obtained in the sensor circuit 412 and converted from analog data to digital data by the AD converter 411. Power supply to the wireless sensor 400 is performed at the time of receiving the wireless signal, and thus the power supply is intermittent. In that case, power supply to the memory circuit 409 is also intermittently performed. Therefore, the memory circuit 409 preferably includes a nonvolatile memory element that can hold data even when power supply is performed intermittently. As the nonvolatile memory element, a flash memory, a ferroelectric random access memory (FeRAM), a magnetoresistive random access memory (MRAM), a phase change random access memory (PRAM), a resistance random access memory (ReRAM), or the like can be used, for example. Alternatively, a circuit which holds data by holding a charge and which utilizes an extremely low off-state current of an OS transistor may be used as the memory element. When an OS transistor is used to form the memory element, the transistor and a transistor including a silicon layer can be stacked.

The memory circuit 409 may have a unique number (ID) of the wireless sensor 400. If a plurality of wireless sensors 400 have unique numbers, one interrogator can communicate with the wireless sensors. For example, it becomes possible to read only data of the wireless sensor having desired data by designating its unique number. Furthermore, the memory circuit 409 may have a structure that can write, read, and hold data of the wireless signal received from an external interrogator or the like. In that case, conditions corresponding to usage environment of the wireless sensor 400 can be written, whereby application can be broadened.

For the AD converter 411, the semiconductor device described in any of the above embodiments is used. Including the semiconductor device described in any of the above embodiments as the AD converter 411, the wireless sensor 400 can reduce power consumption without decreasing the performance of the AD converter such as the resolution or sampling rate, or without a dedicated high-voltage generation circuit or a dedicated peripheral circuit for holding analog data. In addition, as to the operation of the AD converter, whether to supply power to circuits can be controlled as described in the above embodiments. Therefore, the AD converter is not necessarily supplied with power continuously over the period of receiving a wireless signal. Thus, the proportion of power consumed by the AD converter in the wireless sensor 400 can be reduced and the proportion of power consumed by transmitting a signal from the wireless sensor 400 to the outside can be increased; thus, the convenience of the wireless sensor 400 can be improved, e.g., the communication distance can be extended.

Although the timing controller, the oscillator circuit, and the like are included in the semiconductor device in the above embodiments, any of them may be provided outside the AD converter 411. For example, a structure can be employed where the oscillator circuit in the AD converter 411 is omitted and the oscillator circuit 408 included in the integrate circuit portion 402 is used instead.

Note that the AD converter 411 may include an input/output interface for inputting and outputting a signal from/to the outside, a control circuit, or the like.

The sensor circuit 412 outputs various data such as heat data or electromagnetic data as the analog data. The sensor circuit can include various sensors. For example, the sensor circuit can include a temperature sensor, an optical sensor, a gas sensor, a flame sensor, a smoke sensor, a humidity sensor, a pressure sensor, a flow sensor, a vibration sensor, a touch sensor, a voice sensor, a magnetic sensor, a radiation sensor, a smell sensor, a pollen sensor, an acceleration sensor, an inclination sensor, a gyro sensor, a direction sensor, or a power sensor.

Figure 16:
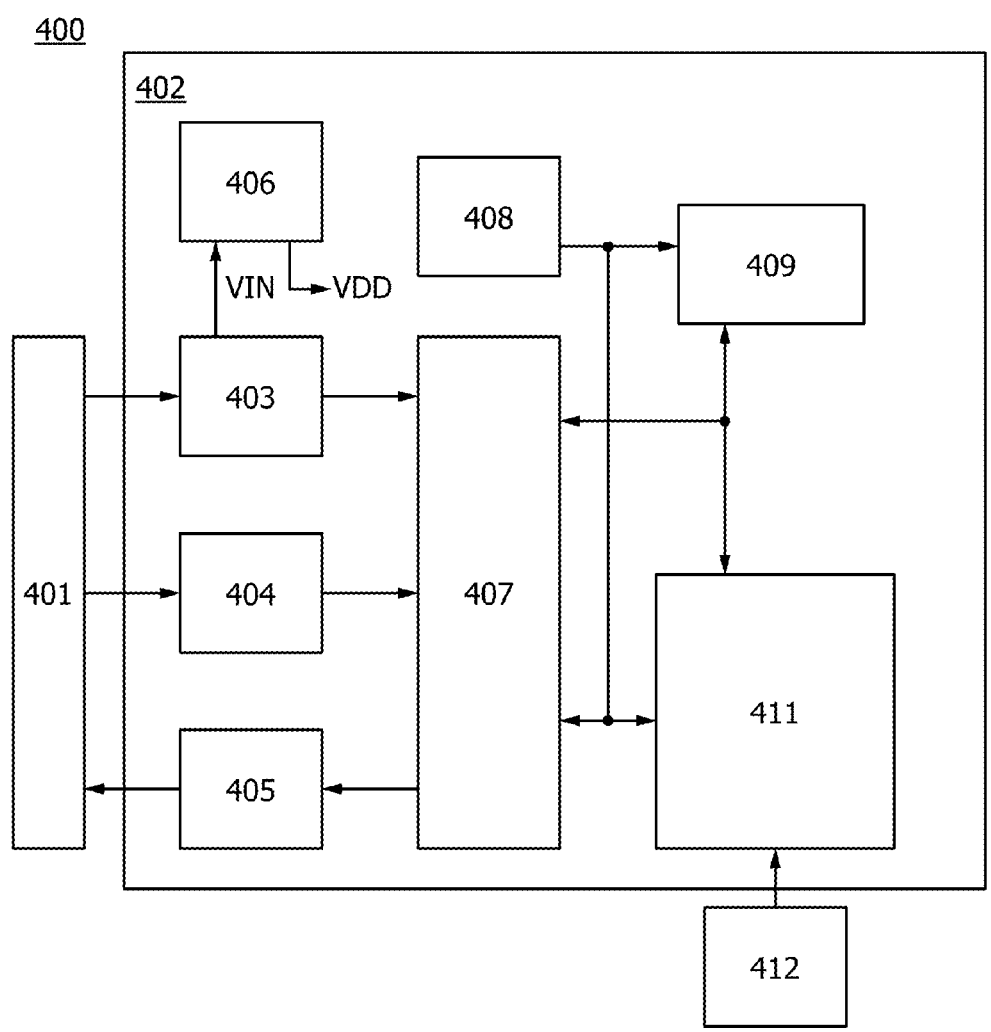
FIG. 16 is a block diagram for illustrating one embodiment of the present invention.

Note that the sensor circuit 412 may be provided outside the integrated circuit portion 402 as shown in FIG. 16. The sensor circuit 412 can be formed separately from the integrated circuit portion 402. In this case, the design flexibility of the sensor circuit 412 can be increased and a choice of data obtained in the sensor circuit can be broadened.

<Structure of Memory Circuit>

Here, a structure example of the above-mentioned memory circuit 409 is described with the use of specific examples. Note that the memory circuit 409 has a circuit structure where a memory element is formed with the use of an OS transistor (the memory element is also referred to as an OS memory).

Figure 17:
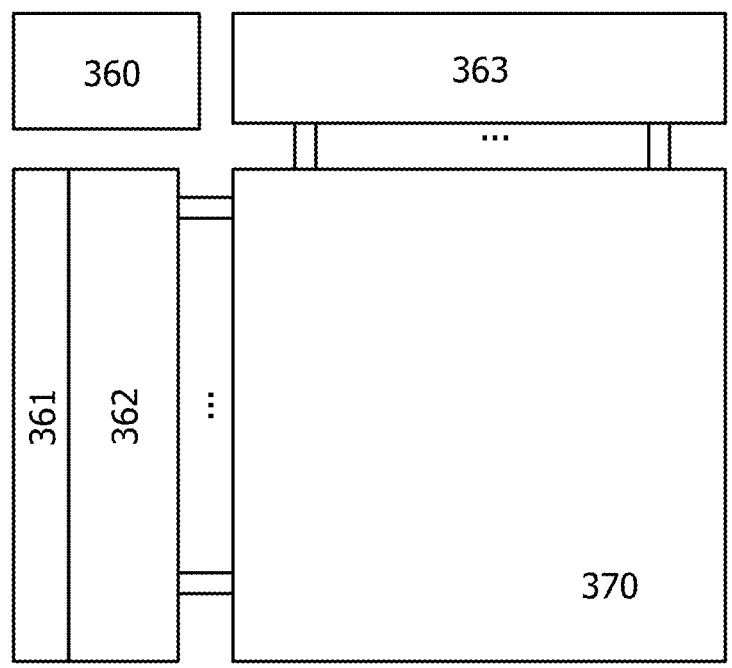
FIG. 17 is a block diagram for illustrating one embodiment of the present invention.

FIG. 17 is a block diagram illustrating a structure example of the memory circuit 409. The memory circuit 409 includes a controller 360, a row decoder circuit 361, a row driver circuit 362, a column driver circuit 363, and a memory cell array 370.

The controller 360 is a control circuit for the memory circuit 409, and generates control signals for controlling the row decoder circuit 361, the row driver circuit 362, and the column driver circuit 363 in accordance with access requirement by a logic portion. The row decoder circuit 361, the row driver circuit 362, and the column driver circuit 363 generate driving signals for driving the memory cell array 370 in accordance with the control signals from the controller 360.

Figure 18:
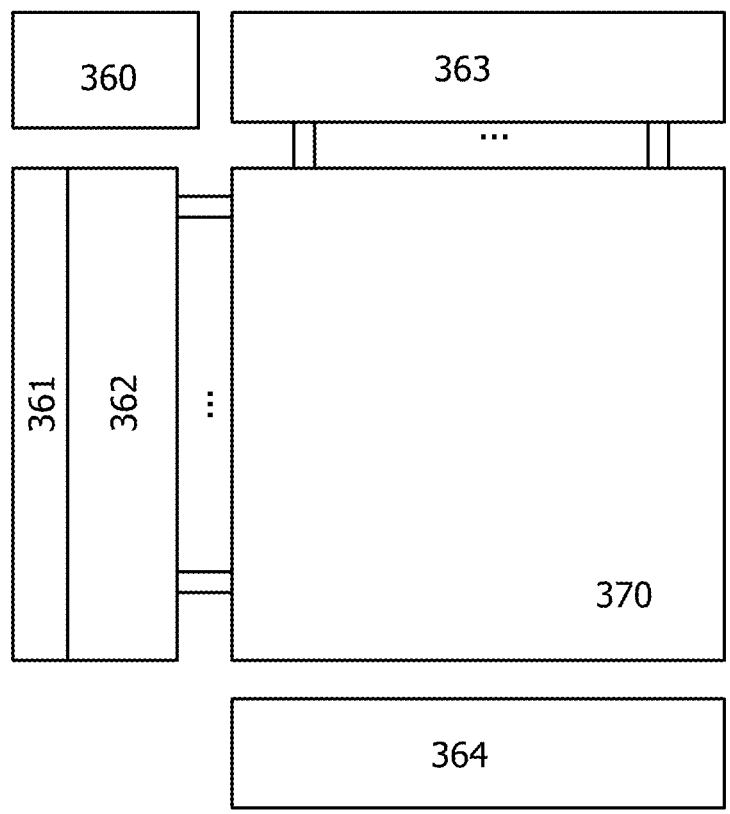
FIG. 18 is a block diagram for illustrating one embodiment of the present invention.

When multivalued data is stored in the memory cell array 370, a structure shown as a memory cell 409_A in FIG. 18 where an AD converter 364 is provided may be employed. The AD converter 364 may be a flash type, a delta-sigma type, a pipeline type, an integration type, or a successive approximation type. In the case of a successive approximation AD converter, the semiconductor device described in any of the above embodiments is favorably used. Including the semiconductor device described in any of the above embodiments as the AD converter 411, the wireless sensor 400 can reduce power consumption without decreasing the performance of the AD converter such as the resolution or sampling rate, or without a dedicated high-voltage generation circuit or a dedicated peripheral circuit for holding analog data.

Figure 19:
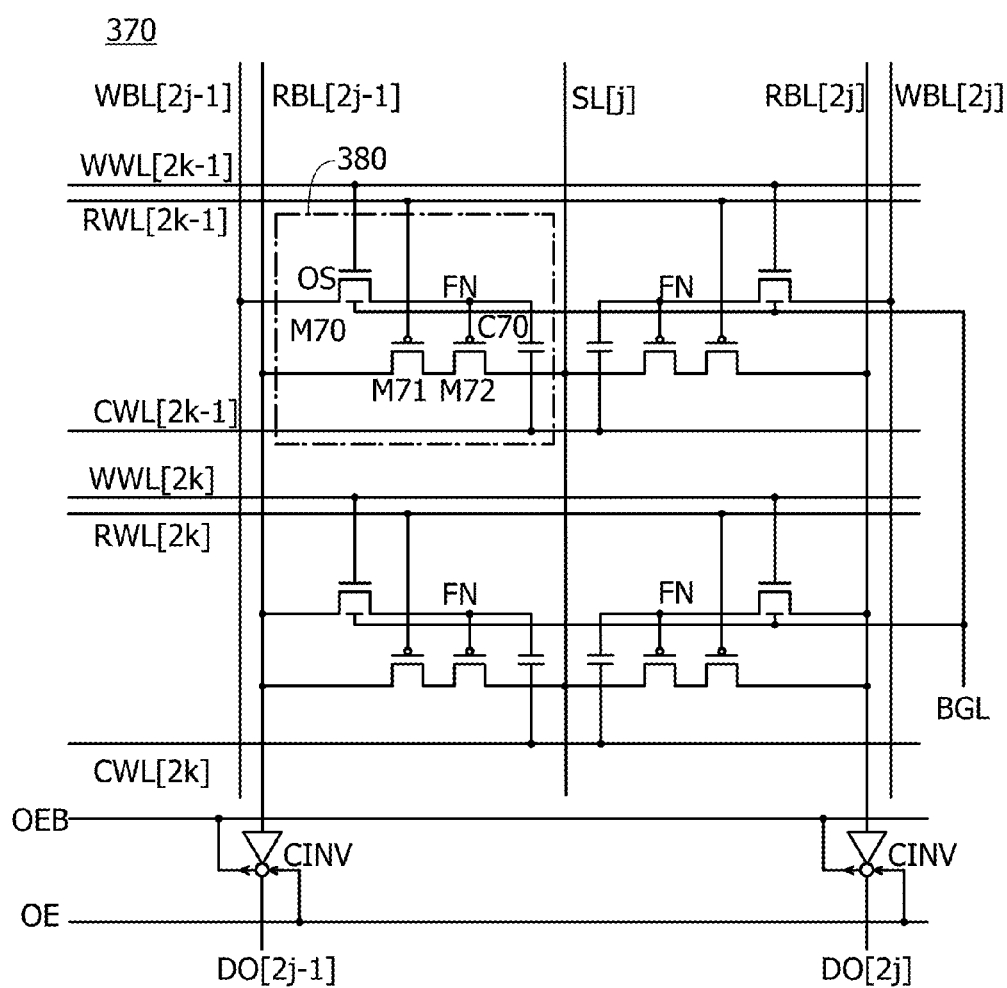
FIG. 19 is a circuit diagram for illustrating one embodiment of the present invention.

The memory cell array 370 is a circuit in which a plurality of memory cells is arranged in an array. FIG. 19 is a circuit diagram illustrating a structure example of the memory cell array 370. FIG. 19 typically illustrates four memory cells 380 in [2j–1, 2k–1] to [2j, 2k] (j and k are integers of 1 or more).

The memory cells 380 each include transistors M70 to M72 and a capacitor C70. Here, the transistor M70 is an n-channel OS transistor. In addition, the transistors M71 and M72 are p-channel Si transistors. A node FN is a data storage portion of the memory cell array 370 that holds a charge as data; in this example, the node FN corresponds to a gate of the transistor M72.

Figure 20:
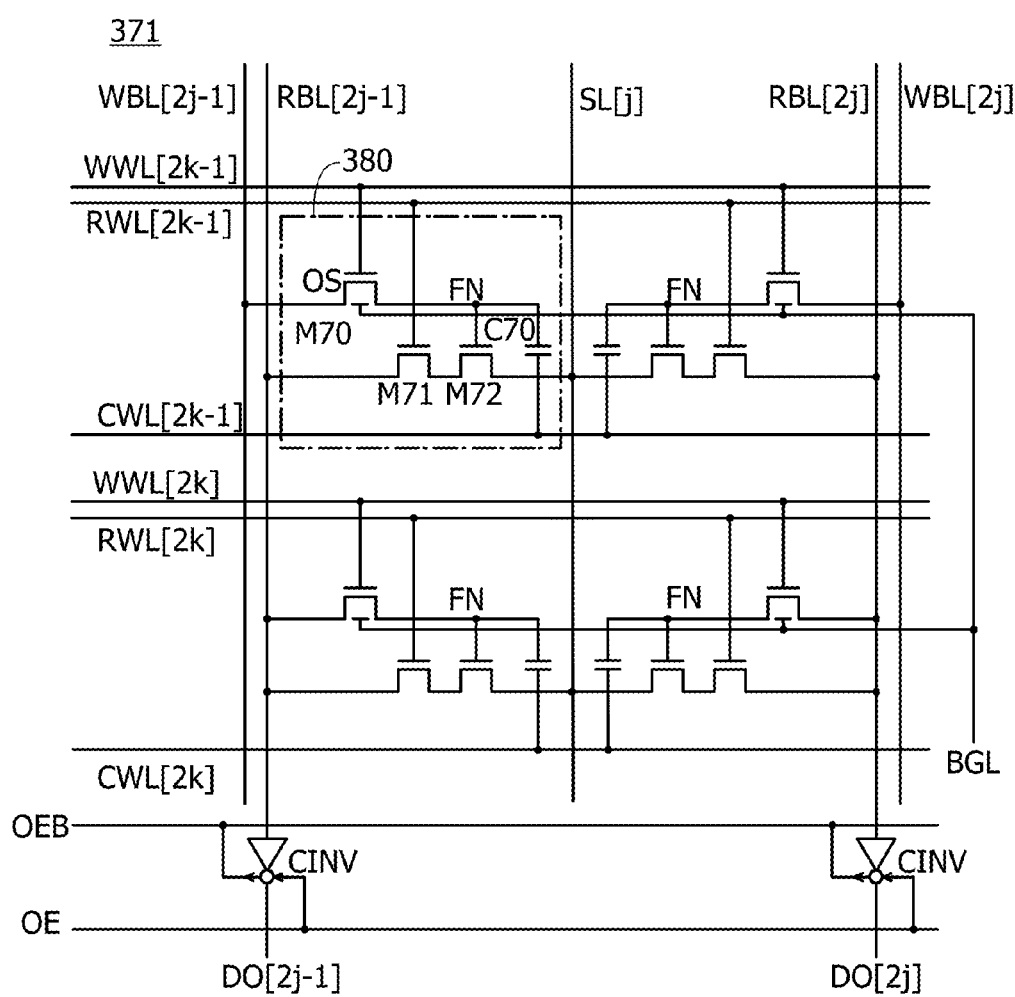
FIG. 20 is a circuit diagram for illustrating one embodiment of the present invention.
Figure 30:
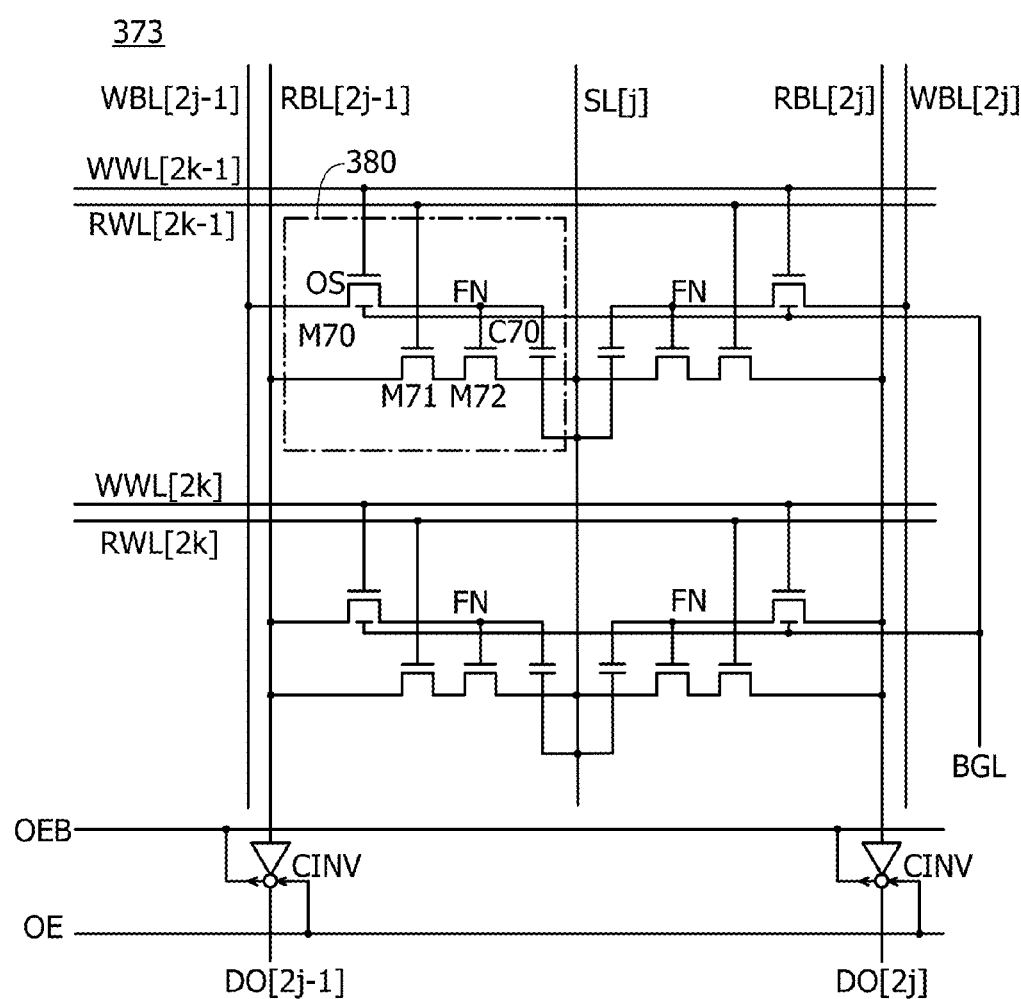
FIG. 30 is a circuit diagram for illustrating one embodiment of the present invention.

The transistors M71 and M72 may be n-channel transistors. The example is shown in a memory cell array 371 in FIG. 20. When the transistors M71 and M72 are n-channel transistors, the wiring CWL connected to the capacitor C70 can be omitted and the wiring SL can be connected to the capacitor C70. FIG. 30 shows a circuit diagram of that case. A memory circuit 373 in FIG. 30 can reduce a circuit area because the wiring CWL can be omitted.

The memory cell array 370 is provided with wirings (WWL, RWL, CWL, SL, WBL, RBL) in accordance with the arrangement of the memory cells 380. The memory cells 380 are connected to these wirings in corresponding rows and columns. Moreover, a wiring BGL is provided as a common wiring in the memory cell array 370. A back gate of the transistor M70 in each memory cell 380 is connected to the wiring BGL.

The wirings WWL and RWL function as a writing word line and a reading word line, respectively, and are both connected to the row driver circuit 362. The wiring CWL has a function of supplying a voltage to be applied to the capacitor C70.

The wiring SL functions as a source line and provided in every other column. The wiring WBL functions as a writing bit line and is a wiring to which memory data to be written to the memory cells 380 is supplied from the column driver circuit 363. The wiring RBL functions as a reading bit line and is a wiring to which memory data read out from the memory cells 380 is output. The wirings SL, WBL, and RBL are connected to the column driver circuit 363.

A clocked inverter CINV is connected to an output of the wiring RBL because the voltage level (high/low) of a signal read from the wiring RBL is opposite from the voltage level of written data. In the example of FIG. 19, the voltage of the wiring RBL is high when the voltage of written data is low, while the voltage of the wiring RBL is low when the voltage of written data is high. Wirings OE and OEB are wirings that supply a signal for controlling an output signal of the clocked inverter CINV. The output signal (memory data) of the clocked inverter CINV is output from a wiring DO.

The capacitor C70 functions as a capacitor for holding charges of the node FN. One terminal of the capacitor C70 is connected to the node FN, and the other terminal of the capacitor C70 is connected to the wiring CWL. The wiring CWL is connected to the row driver circuit 362. Note that in the case where charges of the node FN can be held by a capacitor between wirings of the memory cell 380, the capacitor C70 and the wiring CWL need not be provided.

By turning on the transistor M70, a voltage corresponding to the data value ("0", "1") is applied to the node FN. In addition, by turning off the transistor M70, the node FN is brought into an electrically floating state and the memory cell 380 is brought into a data retention state. Since the transistor M70 is an OS transistor, the leakage current flowing between a source and a drain of the transistor M70 in an off state is extremely low. Therefore, the memory cell 380 can retain data for a period of years (e.g., 10 years, approximately) without refresh operation; thus, the memory cell 380 can be used as a nonvolatile memory cell. Moreover, since Vth of the transistor M70 is shifted in the positive direction by applying VBG to the back gate, a voltage lower than Vth can be more certainly applied to the gate of the transistor M70 in the data retention state; accordingly, the memory cell 380 with little data retention errors can be obtained.

Accordingly, data can be held in the memory circuit 409 even in a state where the wireless sensor 400 does not receive electric waves. The operation of the memory cell array 370 (the memory circuit 409) is described below in more detail with reference to FIG. 21.

Note that in a memory circuit that utilizes an extremely low off-state current of an OS transistor, a predetermined voltage might keep being supplied to the transistor in a period for holding data. For example, a voltage that turns off the transistor completely might keep being supplied to a gate of the transistor. Alternatively, a voltage that shifts the threshold voltage of the transistor to make the transistor in a normally-off state may keep being supplied to a back gate of the transistor. In these cases, the voltage is supplied to the memory circuit in the period for retaining data. However, because almost no current flows, little power is consumed. Because of little power consumption, the memory circuit can be regarded as being substantially nonvolatile even if a predetermined voltage is supplied to the memory circuit.

Figure 21:
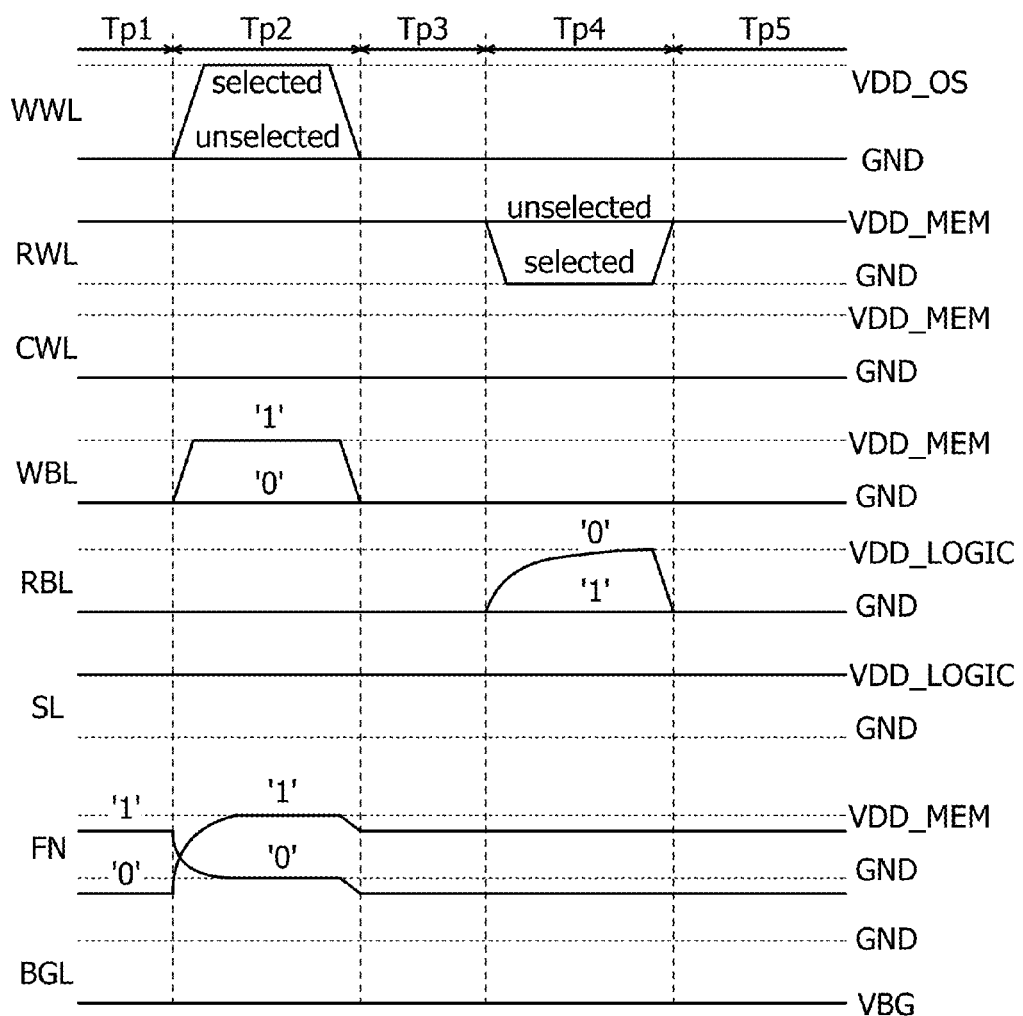
FIG. 21 is a timing chart for illustrating one embodiment of the present invention.

FIG. 21 is a timing chart showing an operation example of the memory cell array 370 (memory circuit 409). Specifically, FIG. 21 shows waveforms of signals input to the memory cell array 370 and the voltages (high level ("H")/low level ("L")) of wirings and a node included in the memory cell array 370. In this example, a constant voltage is applied to the wirings CWL, SL, and BGL.

In a period Tp1, the memory circuit 409 is in a stand-by state (Stdby). The stand-by state refers to a state in which VIN is generated in the wireless sensor 400; in this state, the memory circuit 409 is in a data retention state. The wirings WWL, WBL, and RBL are low and the wiring RWL is high. In the case where "1" is written to the memory cell 380, the voltage of the node FN is "H", while in the case where "0" is written to the memory cell 380, the voltage of the node FN is "L".

A period Tp2 is a writing operation period. The wiring WWL in a row to which data is written becomes "H", turning on the transistor M70, whereby electrical conduction between the node FN and the wiring WBL is obtained. In the case of writing "1", the wiring WBL is "H"; accordingly, the node FN is also "H". In contrast, in the case of writing "0", the wiring WBL is "L"; accordingly, the node FN is also "L". By setting the wiring WWL at "L" to turn off the transistor M70, the data writing operation is terminated and the memory cell 380 is brought into a stand-by state.

In a period Tp3 (stand-by period), the transistor M70 is changed from an on state to an off state, which makes the voltage of the node FN decrease by the threshold voltage of the transistor M70. As described above, since Vth of the transistor M70 is shifted in the positive direction by applying a negative voltage VBG to a back gate, the leakage current of the transistor M70 is extremely low. Therefore, the voltage that is recognized as the data "1" can be held at the node FN for a period of years (e.g., 10 years, approximately).

A period Tp4 is a reading operation period. The wiring RWL in a row from which data is read becomes "L", turning on the transistor M71 in the row. The wiring RWL in the other rows remains "H". In the case where "1" is stored in the memory cell 380, the transistor M72 is in an off state, and thus the wiring RBL remains "L". In the case where "0" is stored, the transistor M72 is also in an on state, so that the transistors M71 and M72 connect the wiring RBL to the wiring SL; accordingly, the voltage level of RBL becomes "H". The voltage level of a signal read to the wiring RBL is inverted by the inverter CINV and output to the wiring DO.

In a period Tp5, the memory circuit 409 is in a stand-by state, in which the voltage levels of the node FN and the wirings are the same as that in the period Tp1.

Figure 22:
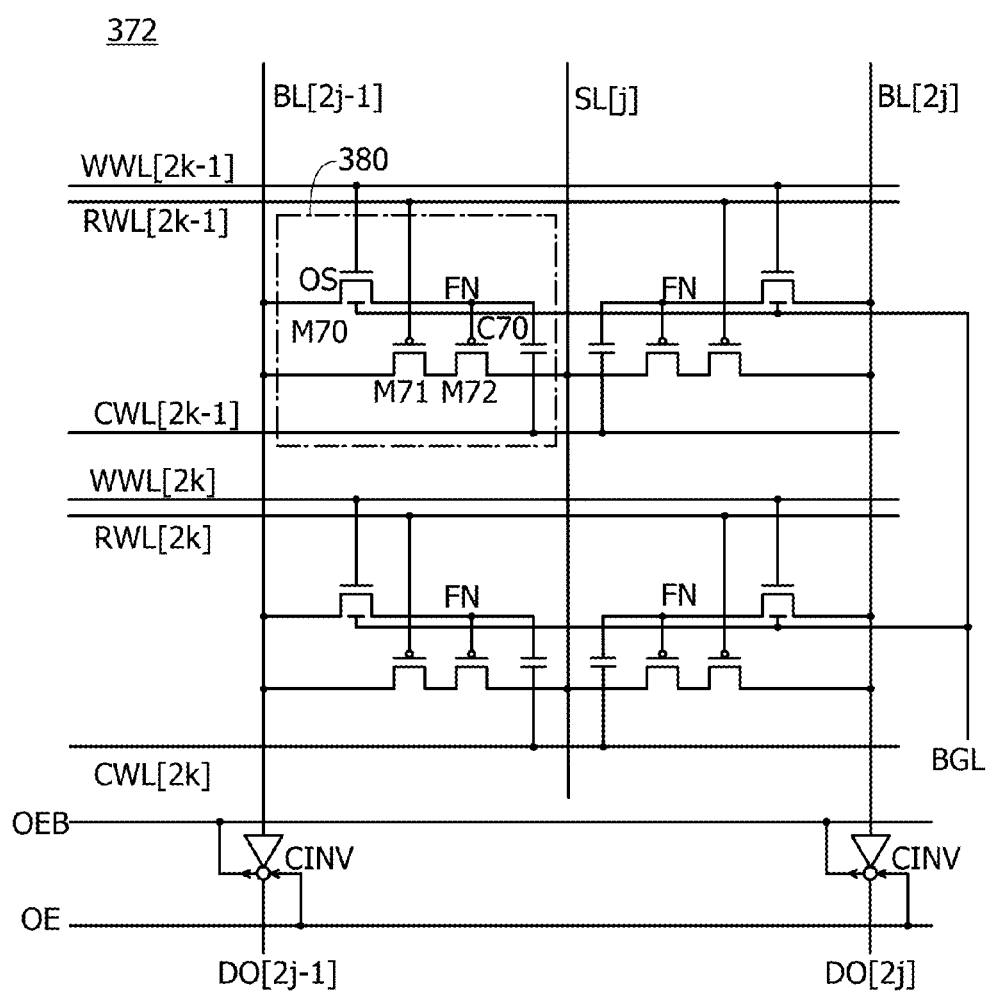
FIG. 22 is a circuit diagram for illustrating one embodiment of the present invention.

FIG. 22 illustrates another structure example of the memory cell array. A memory cell array 372 illustrated in FIG. 22 is a modification example of the memory cell array 370. The memory cell array 372 is different from the memory cell array 370 in having a wiring BL serving as both the wiring WBL and the wiring RBL. That is, in the example of FIG. 19, two kinds of bit lines which are for writing and for reading are provided, while in the example of FIG. 22, one kind of bit line is provided.

Figure 23:
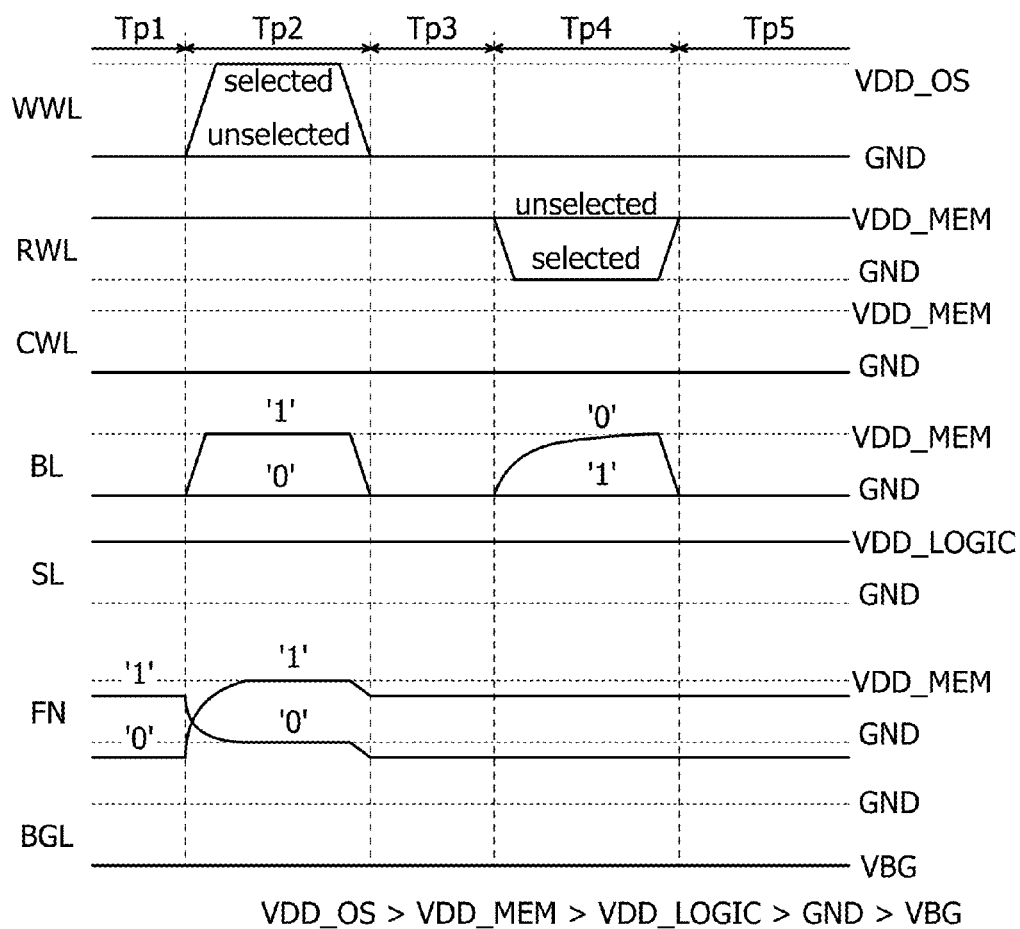
FIG. 23 is a timing chart for illustrating one embodiment of the present invention.

FIG. 23 is a timing chart showing an operation example of the memory cell array 372. As shown in FIG. 23, the memory cell array 372 can be driven in a manner similar to that of the memory cell array 370. The wiring BL has both functions of the wirings WBL and RBL. In the writing operation period (Tp2), in the case of writing "1" to the memory cell 380, the wiring BL is "H"; while in the case of writing "0", the wiring BL is "L". In the reading operation period (Tp4), in the case where "1" is stored in the memory cell 380, the transistor M72 is in an off state, and thus the wiring BL remains "L". In the case where "0" is stored, the transistor M72 is also in an on state, so that the transistors M71 and M72 connect the wiring BL to the wiring SL; accordingly, the voltage level of the wiring BL becomes "H". The logical value of a signal read to the wiring BL is inverted by the clocked inverter CINV and then output to the wiring DO.

<Advantages of Including OS Memory in Wireless Sensor>

Here, advantages of including an OS memory, which is described in detail as an example of the memory circuit 409, in the wireless sensor 400 will be described in detail.

Figure 31A:
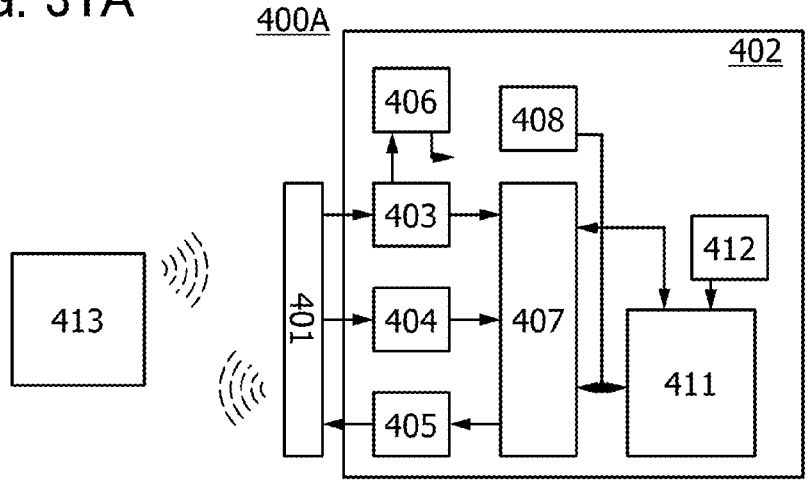
FIGS. 31A to 31C are block diagrams for illustrating one embodiment of the present invention.
Figure 31B:
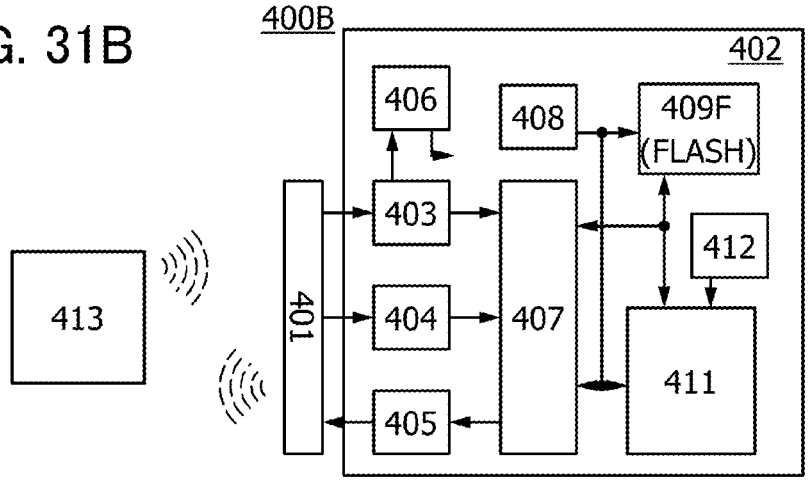
Figure 31C:
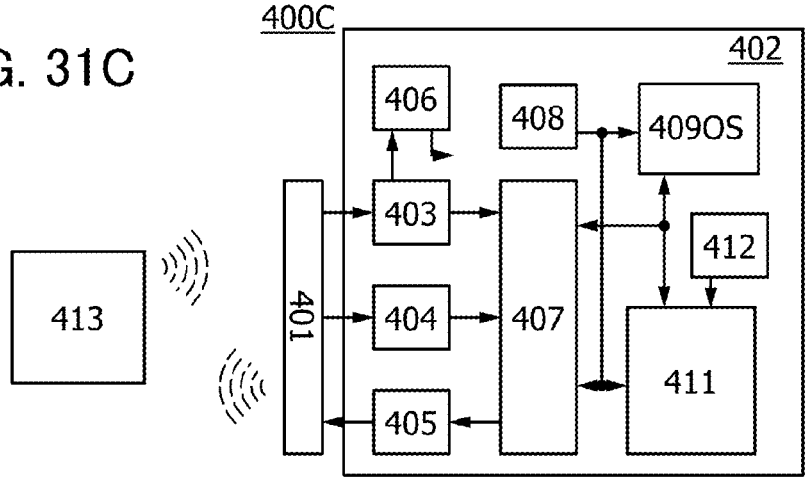

To describe the advantages of including an OS memory, a structure where the memory circuit 409 is not included in the wireless sensor 400 and a structure where a flash memory is included in the memory circuit 409 are also described for comparison. FIG. 31A is a block diagram showing a structure of a wireless sensor 400A not including the memory circuit 409; FIG. 31B is a block diagram showing a structure of a wireless sensor 400B including a memory circuit 409F with a flash memory (FLASH); and FIG. 31C is a block diagram showing a structure of a wireless sensor 400C including a memory circuit 409OS with an OS memory (OS). Note that an interrogator 413 is shown in FIGS. 31A to 31C to show an example where a wireless signal is transmitted and received between the wireless sensor 400A, 400B, or 400C and the interrogator 413.

The wireless sensor 400A shown in FIG. 31A does not include a memory circuit. Accordingly, the wireless sensor 400A cannot hold data obtained in the sensor circuit 412. Therefore, immediately after receiving a wireless signal and sensing, the wireless sensor 400A should send the data to the interrogator 413. This increases the communication time between the interrogator 413 and the wireless sensor 400A, and also increases peak power for processing obtained data. Note that sensing means a sequence of operations at the time of obtaining data with a sensor circuit in a wireless sensor.

The sequence of operations means, for example, acquisition and retention of analog data, and acquisition of digital data based on analog data.

Figure 32A:
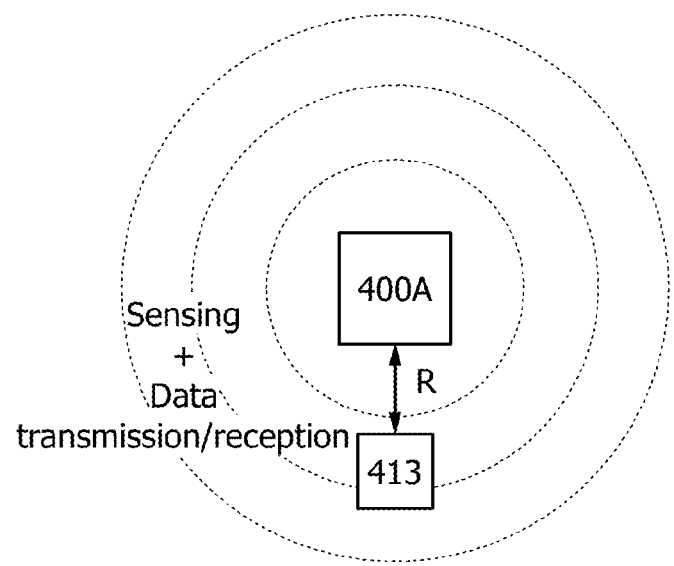
FIGS. 32A and 32B are schematic diagrams for illustrating one embodiment of the present invention.

FIG. 32A is a conceptual view of the case where sensing and data transmission/reception with the interrogator ("Sensing+Data transmission/reception" in the drawing) are conducted as a sequence of operations. As the peak power of the wireless sensor becomes larger, a distance R between the interrogator 413 and the wireless sensor 400A becomes shorter. If the distance R is short, a communication range will be narrow and the communication time will be short.

FIG. 33A shows time dependence of power in the wireless sensor 400A in the case where sensing and data transmission/reception with the interrogator are conducted as the sequence of operations. Note that the AD converter of the wireless sensor 400A is a successive approximation type, and the power consumption is estimated under conditions of a resolution of 10 bit, a sampling rate of 2 kSps, a latency of 500 μs, a drive voltage of 3.3 V, and an amplifier gain of 26 dB.

In the drawings, $P_{Comp}$, $P_{S\&H}$, $P_{CON}$, and $P_{Sensor}$ denote the power consumption of the comparator, that of the sample-and-hold circuit, that of the control circuit, and that of the sensor circuit, respectively. In addition, "wake", "Query", "ACK", "Req_RN", "SenseADC", and "Read" are names of communication commands conducted between the wireless sensor and the interrogator.

According to the time dependence of power shown in FIG. 33A, the communication time and the peak power are estimated to be 16.5 ms and 58 μW, respectively. The communication time is long because it takes time for the wireless sensor to conduct the sequence of operations, specifically, to receive a wireless signal from the interrogator 413, conduct sensing, and transmit a wireless signal to the interrogator. It is found that the sample-and-hold circuit and the comparator largely contribute to the peak power. The power consumption of the comparator includes that of a circuit that generates a reference potential Vref. With the structure of FIG. 31A, it is difficult to extend the distance R of FIG. 32A because the peak power is high. Then, because of the short distance R, the communication range is narrow, which leads to difficulty ensuring the communication time.

The wireless sensor 400B shown in FIG. 31B includes the memory circuit 409F with the flash memory (FLASH). Accordingly, the wireless sensor 400B can hold data obtained in the sensor circuit 412. Therefore, the wireless sensor does not necessarily send data to the interrogator 413 immediately after receiving a wireless signal and sensing, and can conduct sensing and data transmission separately. Therefore, one communication time between the interrogator 413 and the wireless sensor 400B can be shortened.

Figure 32B:
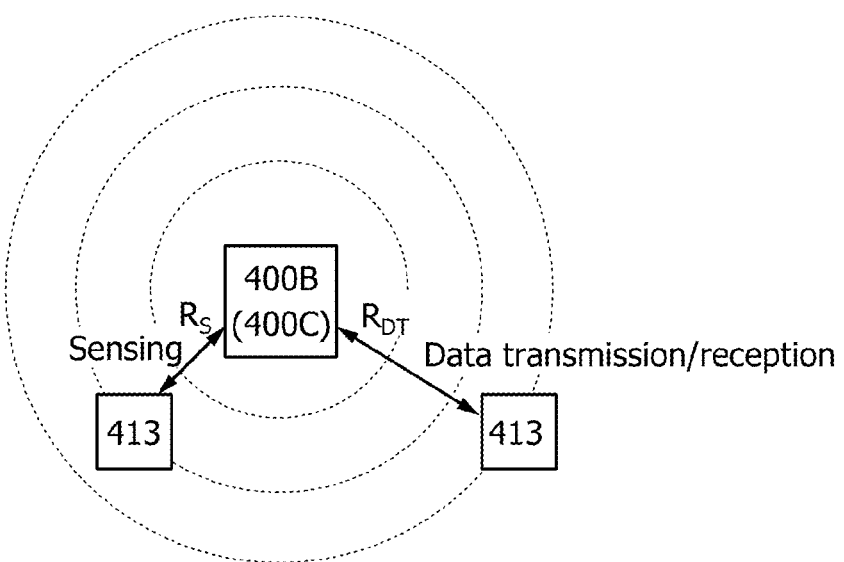

FIG. 32B is a conceptual view of the case where sensing ("Sensing" in the drawing) and data transmission/reception with the interrogator ("Data transmission/reception" in the drawing) are separately conducted as different operations. Since sensing and data transmission/reception with the interrogator 413 can be separately conducted, peak power can be reduced. Because of reduction in the peak power, a distance Rs between the interrogator 413 and the wireless sensor 400B at the time of sensing and a distance $R_{DT}$ between the interrogator 413 and the wireless sensor 400B at the time of data transmission/reception can be longer than the distance R of FIG. 32A.

FIG. 33B shows time dependence of power in the case where sensing ("Sensing" in the drawing) and data transmission/reception with the interrogator ("Data transmission/reception" in the drawing) are separately conducted as different operations. Note that the AD converter of the wireless sensor 400B is similar to that of the wireless sensor 400A. The terms and command names in the drawing have the same meanings as those in FIG. 33A. Note that $P_{WRITE}$ denotes power consumption required for data writing to the memory circuit 409F.

According to the time dependence of power in FIG. 33B, the communication time and peak power at the time of sensing are estimated to be 9.5 ms and 65 μW, respectively, while the communication time and peak power at the time of data transmission/reception with the interrogator are estimated to be 10.5 ms and 15 μW, respectively. The length of the communication time is shorter than that in the case of FIG. 31A. However, it is found that power consumed when data is written in the memory circuit 409F at the time of sensing largely contributes to the peak power. Therefore, although the communication time can be shortened, the structure of FIG. 31B which has the high peak power at the time of sensing has difficulty extending the distance Rs of FIG. 32B.

Next, the wireless sensor 400C shown in FIG. 31C includes the memory circuit 409OS with the OS memory. Accordingly, the wireless sensor 400C can hold data obtained in the sensor circuit 412. Therefore, as in the structure of FIG. 31B, sensing and data transmission can be separately conducted.

FIG. 32B is a conceptual view of the case where sensing and data transmission/reception with the interrogator 413 are separately conducted as different operations. As in the case of the wireless sensor 400B, the wireless sensor 400C can conduct sensing and data transmission/reception with the interrogator 413 separately, and thus peak power can be reduced. Because of reduction in the peak power, the distance Rs and the distance $R_{DT}$ can be longer than the distance R of FIG. 32A.

FIG. 33C shows time dependence of power in the case where sensing and data transmission/reception with the interrogator are separately conducted as different operations. Note that the AD converter of the wireless sensor 400C has the structure described in Embodiment 1. The terms and command names in the drawing have the same meanings as those in FIGS. 33A and 33B. Note that $P_{WRITE}$ denotes power consumption required for data writing to the memory circuit 409OS.

According to the time dependence of power in FIG. 33C, the communication time and peak power at the time of sensing are estimated to be 6.1 ms and 46 μW, respectively, while the communication time and peak power at the time of data transmission/reception with the interrogator are estimated to be 10.5 ms and 15 μW, respectively. The communication time is shorter than those in the cases of FIGS. 31A and 31B, and the peak power is also lower than those in the cases of FIGS. 31A and 31B. The communication time is shortened because the time required for data writing is shortened by the OS memory included in the memory circuit 409OS. The peak power is reduced because the AD converter has the structure described in Embodiment 1 and thus power consumption is reduced by stopping power supply to the sample-and-hold circuit. Therefore, with the structure of FIG. 31C with the short communication time and the small peak power, both the distance Rs and the distance $R_{DT}$ of FIG. 32B can be extended.

In the structure of FIG. 31C, the peak power at the time of data transmission/reception with the interrogator is smaller than that at the time of sensing. Thus, the distance $R_{DT}$ can be longer than the distance Rs. Therefore, data can be obtained even when the wireless sensor or the interrogator is moving. For example, sensing can be conducted while the interrogator gets close to the wireless sensor, and data transmission/reception can be conducted while the interrogator backs away from the wireless sensor. The communication time at the time of sensing is shorter than the communication time at the time of data transmission/reception with the interrogator; therefore, the structure is preferred to conduct sensing and then conduct data transmission/reception with the interrogator while the wireless sensor or the interrogator moves.

Figure 34:
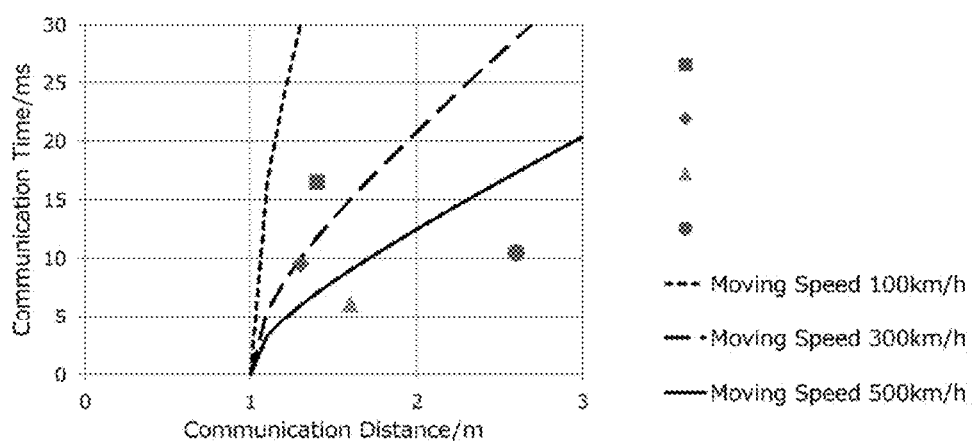
FIG. 34 is a graph for illustrating one embodiment of the present invention.
Figure 35:
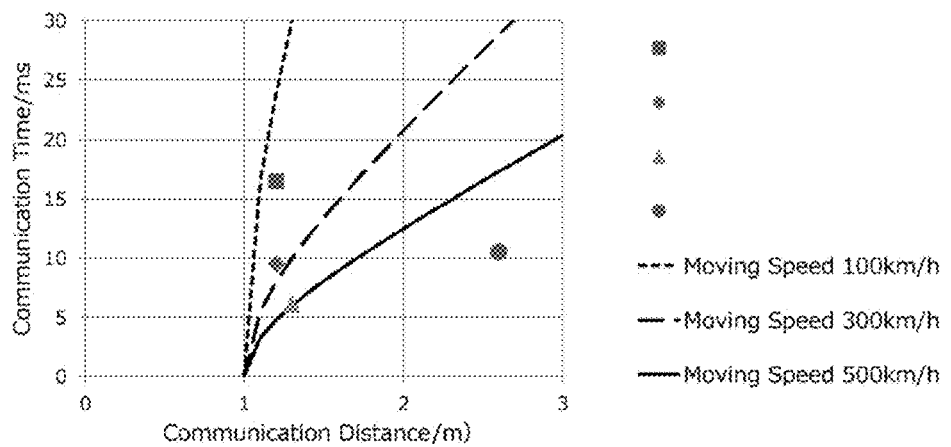
FIG. 35 is a graph for illustrating one embodiment of the present invention.

FIG. 34 and FIG. 35 are graphs each showing the communication distance and the communication time in the case where sensing and data transmission/reception with the interrogator are conducted at a time and those in the case where the sensing and the data transmission/reception with the interrogator are separately conducted; note that the power consumption of the wireless sensor of FIG. 34 and that of FIG. 35 are assumed to be 10 µW and 30 µW, respectively. In each graph, the dotted curved line indicates the boundary of a region available for communication, assuming a moving speed of 100 km/hour. In addition, in each graph, the dashed curved line indicates the boundary of a region available for communication, assuming a moving speed of 300 km/hour. Furthermore, in each graph, the solid curved line indicates the boundary of a region available for communication, assuming a moving speed of 500 km/hour. In each graph, a square mark indicates the values in the case where sensing and data transmission/reception by the wireless sensor of FIG. 31A are conducted at a time; a rhombus mark indicates the values at the time of sensing (first communication) in the case where sensing and data transmission/reception by the wireless sensor of FIG. 31B are separately conducted; a triangle mark indicates the values at the time of sensing (first communication) in the case where sensing and data transmission/reception by the wireless sensor of FIG. 31C are separately conducted; and a circle mark indicates the values at the time of data transmission/reception (second communication) with the interrogator in the case where sensing and data transmission/reception by the wireless sensor of FIG. 31C are separately conducted. An area at and below each curve is a region available for communication. Note that the distance between the devices is 1 m or more when they communicate each other.

As shown in FIG. 34 and FIG. 35, even under the condition of a moving speed of 500 km/hour, the communication distance and time of the wireless sensor including the OS memory shown in FIG. 31C are within the region available for communication. This result indicates that the structure of FIG. 31C can perform sensing and data transmission/reception with the interrogator even in the case of high-speed movement.

Embodiment 4

In this embodiment, an example of a cross-sectional structure of a semiconductor device is described with reference to FIG. 24. In the example of this embodiment, an OS transistor is stacked over a circuit formed with a transistor including silicon (a Si transistor).

Figure 24:
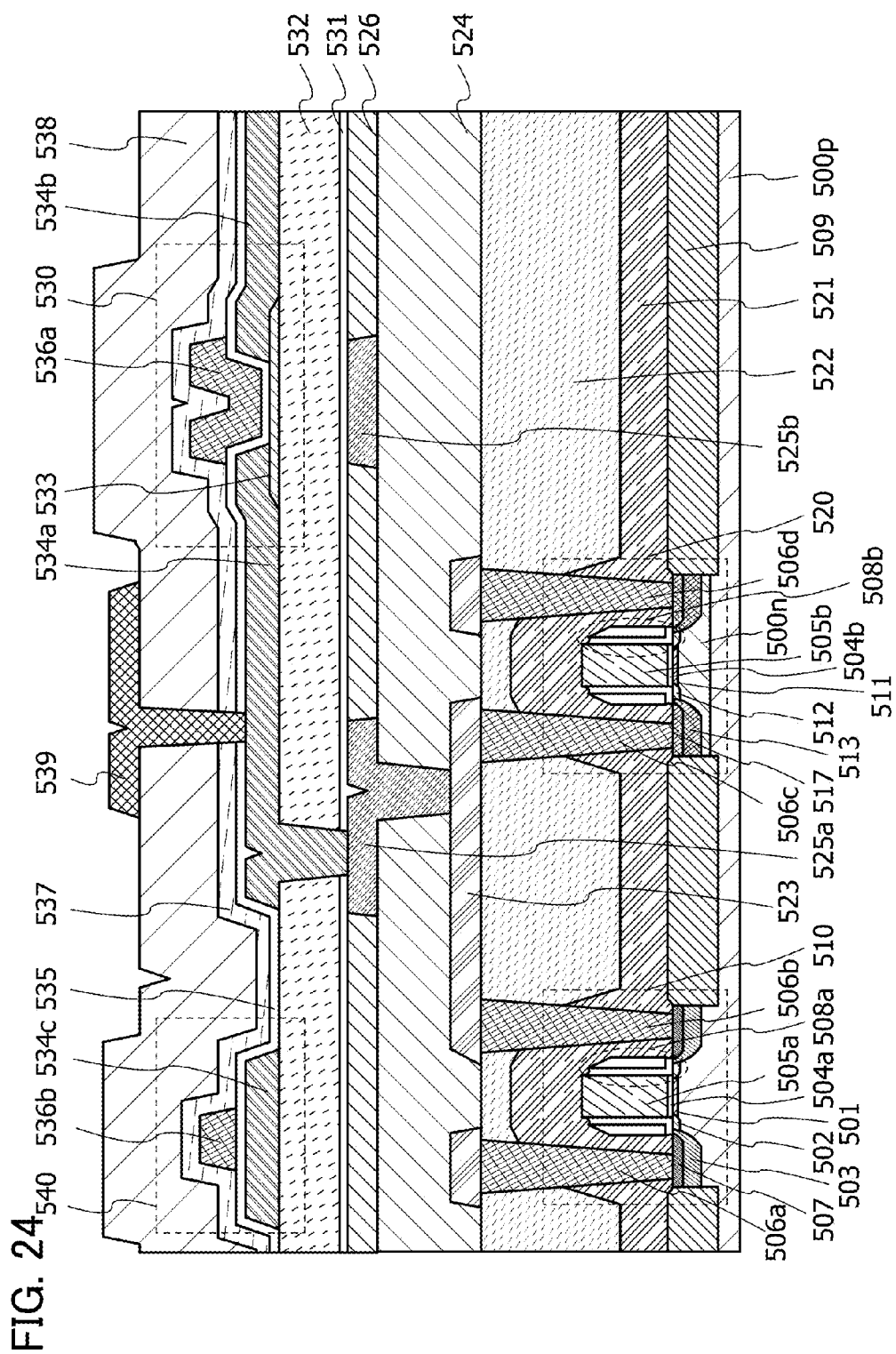
FIG. 24 is a cross-sectional view for illustrating one embodiment of the present invention.

FIG. 24 illustrates a cross section of part of a semiconductor device. The semiconductor device illustrated in FIG. 24 includes an n-channel transistor and a p-channel transistor each using a first semiconductor material (e.g., silicon) in a lower portion, and a transistor using a second semiconductor material (e.g., an oxide semiconductor) and a capacitor in an upper portion.

<Structure of Transistor in Lower Portion>

An n-channel transistor 510 includes a channel formation region 501 provided in a p-type well 500p, low-concentration impurity regions 502 and high-concentration impurity regions 503 (collectively simply referred to as impurity regions in some cases) with the channel formation region 501 provided between the impurity regions, conductive regions 507 provided in contact with the impurity regions, a gate insulating film 504a provided over the channel formation region 501, a gate electrode 505a provided over the gate insulating film 504a, and a source electrode 506a and a drain electrode 506b provided in contact with the conductive regions 507. A sidewall insulating film 508a is provided on a side surface of the gate electrode 505a. An interlayer insulating film 521 and an interlayer insulating film 522 are provided to cover the transistor 510. The source electrode 506a and the drain electrode 506b are connected to the conductive regions 507 through openings formed in the interlayer insulating film 521 and the interlayer insulating film 522. The conductive regions 507 can be formed using metal silicide or the like.

A p-channel transistor 520 includes a channel formation region 511 provided in an n-type well 500n, low-concentration impurity regions 512 and high-concentration impurity regions 513 (collectively simply referred to as impurity regions in some cases) with the channel formation region 511 provided between the impurity regions, conductive regions 517 provided in contact with the impurity regions, a gate insulating film 504b provided over the channel formation region 511, a gate electrode 505b provided over the gate insulating film 504b, and a source electrode 506c and a drain electrode 506d provided in contact with the conductive regions 517. A sidewall insulating film 508b is provided on a side surface of the gate electrode 505b. The interlayer insulating film 521 and the interlayer insulating film 522 are provided to cover the transistor 520. The source electrode 506c and the drain electrode 506d are connected to the conductive regions 517 through openings formed in the interlayer insulating films 521 and 522.

Furthermore, an element separation insulating film 509 is provided so as to surround the transistors 510 and 520.

Although FIG. 24 illustrates the case where a triple-well structure is employed, a double-well structure, a twin-well structure, or a single-well structure may alternatively be employed. Although the case where the channels of the transistors 510 and 520 are formed in the p-type well 500p and the n-type well 500n formed in a substrate, respectively, is illustrated in FIG. 24, the channels of the transistors 510 and 520 may be formed in an amorphous semiconductor film or a polycrystalline semiconductor film formed over an insulating surface. Alternatively, the channels may be formed in a single crystal semiconductor film, like the case of using an SOI substrate.

When the transistors 510 and 520 are formed using a single crystal semiconductor substrate, the transistors 510 and 520 can operate at high speed and the threshold voltage can be precisely controlled. Therefore, part or all of the sample-and-hold circuit, comparator, successive approximation register, analog-digital converter circuit, timing controller, and oscillator circuit in the semiconductor device described in any of the above embodiments are preferably formed using a single crystal semiconductor substrate.

The transistor 510 and the transistor 520 are connected to each other through a wiring 523, and an insulating film 524 is provided over the wiring 523. Further, conductive layers 525a and 525b and an insulating film 526 are provided over the insulating film 524. The insulating film 526 is preferably formed in such a manner that after the conductive layers 525a and 525b are formed over the insulating film 524, an insulating film 526 is formed over the conductive layers 525a and 525b and then the insulating film 526 is subjected to polishing treatment until upper surfaces of the conductive layers 525a and 525b are exposed.

<Structure of Transistor in Upper Portion>

A transistor 530 in the upper portion is an OS transistor. The transistor 530 includes the conductive layer 525b provided over the insulating film 524, an insulating film 531 and an insulating film 532 provided over the conductive layer 525b, a semiconductor film 533 provided over the insulating film 532, a source electrode 534a and a drain electrode 534b provided in contact with the semiconductor film 533, a gate insulating film 535 provided over the semiconductor film 533, the source electrode 534a, and the drain electrode 534b, and a gate electrode 536a provided over the gate insulating film 535. Note that the conductive layer 525b serves as a gate electrode.

FIG. 24 illustrates the case where upper and lower gate electrodes are provided with a semiconductor film provided therebetween. Both the gate electrodes may be supplied with a signal for controlling whether to turn on or off the transistor, or only one of the gate electrodes may be supplied with a fixed potential such as a ground potential. The level of the fixed potential is controlled, whereby the threshold voltage of the transistor can be controlled.

A conductive layer 534c is provided over the insulating film 532, the gate insulating film 535 is provided over the conductive layer 534c, and a conductive layer 536b is provided over the gate insulating film 535. The conductive layer 534c, the gate insulating film 535, and the conductive layer 536b form a capacitor 540.

Further, an interlayer insulating film 537 and an interlayer insulating film 538 are provided to cover the transistor 530 and the capacitor 540. The source electrode 534a is connected to a wiring 539 through an opening formed in the interlayer insulating film 537 and the interlayer insulating film 538.

An oxide semiconductor is used as the semiconductor film 533. The oxide semiconductor will be described in detail in the following embodiment.

The insulating film 532 can have a function of supplying oxygen to the semiconductor film 533 formed using an oxide semiconductor. For this reason, the insulating film 532 is preferably an insulating film containing oxygen and more preferably, the insulating film 532 is an insulating film containing oxygen in which the oxygen content is higher than that in the stoichiometric composition. The insulating film 532 also serves as an interlayer insulating film. In the case where the insulating film 532 has an uneven surface, the insulating film 532 is preferably subjected to planarization treatment such as chemical mechanical polishing (CMP) treatment so as to have a flat surface.

The gate insulating film 535 can be an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, hafnium oxide, aluminum oxide, aluminum silicate, neodymium oxide, and tantalum oxide. In the case where a material of the gate insulating film 535 has a high relative dielectric constant, the gate insulating film 535 can be formed thick. For example, in the case of using hafnium oxide with a relative dielectric constant of 16, the insulating layer can be formed approximately four times as thick as the insulating layer using silicon oxide with a relative dielectric constant of 3.9. Thus, the leakage current flowing through the gate insulating film 535 can be suppressed.

For example, like in the case of a stack of silicon oxide and hafnium oxide, a layer partly including a material having a lot of electron trap states, such as hafnium oxide, aluminum oxide, tantalum oxide, or silicon nitride is used; and the state where the potential of the gate electrode 536a is higher than that of the source electrode 534a or the drain electrode 534b may be maintained for one second or more, typically one minute or more, at a higher temperature (a temperature higher than the operating temperature or the storage temperature of the semiconductor device, or a temperature of 125° C. or higher and 450° C. or lower, typically a temperature of 150° C. or higher and 300° C. or lower). Note that a floating gate may be used instead of the layer including the material having a lot of electron trap states.

Thus, electrons transfer from the semiconductor film 533 to the gate electrode 536a, and some of the electrons are trapped by the electron trap states. In the transistor in which necessary electrons are trapped by the electron trap states in this manner, the threshold voltage shifts in the positive direction. By controlling the voltage of the gate electrode 536a, the amount of electrons to be trapped can be controlled, and thus, the threshold voltage can be controlled. Furthermore, the treatment for trapping the electrons may be performed in the manufacturing process of the transistor.

The treatment for trapping the electrons may be performed at any of the following timings before leaving the factory, for example: after pre-process (wafer process), after wafer dicing, and after packaging. In either case, it is preferable that the semiconductor device be not exposed to temperatures of 125° C. or higher for one hour or more after the process for trapping electrons.

For the gate electrode 536a and the conductive layer 536b, a conductive film of Al, Ti, Cr, Co, Ni, Cu, Y, Zr, Mo, Ru, Ag, Ta, W, or the like can be used. Alternatively, a stack of the above materials may be used. Alternatively, a conductive film containing nitrogen may be used. For example, a stack in which a titanium nitride film and a tungsten film are stacked in this order, a stack in which a tungsten nitride film and a tungsten film are stacked in this order, a stack in which a tantalum nitride film and a tungsten film are stacked in this order, or the like can be used.

The interlayer insulating film 537 can be an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, and tantalum oxide. The interlayer insulating film may be a stack of any of the above materials.

The interlayer insulating film 537 is preferably an oxide insulating film containing excess oxygen. An oxide insulating film containing excess oxygen refers to an oxide insulating film from which oxygen can be released by heat treatment or the like. The film is preferably a film in which the amount of released oxygen when converted into oxygen atoms is $1.0 \times 10^{19}$ atoms/cm$^3$ or more in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C. Oxygen released from the oxide insulating film can be diffused to the channel formation region in the semiconductor film 533 that is formed using an oxide semiconductor, so that oxygen vacancies formed in the channel formation region can be filled with the oxygen. In this manner, stable electrical characteristics of the transistor can be achieved.

Embodiment 5

In this embodiment, the OS transistor described in the above embodiments will be described.
<Characteristics of OS Transistor>

The off-state current of an OS transistor can be reduced by reducing the concentration of impurities in an oxide semiconductor to make the oxide semiconductor intrinsic or substantially intrinsic. The term "substantially intrinsic" refers to a state where an oxide semiconductor has a carrier density lower than $1\times10^{17}/cm^3$, preferably lower than $1\times10^{15}/cm^3$, further preferably lower than $1\times10^{13}/cm^3$. In the oxide semiconductor, hydrogen, nitrogen, carbon, silicon, and a metal element other than a main component are impurities. For example, hydrogen and nitrogen form donor levels to increase the carrier density.

A transistor using an intrinsic or substantially intrinsic oxide semiconductor has a low carrier density and thus is less likely to have a negative threshold voltage. In addition, the transistor including the oxide semiconductor has small variation in electrical characteristics and high reliability because of few carrier traps in the oxide semiconductor. Furthermore, a transistor including the oxide semiconductor can have the extremely low off-state current.

Note that the OS transistor with a reduced off-state current can exhibit a normalized off-state current per micrometer in channel width of $1\times10^{-18}$ A or less, preferably $1\times10^{-21}$ A or less, more preferably $1\times10^{-24}$ A or less at room temperature (approximately 25° C.), or $1\times10^{-15}$ A or less, preferably $1\times10^{-18}$ A or less, more preferably $1\times10^{-21}$ A or less at 85° C.
<Off-State Current>

Unless otherwise specified, the off-state current in this specification refers to a drain current of a transistor in the off state (also referred to as non-conduction state and cutoff state). Unless otherwise specified, the off state of an n-channel transistor means that the voltage between its gate and source (Vgs: gate-source voltage) is lower than the threshold voltage Vth, and the off state of a p-channel transistor means that the gate-source voltage Vgs is higher than the threshold voltage Vth. For example, the off-state current of an n-channel transistor sometimes refers to a drain current that flows when the gate-source voltage Vgs is lower than the threshold voltage Vth.

The off-state current of a transistor depends on Vgs in some cases. For this reason, when there is Vgs at which the off-state current of a transistor is lower than or equal to I, it may be said that the off-state current of the transistor is lower than or equal to I. The off-state current of a transistor may refer to an off-state current at given Vgs, off-state current at Vgs in a given range, or off-state current at Vgs at which sufficiently low off-state current is obtained.

As an example, the assumption is made of an n-channel transistor where the threshold voltage Vth is 0.5 V and the drain current is $1\times10^{-9}$ A at Vgs of 0.5 V, $1\times10^{-13}$ A at Vgs of 0.1 V, $1\times10^{-19}$ A at Vgs of −0.5 V, and $1\times10^{-22}$ A at Vgs of −0.8 V. The drain current of the transistor is $1\times10^{-19}$ A or lower at Vgs of −0.5 V or at Vgs in the range of −0.8 V to −0.5 V; therefore, it can be said that the off-state current of the transistor is $1\times10^{-19}$ A or lower. Since there is Vgs at which the drain current of the transistor is $1\times10^{-22}$ A or lower, it may be said that the off-state current of the transistor is $1\times10^{-22}$ A or lower.

In this specification, the off-state current of a transistor with a channel width W is sometimes represented by a current value per the channel width W or by a current value per given channel width (e.g., 1 μm). In the latter case, the unit of off-state current may be represented by current per length (e.g., A/μm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability of a semiconductor device or the like including the transistor is ensured or a temperature at which the semiconductor device or the like is used (e.g., temperature in the range of 5° C. to 35° C.). When there is Vgs at which the off-state current of a transistor at room temperature, 60° C., 85° C., 95° C., 125° C., a temperature at which the reliability of a semiconductor device or the like including the transistor is ensured, or a temperature at which the semiconductor device or the like is used (e.g., temperature in the range of 5° C. to 35° C.) is lower than or equal to I, it may be said that the off-state current of the transistor is lower than or equal to I.

The off-state current of a transistor depends on a voltage Vds between its drain and source in some cases. Unless otherwise specified, the off-state current in this specification may be an off-state current at Vds with an absolute value of 0.1 V, 0.8 V, 1 V, 1.2 V, 1.8 V, 2.5 V, 3 V, 3.3 V, 10 V, 12 V, 16 V, or 20 V. Alternatively, the off-state current may be an off-state current at Vds at which the reliability of a semiconductor device or the like including the transistor is ensured or Vds used in the semiconductor device or the like. When there is Vgs at which the off-state current of a transistor is lower than or equal to I at given Vds, it may be said that the off-state current of the transistor is lower than or equal to I. Here, given Vds is, for example, 0.1 V, 0.8 V, 1 V, 1.2 V, 1.8 V, 2.5 V, 3 V, 3.3 V, 10 V, 12 V, 16 V, 20 V, Vds at which the reliability of a semiconductor device or the like including the transistor is ensured, or Vds used in the semiconductor device or the like.

In the above description of the off-state current, a drain may be replaced with a source. That is, the off-state current sometimes refers to a current that flows through a source of a transistor in the off state.

In this specification, the term "leakage current" sometimes expresses the same meaning as off-state current.

In this specification, the off-state current sometimes refers to a current that flows between a source and a drain when a transistor is off, for example.
<Composition of Oxide Semiconductor>

Note that at least indium (In) or zinc (Zn) is preferably contained as an oxide semiconductor used for the semiconductor layer of the OS transistor. In particular, In and Zn are preferably contained. A stabilizer for strongly bonding oxygen is preferably contained in addition to In and Zn. As a stabilizer, at least one of gallium (Ga), tin (Sn), zirconium (Zr), hafnium (Hf), and aluminum (Al) may be contained.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As an oxide semiconductor used for the semiconductor layer of the transistor, for example, any of the following can be used: an indium oxide, a tin oxide, a zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

For example, an In—Ga—Zn-based oxide with an atomic ratio of In:Ga:Zn=1:1:1, In:Ga:Zn=3:1:2, or In:Ga:Zn=2:1:3, or an oxide with an atomic ratio close to the above atomic ratios can be used.

<Impurity in Oxide Semiconductor>

When the oxide semiconductor film forming the semiconductor layer contains a large amount of hydrogen, the hydrogen and the oxide semiconductor are bonded to each other, so that part of the hydrogen serves as a donor and causes generation of an electron which is a carrier. As a result, the threshold voltage of the transistor shifts in the negative direction. Therefore, it is preferable that, after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is also reduced by the dehydration treatment (dehydrogenation treatment) in some cases. Accordingly, it is preferable that oxygen be added to the oxide semiconductor film to fill oxygen vacancies increased by the dehydration treatment (dehydrogenation treatment).

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) oxide semiconductor film or a substantially i-type (intrinsic) oxide semiconductor film which is extremely close to an i-type oxide semiconductor film. Note that "substantially intrinsic" means that the oxide semiconductor film contains extremely few (close to zero) carriers derived from a donor and has a carrier density of lower than or equal to $1\times10^{17}/\text{cm}^3$, lower than or equal to $1\times10^{16}/\text{cm}^3$, lower than or equal to $1\times10^{15}/\text{cm}^3$, lower than or equal to $1\times10^{14}/\text{cm}^3$, or lower than or equal to $1\times10^{13}/\text{cm}^3$.

<Structure of Oxide Semiconductor>

Next, a structure of an oxide semiconductor is described.

In this specification, the term "parallel" indicates that the angle formed between two straight lines is greater than or equal to −10° and less than or equal to 10°, and accordingly also includes the case where the angle is greater than or equal to −5° and less than or equal to 5°. A term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100°, and accordingly also includes the case where the angle is greater than or equal to 85° and less than or equal to 95°. A term "substantially perpendicular" indicates that the angle formed between two straight lines is greater than or equal to 60° and less than or equal to 120°.

In this specification, trigonal and rhombohedral crystal systems are included in a hexagonal crystal system.

An oxide semiconductor film is classified into a non-single-crystal oxide semiconductor film and a single crystal oxide semiconductor film. Alternatively, an oxide semiconductor is classified into, for example, a crystalline oxide semiconductor and an amorphous oxide semiconductor.

Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor. In addition, examples of a crystalline oxide semiconductor include a single crystal oxide semiconductor, a CAAC-OS, a polycrystalline oxide semiconductor, and a microcrystalline oxide semiconductor.

First, a CAAC-OS film is described.

The CAAC-OS film is one of oxide semiconductor films having a plurality of c-axis aligned crystal parts.

In a combined analysis image (also referred to as a high-resolution TEM image) of a bright-field image and a diffraction pattern of a CAAC-OS film, which is obtained using a transmission electron microscope (TEM), a plurality of crystal parts can be observed. However, even in the high-resolution TEM image, a boundary between the crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to a sample surface, metal atoms are arranged in a layered manner in the crystal parts. Each metal atom layer has a morphology reflecting a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

On the other hand, according to the high-resolution planar TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD) apparatus. For example, when the CAAC-OS film including $InGaZnO_4$ crystals is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charges trapped by the carrier traps in the oxide semiconductor film takes a long time to be released, and might behave like fixed electric charges. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film is described.

A microcrystalline oxide semiconductor film has a region where a crystal part is observed in a high resolution TEM image and a region where a crystal part is not clearly observed in a high resolution TEM image. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In a high resolution TEM image of the nc-OS film, a grain boundary cannot be found clearly in the nc-OS film sometimes for example.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a diffraction pattern like a halo pattern appears in a selected-area electron diffraction pattern of the nc-OS film which is obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots is shown in a ring-like region in some cases.

The nc-OS film is an oxide semiconductor film that has high regularity as compared to an amorphous oxide semiconductor film. Therefore, the nc-OS film has a lower density of defect states than an amorphous oxide semiconductor film. However, there is no regularity of crystal orientation between different crystal parts in the nc-OS film; hence, the nc-OS film has a higher density of defect states than the CAAC-OS film.

Next, an amorphous oxide semiconductor film is described.

The amorphous oxide semiconductor film has disordered atomic arrangement and no crystal part. For example, the amorphous oxide semiconductor film does not have a specific state as in quartz.

In the high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Further, a halo pattern is shown but a spot is not shown in a nanobeam electron diffraction pattern of the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be seen. Furthermore, in the high-resolution TEM image, there are a region where a crystal part is clearly observed and a region where a crystal part is not observed. In the a-like OS film, crystallization by a slight amount of electron beam used for TEM observation occurs and growth of the crystal part can be found in some cases. In contrast, crystallization by a slight amount of electron beam used for TEM observation is less observed in the nc-OS film having good quality.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as d value). The value is calculated to 0.29 nm from crystal structure analysis. Thus, each of the lattice fringes having a distance therebetween of from 0.28 nm to 0.30 nm corresponds to the a-b plane of the $InGaZnO_4$ crystal, focusing on the lattice fringes in the high-resolution TEM image.

The density of an oxide semiconductor film might vary depending on its structure. For example, if the composition of an oxide semiconductor film is determined, the structure of the oxide semiconductor film can be estimated from a comparison between the density of the oxide semiconductor film and the density of a single crystal oxide semiconductor having the same composition as the oxide semiconductor film. For example, the density of the a-like OS film is higher than or equal to 78.6% and lower than 92.3% of the density of the single crystal oxide semiconductor having the same composition. For example, the density of each of the nc-OS film and the CAAC-OS film is higher than or equal to 92.3% and lower than 100% of the density of the single crystal oxide semiconductor having the same composition. Note that it is difficult to deposit an oxide semiconductor film whose density is lower than 78% of the density of the single crystal oxide semiconductor film.

Specific examples of the above description are given. For example, in the case of an oxide semiconductor film with an atomic ratio of In:Ga:Zn=1:1:1, the density of single-crystal $InGaZnO_4$ with a rhombohedral crystal structure is 6.357 $g/cm^3$. Thus, for example, in the case of the oxide semiconductor film with an atomic ratio of In:Ga:Zn=1:1:1, the density of an a-like OS film is higher than or equal to 5.0 $g/cm^3$ and lower than 5.9 $g/cm^3$. In addition, for example, in the case of the oxide semiconductor film with an atomic ratio of In:Ga:Zn=1:1:1, the density of an nc-OS film or a CAAC-OS film is higher than or equal to 5.9 $g/cm^3$ and lower than 6.3 $g/cm^3$.

Note that single crystals with the same composition do not exist in some cases. In such a case, by combining single crystals with different compositions at a given proportion, it is possible to calculate density that corresponds to the density of a single crystal with a desired composition. The density of the single crystal with a desired composition may be calculated using weighted average with respect to the combination ratio of the single crystals with different compositions. Note that it is preferable to combine as few kinds of single crystals as possible for density calculation.

Note that an oxide semiconductor film may be a stacked film including two or more films of an amorphous oxide semiconductor film, an a-like OS film, a microcrystalline oxide semiconductor film, and a CAAC-OS film, for example.

The OS transistor can achieve extremely favorable off-state current characteristics.

Embodiment 6

Examples of electronic devices each including the semiconductor device described in any of the above embodiments are described in this embodiment. Examples of the electronic devices include devices including wireless communication units, such as computers, various portable information terminals (including mobile phones, portable game machines, audio reproducing devices, and the like), e-book readers, and wireless keyboards. A refrigerator, an air conditioner, an automobile, a washing machine, a cooking device (e.g., a microwave oven) may be provided with a wireless communication unit including the wireless sensor described in the above embodiment, so as to be remotely controlled by a computer or any of various portable information terminals.

Figure 25A:
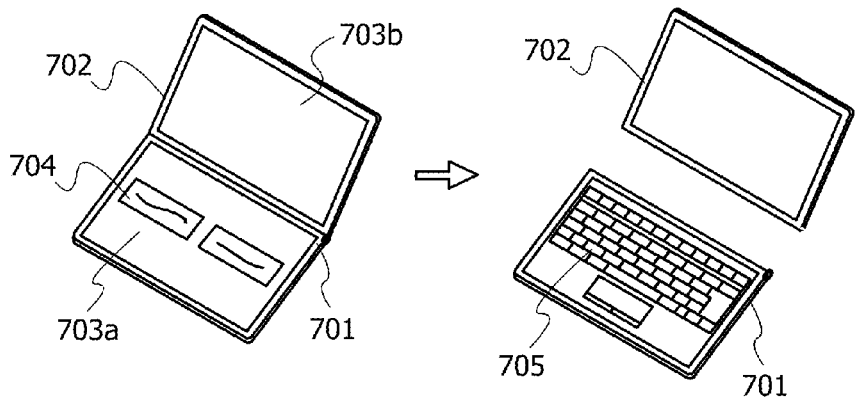
FIGS. 25A to 25D each illustrate an electronic device for illustrating one embodiment of the present invention.

FIG. 25A illustrates a portable information terminal, which includes a housing 701, a housing 702, a first display portion 703a, a second display portion 703b, and the like. The semiconductor device described in any of the above embodiments is provided in at least part of the housings 701 and 702. Thus, the portable information terminal with low power consumption can be obtained.

Note that the first display portion 703a is a touch panel, and for example, as illustrated in the left of FIG. 25A, which of "touch input" and "keyboard input" is performed can be selected by a selection button 704 displayed on the first display portion 703a. Since the selection buttons with a variety of sizes can be displayed, the portable information terminal can be easily used by people of any generation. In the case where "keyboard input" is selected, for example, a keyboard 705 is displayed on the first display portion 703a as illustrated in a right part of FIG. 25A. With such a structure, letters can be input quickly by keyboard input as in the case of using a conventional information terminal.

Furthermore, one of the first display portion 703a and the second display portion 703b can be detached from the portable information terminal as illustrated in the right in FIG. 25A. When the second display portion 703b is also a touch panel, the information terminal has a further reduced weight and thus is easy to carry, which is convenient because operation can be performed with one hand while the other hand supports the housing 702.

The portable information terminal illustrated in FIG. 25A can have a function of displaying a variety of kinds of information (e.g., a still image, a moving image, and a text image), a function of displaying a calendar, a date, the time, or the like on the display portion, a function of operating or editing the information displayed on the display portion, a function of controlling processing by a variety of kinds of software (programs), and the like. Furthermore, an external connection terminal (an earphone terminal, a USB terminal, or the like), a recording medium insertion portion, and the like may be provided on the back surface or the side surface of the housing.

With the portable information terminal illustrated in FIG. 25A, desired book data or the like can be purchased and downloaded from an electronic book server through wireless communication. Furthermore, the housing 702 illustrated in FIG. 25A may have an antenna, a microphone function, or a wireless communication function to be used as a mobile phone. Note that data communication between the housings 701 and 702 that are separated from each other can be performed through wireless communication.

Figure 25B:
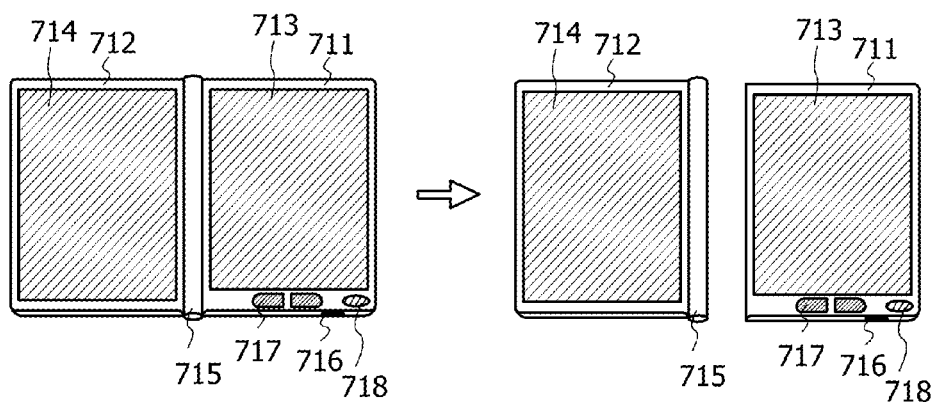

FIG. 25B illustrates an e-book reader incorporating electronic paper, which includes two housings, a housing 711 and a housing 712. The housing 711 and the housing 712 include a display portion 713 and a display portion 714, respectively. For example, the display portion 714 may be formed using electronic paper and the display portion 713 may be formed using a display device that has a high response speed and is favorable for displaying a moving image, such as a liquid crystal display device or an organic light-emitting display device.

The housing 711 is connected to the housing 712 by a hinge 715, so that the e-book reader can be opened and closed using the hinge 715 as an axis. The housing 711 is provided with a power switch 716, operation keys 717, a speaker 718, and the like. At least one of the housing 711 and the housing 712 is provided with the semiconductor device described in any of the above embodiments. Thus, the e-book reader with low power consumption can be obtained.

The housings 711 and 712 may each be provided with a secondary battery so as to be separately driven as in the right of FIG. 25B, for example. For example, the housing 712 may be provided with a communication device that can be connected to a mobile phone line and a device that complies with a short-distance wireless communication standard (e.g., wireless LAN or Bluetooth), and the housing 711 may be provided with a short-distance wireless communication device. In that case, data received by the housing 712 through the mobile phone line is transferred to the housing 711 using a short-distance wireless communication standard. Data input in the housing 711 is sent to the housing 712 using a short-distance wireless communication standard and then is sent to the mobile phone line. That is, the housing 712 functions as a wireless modem.

The housings 711 and 712 can be configured to sound an alarm or the display portion 713 can be configured to display a message in the case where communication is (or might be) unintentionally interrupted because of increase of the distance between the housings 711 and 712. In that case, a risk of losing the housings can be reduced.

In the case of such usage, for example, the housing 712 is usually put in a bag, and the housing 711 is held with a hand or placed at a position from which the housing 711 can be easily taken out (e.g., in a pocket of clothes), whereby simple operation can be performed by the housing 711. For example, part or all of data can be stored in the housing 712 and transmitted to the housing 711 using a short-distance wireless communication standard to be read or viewed on the housing 711 as needed.

Figure 25C:
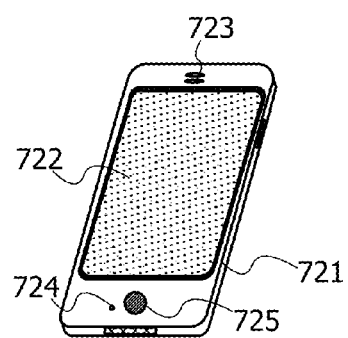

FIG. 25C is a smartphone. A housing 721 of the smartphone is provided with a display portion 722, a speaker 723, a microphone 724, an operation button 725, and the like. The housing 721 is provided with the semiconductor device described in any of the above embodiments. Thus, the smartphone with low power consumption can be obtained.

Figure 25D:
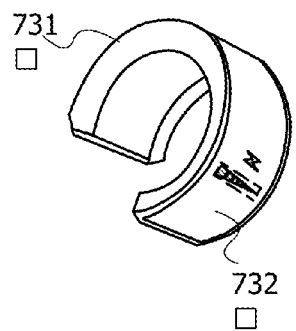

FIG. 25D is a wristband type display device including a housing 731, a display portion 732, and the like. The semiconductor device described in any of the above embodiments is provided in the housing 731. Thus, the wristband type display with low power consumption can be obtained.

Embodiment 7

In this embodiment, application examples of the wireless sensor including the semiconductor device described in any of the above embodiments will be described with reference to FIGS. 26A to 26C and FIGS. 27A and 27B.

Figure 26A:
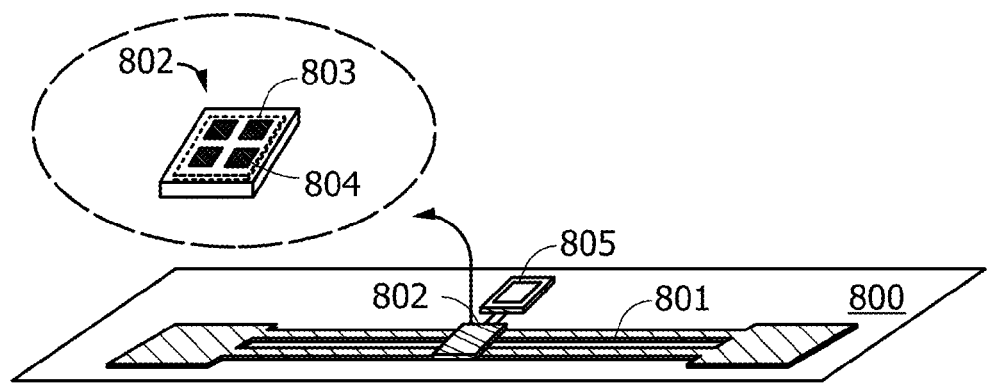
FIGS. 26A to 26C are schematic diagrams for illustrating one embodiment of the present invention.

FIG. 26A is a schematic diagram showing the wireless sensor described in the above embodiment. As shown in FIG. 26A, a wireless sensor 800 includes an antenna 801, an integrated circuit portion 802, and a sensor circuit 805.

The antenna 801 may have a size and a shape suitable for the application in the range determined by the Radio Law. For example, a dipole antenna, a patch antenna, a loop antenna, a Yagi antenna, or the like can be used.

The integrated circuit portion 802 includes a circuit 803 including a Si transistor and an OS transistor and a terminal portion 804 for connection to the antenna. The circuit 803 is formed through the pre-process for forming the Si transistor and the OS transistor. The terminal portion 804 is formed through the post-process for forming a chip by dicing and bonding step. Note that the integrated circuit portion 802 is also referred to as a semiconductor package or an IC package. Note that the sensor circuit 805 is provided in or externally attached to the integral circuit portion 802.

The sensor circuit 805 outputs various data such as heat data or electromagnetic data as analog data. The sensor circuit 805 may be provided outside the wireless sensor, 800 depending on the size of the sensor circuit 805.

Figure 26B:
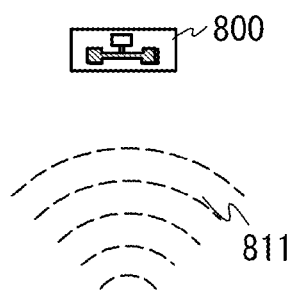

FIG. 26B is a schematic diagram of the wireless sensor 800 of FIG. 26A receiving a wireless signal 811. The wireless sensor 800 generates power in response to the wireless signal 811 transmitted from the outside. The sensor circuit 805 and the integrated circuit portion 802 including the AD converter in the wireless sensor 800 that are ready for operation by receiving power operate to supply power or stop supplying power to the circuits as necessary. As to the operation of the AD converter, whether to supply power to the circuits can be controlled as described in the above embodiments. Therefore, the AD converter is not necessarily supplied with power continuously over the period of receiving the wireless signal 811. Thus, the proportion of power consumed by the AD converter in the wireless sensor 800 can be reduced and the proportion of power consumed by sending a signal from the wireless sensor 800 to the outside can be increased; thus, the convenience of the wireless sensor 800 can be improved, e.g., the communication distance can be extended.

Figure 26C:
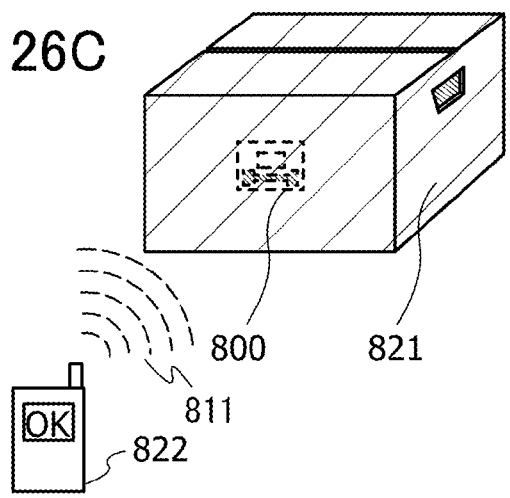

An application form of such a wireless sensor can be described with the schematic diagram in FIG. 26C. For example, the wireless sensor 800 is attached to, or incorporated in an article 821, and the wireless signal 811 is sent from an external interrogator 822. The wireless sensor 800 having received the wireless signal 811 can obtain data of a temperature or the like without touch but with the sensor, and send the data to the interrogator 822. As described above, since power consumption to convert the analog potential obtained by the sensor into a digital signal in the AD converter can be reduced, the communication distance can be extended and more convenient use can be achieved.

Figure 27A:
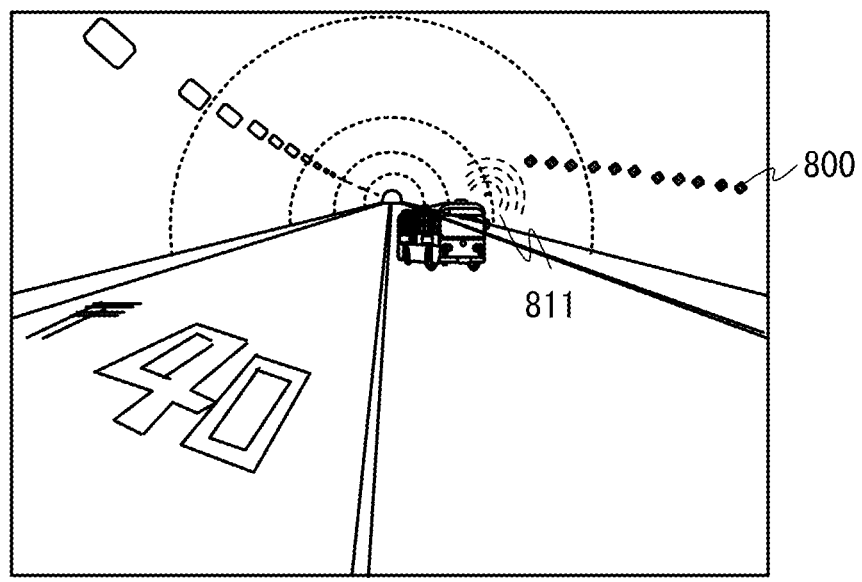
FIGS. 27A and 27B are each a schematic diagram for illustrating one embodiment of the present invention.

Another application form of the wireless sensor can be described with the schematic diagram in FIG. 27A. For example, the wireless sensor 800 is embedded in a tunnel wall surface, and the wireless signal 811 is sent from the outside. The wireless sensor 800 having received the wireless signal 811 can obtain data on the tunnel wall surface by the sensor and send the data. As described above, since power consumption to convert the analog potential obtained by the sensor into a digital signal in the AD converter can be reduced, the communication distance can be extended and more convenient use can be achieved. Therefore, data in the tunnel wall surface can be obtained without direct touch.

Figure 27B:
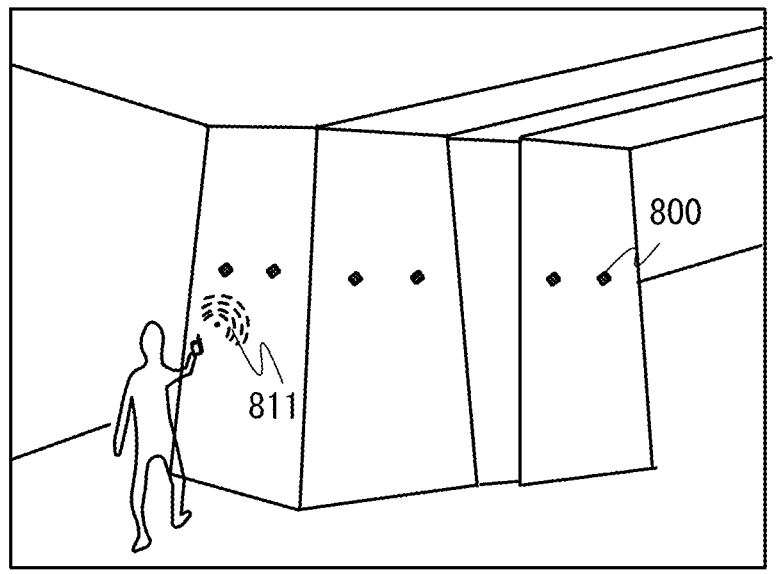

Another application form of the wireless sensor can be described with the schematic diagram in FIG. 27B. For example, the wireless sensor 800 is embedded in a wall surface of a pillar of a bridge, and the wireless signal 811 is sent from the outside. The wireless sensor 800 having received the wireless signal 811 can obtain data in the pillar of the bridge by the sensor and send the data. As described above, since power consumption to convert the analog potential obtained by the sensor into a digital signal in the AD converter can be reduced, the communication distance can be extended and more convenient use can be achieved. Therefore, data in the pillar of the bridge can be obtained without direct touch.

Figure 36:
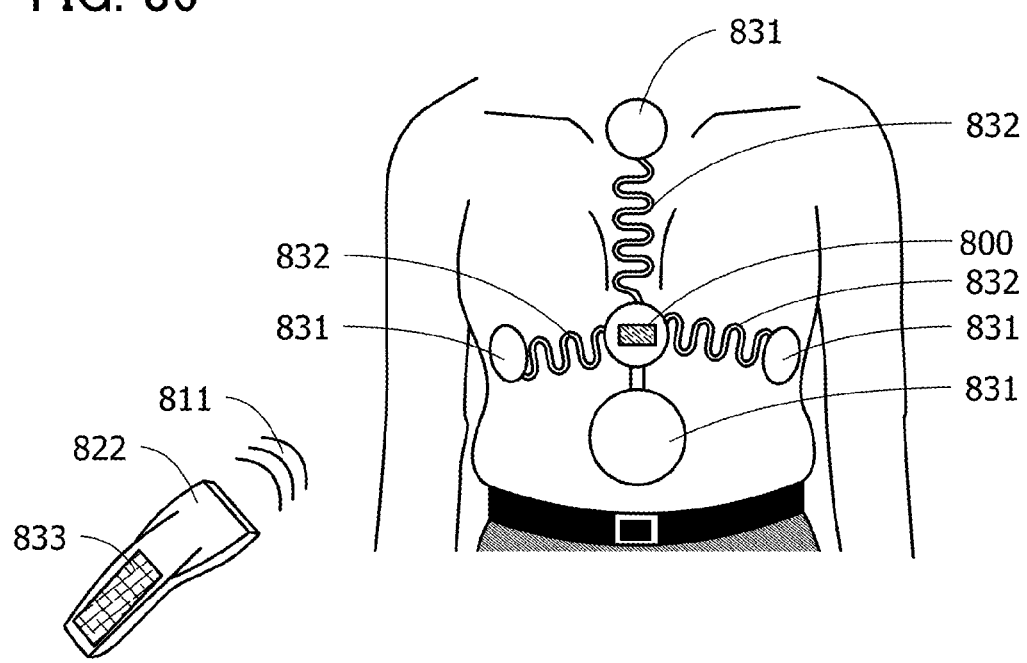
FIG. 36 is a schematic diagram for illustrating one embodiment of the present invention.

Another application form of the wireless sensor can be described with the schematic diagram in FIG. 36. For example, the wireless sensor 800 is attached to a human body with the use of a bond pad or the like, and the wireless signal 811 is sent from the interrogator 822. The wireless sensor 800 having received the wireless signal 811 can obtain data such as biological information by supplying a signal to an electrode 831 or the like attached to the human body through a wiring 832, and send the data. The obtained data can be checked on a display portion 833 of the interrogator 822. As described above, since power consumption to convert the analog potential obtained by the sensor into a digital signal in the AD converter can be reduced, the communication distance can be extended and more convenient use can be achieved. Therefore, biological information of a human body can be obtained without direct touch.

Embodiment 8

Figure 38:
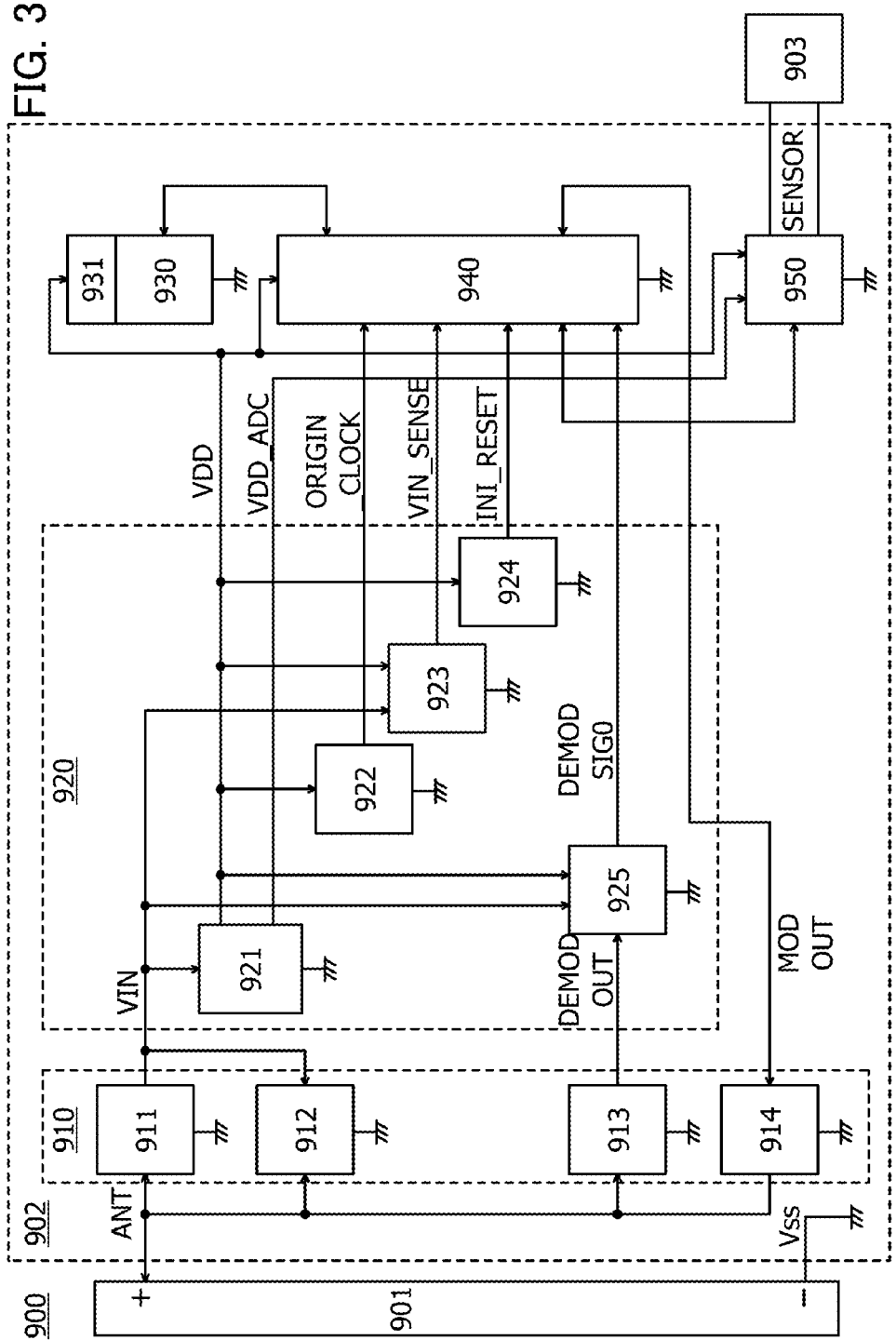
FIG. 38 is a block diagram for illustrating one embodiment of the present invention.

FIG. 38 is a block diagram of a wireless sensor including the OS memory and the semiconductor device functioning as an AD converter that are described in the above embodiments. In this embodiment, a wireless sensor with a structure different from that of the wireless sensor described in any of the above embodiments will be described.

A wireless sensor 900 includes an antenna 901, a circuit portion 902, and a sensor 903. The circuit portion 902 processes a signal received by the antenna 901, generates response data in accordance with the received signal, and sends the response data from the antenna 901. The circuit portion 902 includes, for example, an input/output portion (IN/OUT) 910, an analog portion 920, a memory portion 930, a logic portion 940, and an AD converter 950.

<Input/Output Portion>

Figure 39A:
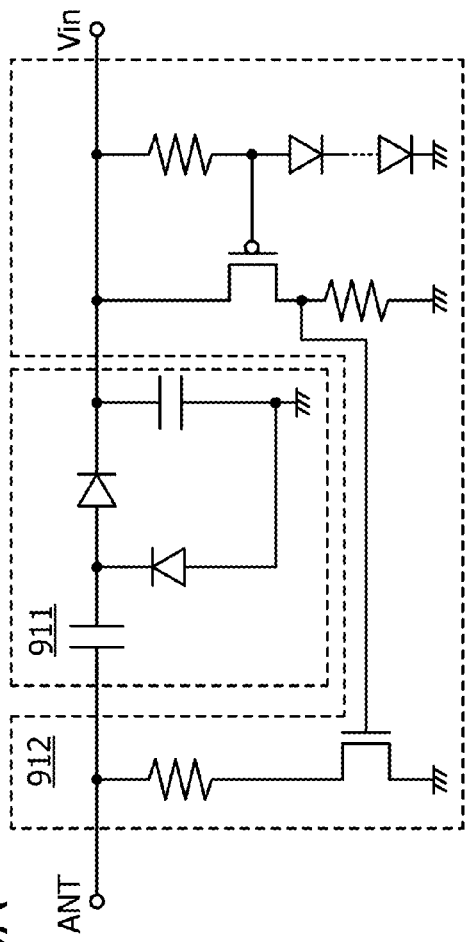
FIGS. 39A and 39B are circuit diagrams for illustrating one embodiment of the present invention.
Figure 39B:
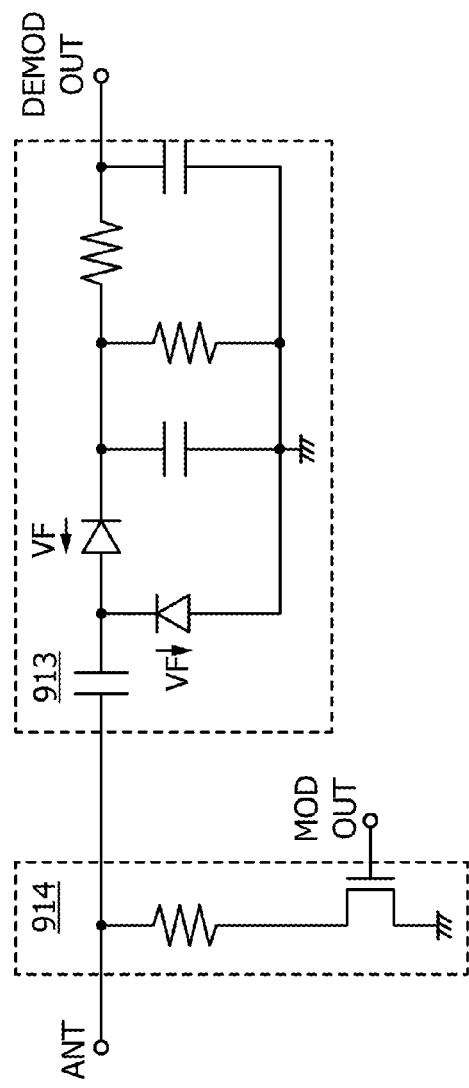

The input/output portion 910 includes a rectifier circuit 911, a limiter circuit 912, a demodulation circuit 913, and a modulation circuit 914. FIG. 39A is a circuit diagram illustrating a structure example of the rectifier circuit 911 and the limiter circuit 912. FIG. 39B is a circuit diagram illustrating a structure example of the demodulation circuit 913 and the modulation circuit 914.

The rectifier circuit 911 is a circuit that rectifies a signal (carrier wave ANT) input from the antenna 901 and generates a voltage VIN. The voltage VIN is output to the circuits in the analog portion 920.

The limiter circuit 912 is a protection circuit for preventing the voltage VIN from becoming high.

The demodulation circuit 913 is a circuit that demodulates the carrier wave ANT received by the antenna 901. The demodulation circuit 913 generates a demodulated signal DEMOD_OUT and outputs the signal to the analog portion 920.

The modulation circuit 914 is a circuit that modulates the response data (a digital signal) MOD_OUT output from the logic portion 940 and outputs the modulated data with the carrier wave ANT. The modulation method is, for example, the amplitude shift keying (ASK) method.

<Analog Portion>

The analog portion 920 includes a power circuit 921, an oscillator circuit 922, a voltage detector circuit 923, a reset circuit 924, and a buffer circuit 925.

Figure 40A:
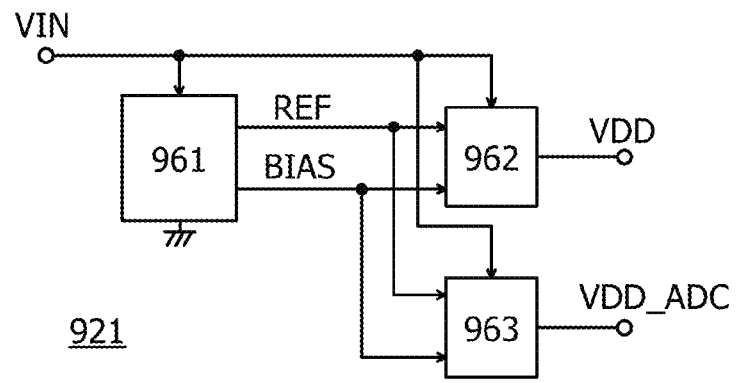
FIGS. 40A to 40C are circuit diagrams for illustrating one embodiment of the present invention.

FIG. 40A is a block diagram illustrating a structure example of the power circuit 921. The power circuit 921 is a circuit that generates an operating voltage for the memory portion 930, the logic portion 940, and the AD converter 950. Here, the power circuit 921 generates two operating voltages (VDD and VDD ADC) from the voltage VIN. The power circuit 921 includes a voltage generation circuit 961 that generates a bias voltage BIAS and a reference potential REF from the voltage VIN, and voltage generation circuits 962 and 963 that generate the operating voltages from the voltage BIAS, the reference voltage REF, and the voltage VIN.

Figure 40B:
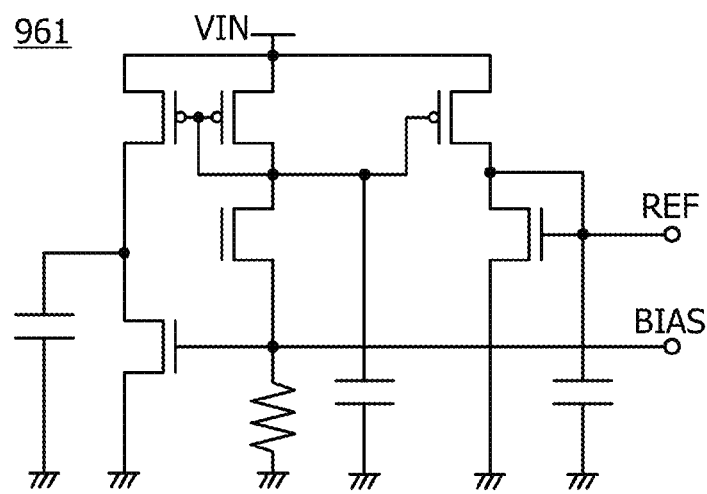
Figure 40C:
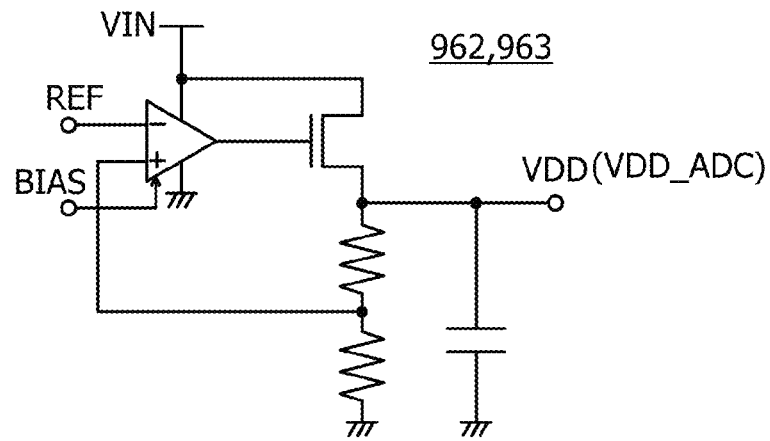

FIG. 40B is a circuit diagram illustrating a structure example of the voltage generation circuit 961. FIG. 40C is a circuit diagram illustrating a structure example of the voltage generation circuits 962 and 963.

Figure 41A:
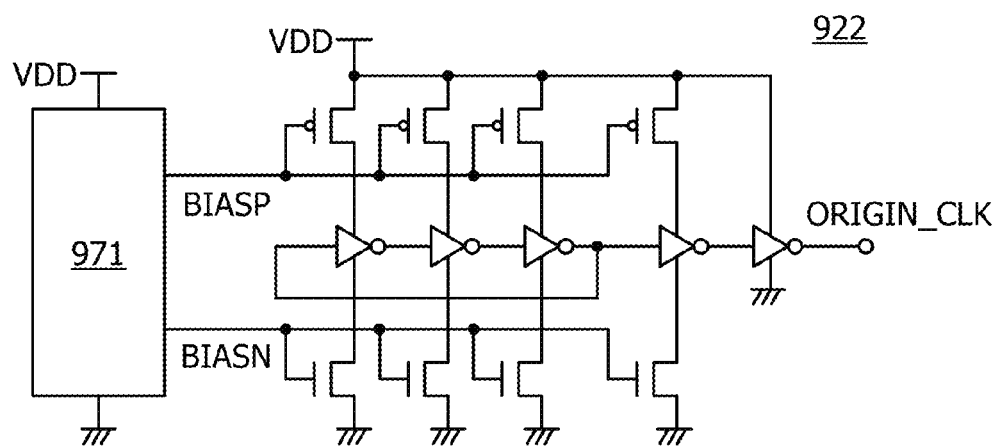
FIGS. 41A and 41B are circuit diagrams for illustrating one embodiment of the present invention.
Figure 41B:
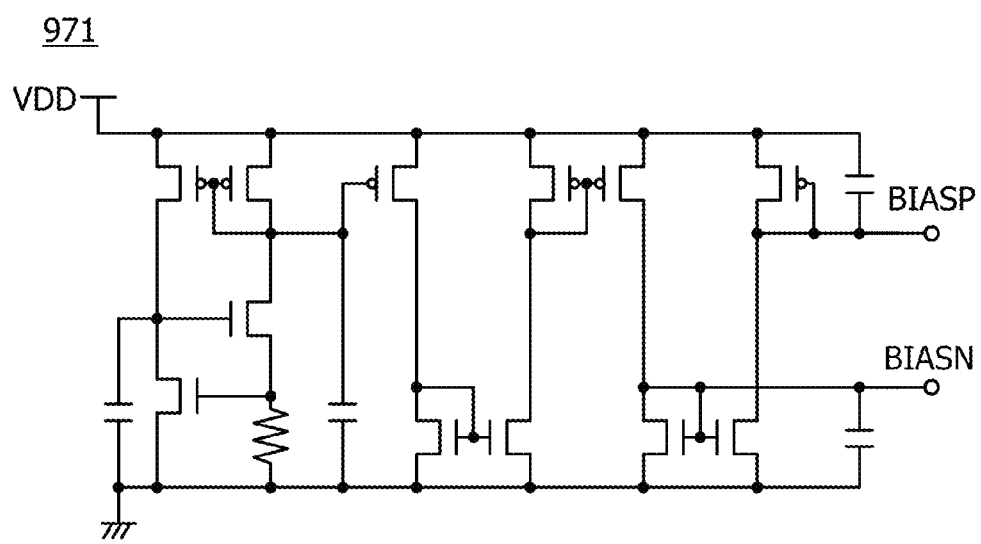

The oscillator circuit 922 is a circuit that generates a reference clock signal (ORIGIN_CLK) from the voltage (VDD) generated by the power circuit 921. FIG. 41A illustrates a structure example of the oscillator circuit 922, and FIG. 41B illustrates a structure example of a voltage generation circuit 971 that generates bias voltages (BIASP, BIASN) of the oscillator circuit 922.

Figure 42:
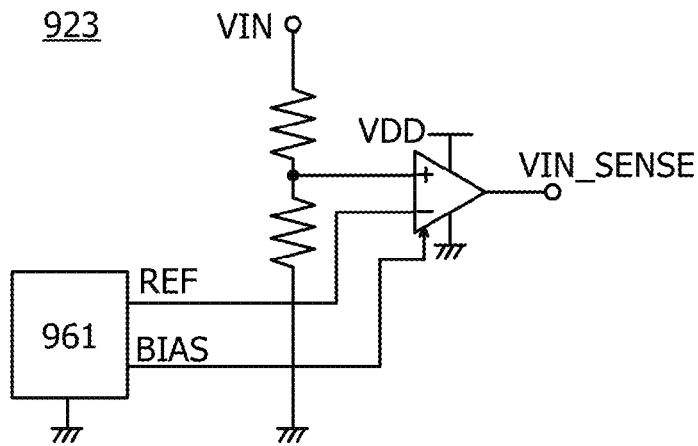
FIG. 42 is a circuit diagram for illustrating one embodiment of the present invention.

FIG. 42 is a circuit diagram illustrating a structure example of the voltage detector circuit 923. The voltage detector circuit 923 determines whether the voltage VIN is higher or lower than a predetermined value and generates a digital signal corresponding to the determination result. This digital signal is used as a trigger signal for operating the logic portion 940. The voltages BIAS and REF input to a comparator of the voltage detector circuit 923 are input from the voltage generation circuit 961 of the power circuit 921. In the example of FIG. 42, the voltage detector circuit 923 includes the comparator. The comparator generates and outputs a signal VIN_SENSE.

Figure 43:
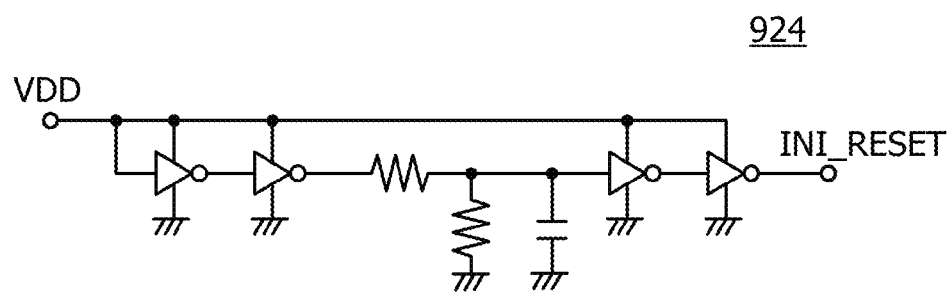
FIG. 43 is a circuit diagram for illustrating one embodiment of the present invention.

The reset circuit 924 monitors the voltage generated by the power circuit 921 and generates a reset signal that resets the logic portion 940. FIG. 43 is a circuit diagram illustrating a structure example of the reset circuit 924. In this example, the reset circuit 924 detects rising of the voltage VDD and generates a reset signal INI_RESET.

Figure 44:
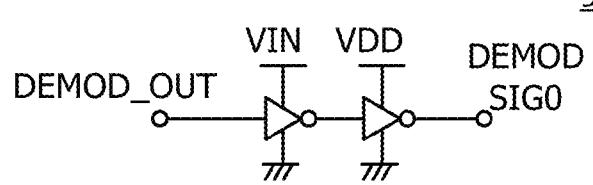
FIG. 44 is a circuit diagram for illustrating one embodiment of the present invention.

The buffer circuit 925 is a circuit that transmits the signal DEMOD_OUT demodulated in the demodulation circuit 913 to the logic portion 940. FIG. 44 is a circuit diagram illustrating a structure example of the buffer circuit 925. In the buffer circuit 925, the signal DEMOD_OUT is converted into a signal DEMOD_SIG0 through an inverter in the second stage, and is input to the logic portion 940.

<Memory Portion>

The memory portion 930 includes a charge pump circuit 931 in addition to a memory circuit. For the structure of the memory circuit, <Structure example of memory circuit> in Embodiment 3 can be referred to.

Figure 45:
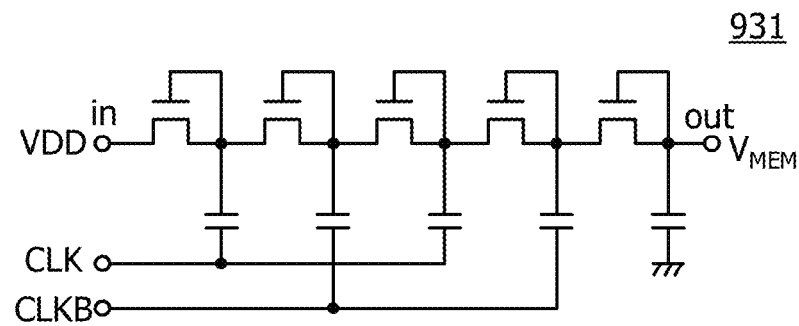
FIG. 45 is a circuit diagram for illustrating one embodiment of the present invention.

The charge pump circuit 931 is a circuit that steps up the operating voltage VDD to generate a voltage required to operate the memory portion 930. FIG. 45 is a circuit diagram illustrating a structure example of the charge pump circuit 931. In the charge pump circuit 931, the operating voltage VDD becomes a stepped-up voltage $V_{MEM}$ to be input to the memory circuit.

The voltage to be supplied to the memory portion 930 is generated by the charge pump circuit 931, whereby the power consumption of the wireless sensor 900 can be reduced. The memory portion 930 operates at a higher voltage (2.5 V to 4 V) than other circuits. A structure where the power circuit 921 generates a high voltage in advance and supplies the voltage to the memory portion 930 can be used; however, this structure increases power consumed in the power circuit 921, the oscillator circuit 922, or the voltage detector circuit and is not efficient. In contrast, in the structure of FIG. 38, a low voltage (1.2 V) is generated by the power circuit 921 and stepped down or up by the charge pump circuit 931, which is immediately before the memory portion 930, to be used. Therefore, the power consumed by the power circuit 921 can be small, which is more efficient.

<Logic Portion>

Figure 46:
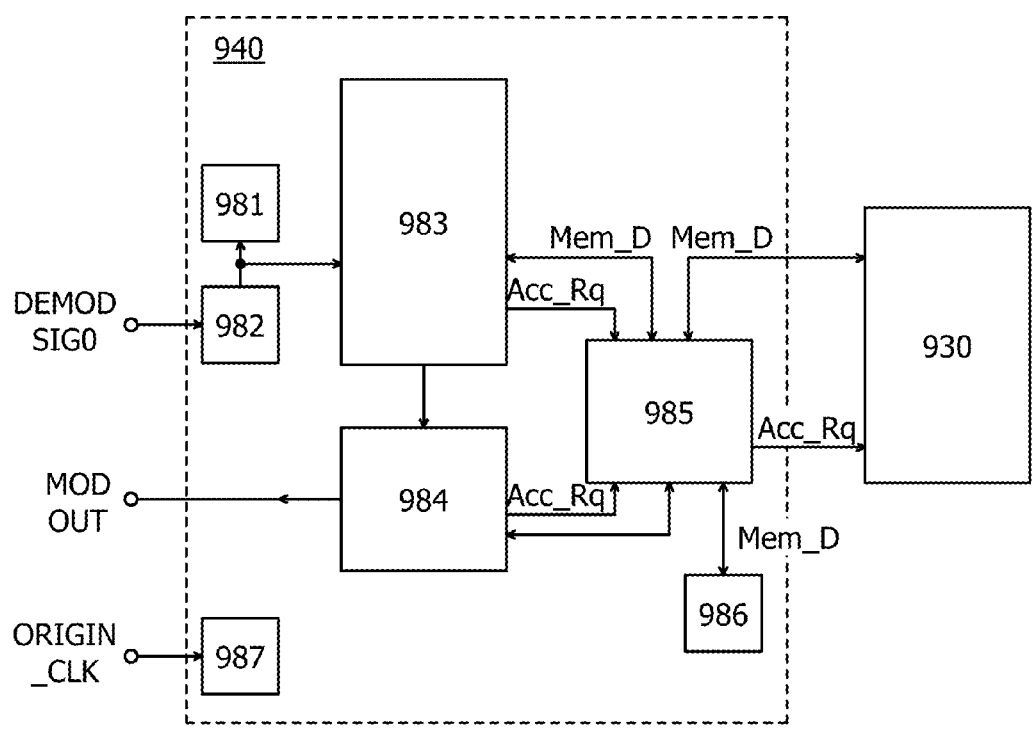
FIG. 46 is a circuit diagram for illustrating one embodiment of the present invention.

FIG. 46 is a block diagram illustrating a structure example of the logic portion 940. The logic portion 940 includes a CRC circuit 981, a decoder circuit 982, a controller 983, an output signal generation circuit 984, a selector circuit 985, a CRC register 986, and a clock generation circuit 987.

The decoder circuit 982 is a circuit that decodes the signal DEMOD_SIG0. The decoded signal is input to the controller 983 and the CRC circuit 981.

The CRC circuit 981 is a circuit that calculates a cyclic redundancy check (CRC) code from an input signal from the decoder circuit 982. The CRC code calculated by the CRC circuit 981 is output to the controller 983.

The controller 983 is a circuit that controls the entire logic portion 940.

The CRC register 986 is a register that functions as a CRC region for storing the CRC code.

The clock generation circuit 987 generates a clock signal used in the logic portion 940 from the signal ORIGIN_CLK.

The memory portion 930 and the CRC register 986 are accessed via the selector circuit 985. The controller 983 and the output signal generation circuit 984 output access request signals (Acc_Rq) to the selector circuit 985. The selector circuit 985 performs writing or reading of memory data (Mem_D) with respect to the memory portion 930 or the CRC register 986 in accordance with the access request signal.

<AD Converter>

The AD converter 950 converts a sensor signal SENSOR with an analog voltage output from the sensor 903 into a digital signal and outputs the signal.

For the AD converter 950, the semiconductor device functioning as an AD converter in Embodiment 1 can be used. The semiconductor device functioning as an AD converter in Embodiment 1 can reduce power consumption without decreasing the performance of the AD converter, such as the resolution or sampling rate, by including the OS transistor.

The wireless sensor described above includes the AD converter and the memory portion including the OS transistor. Thus, a reduction in power consumption can be achieved.

Embodiment 9

The semiconductor device functioning as an AD converter described in one embodiment of the present invention will be described with the use of the drawings different from those shown in the above embodiments. FIG. 37A is a block diagram showing a semiconductor device including a buffer circuit 621, a voltage holding circuit 622 with an OS transistor, a reference voltage generation circuit 623, a digital-analog converter circuit 624, a comparator 625, and a control circuit 626.

The buffer circuit 621 and the voltage holding circuit 622 shown in FIG. 37A together constitute a sample-and-hold circuit. The voltage holding circuit 622 includes a transistor and a capacitor. The control circuit 626 in FIG. 37A is a circuit including the timing controller and the successive approximation register described in the above embodiment, a level shifter, and the like. The reference voltage generation circuit 623 in FIG. 37A is a circuit that generates and outputs the reference voltage Vref to be used in the digital-analog converter circuit 624.

The voltage holding circuit 622 can hold an analog potential without power supply because of the OS transistor included therein. Accordingly, power supply to the buffer circuit 621 can be temporarily stopped. As a result, power consumption can be reduced as compared with the case of using a Si transistor.

The OS transistor has a small off-state current as described above. Therefore, even when the capacitance of the voltage holding circuit 622 is as small as 0.5 pF, the voltage holding circuit 622 can hold an analog potential for 500 µs or more. Small capacitance can reduce the current amount required for charge and discharge of the capacitance. In addition, the period of holding the analog potential can be lengthened, whereby the frequency of a clock signal used for sampling can be reduced. As a result, a leak current flowing in the buffer circuit 621 can be reduced, and thus the power consumption of the sample-and-hold circuit can be reduced.

The OS transistor has a small off-state current, and thus can hold a potential by being turned off. Therefore, once the analog potential is held in the voltage holding circuit 622, power supply to the buffer circuit 621 can be stopped and power consumption in the sample-and-hold circuit can be zero.

In addition, since the OS transistor has a small off-state current, the capacitance of the voltage holding circuit 622 can be 0.5 pF even when the analog potential is held for more than or equal to 500 µs. Meanwhile, when the analog potential is held with a Si transistor, the capacitance of approximately 14 pF is necessary. Thus, the area of the semiconductor device including the OS transistor in the sample-and-hold circuit can be reduced.

Next, FIGS. 37B1 and 37B2 show time dependence of power at the time of analog-digital conversion of data. Note that the AD converter is a successive approximation type, and power consumption thereof is estimated under the conditions that the design rule is 0.18 µm, the resolution is 10 bit, the sampling rate is 2 kSps, the power supply voltage is 3.3 V, the dynamic range is 0 V to 3.3 V, the gain is 26 dB, the latency is 500 µs, and the clock frequency is 26 kHz. FIG. 37B1 is about a semiconductor device with the sample-and-hold circuit including the OS transistor, while FIG. 37B2 is about a semiconductor device with a sample-and-hold circuit including a Si transistor.

In the drawings, $P_{Comp}$ denotes the power consumption of the comparator 625, $P_{S\&H}$ denotes the power consumption of the sample-and-hold circuit, $P_{Vref}$ denotes the power consumption of the reference voltage generation circuit 623, $P_{DAC}$ denotes the power consumption of the digital-analog converter circuit 624, and $P_{CON}$ denotes the power consumption of the control circuit 626.

According to the time dependence of power shown in FIG. 37B1, the power consumption can be estimated to be 16.5 µW. The control circuit 626 consumes certain power to control the various circuits. The sample-and-hold circuit including the OS transistor can hold an analog potential that is once subjected to sampling for 500 µs or more. Accordingly, the power consumption becomes zero after the potential is held. The comparator 625, the reference voltage generation circuit 623, and the digital-analog converter circuit 624 conduct an operation of converting an analog potential into a digital signal in a period of about 10 clocks after the sample-and-hold circuit holds the analog potential. In the example of FIG. 37B1, the power for the sample-and-hold circuit, and that for the comparator 625, the reference voltage generation circuit 623, and the digital-analog converter circuit 624 are not consumed at a time, whereby the peak of power consumption can be lowered.

Meanwhile, according to the time dependence of power shown in FIG. 37B2, the power consumption can be estimated to be 27.5 µW. The control circuit 626 consumes certain power to control the various circuits. The sample-and-hold circuit including the Si transistor has difficulty holding an analog potential subjected to sampling for 500 μs or more. Accordingly, sampling should be continuously performed. The comparator 625, the reference voltage generation circuit 623, and the digital-analog converter circuit 624 conduct an operation of converting an analog potential into a digital signal in a period of about 10 clocks. Even in this period, the sample-and-hold circuit continues sampling of the analog potential. In the example of FIG. 37B2, the power for the sample-and-hold circuit, and that for the comparator 625, the reference voltage generation circuit 623, and the digital-analog converter circuit 624 are consumed at a time, whereby the peak of power consumption is heightened.

As described above, the sample-and-hold circuit including the OS transistor has advantages in the less power consumption and reduction in area as compared with the sample-and-hold circuit including the Si transistor.

Embodiment 10

Figure 47A:
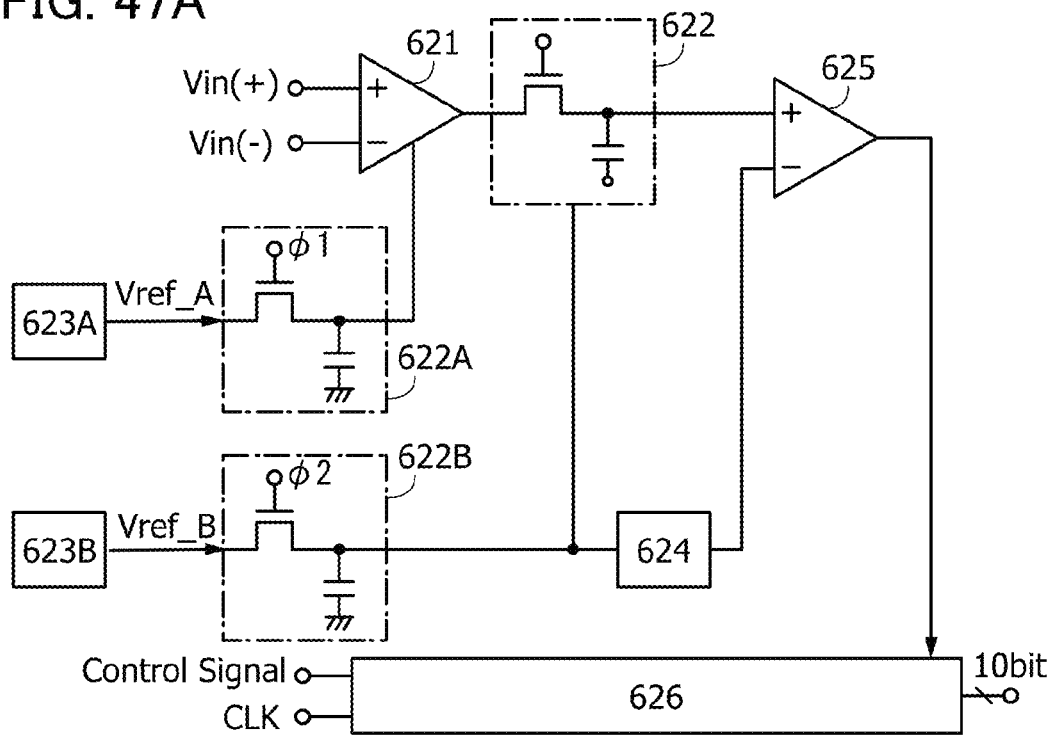
FIGS. 47A and 47B are a block diagram and a timing chart for illustrating one embodiment of the present invention.

The semiconductor device functioning as an AD converter described in one embodiment of the present invention will be described with the use of the drawings different from those shown in the above embodiments. FIG. 47A shows a structure partly different from that of FIG. 37A described in Embodiment 9. The parts in FIG. 47A that are the same as those in FIG. 37A are denoted by the same reference numerals as those in FIG. 37A, and repeated explanation will be omitted.

FIG. 47A is a block diagram of a semiconductor device including the buffer circuit 621, voltage holding circuits 622, 622A, and 622B each including an OS transistor, reference voltage generation circuits 623A and 623B, the digital-analog converter circuit 624, the comparator 625, and the control circuit 626. The reference voltage generation circuit 623A generates and outputs a reference voltage Vref_A used in the buffer circuit 621. The reference voltage generation circuit 623B shown in FIG. 47A generates and outputs a reference voltage Vref_B used in the voltage holding circuit 622 and the digital-analog converter circuit 624.

The circuits 622A and 622B shown in FIG. 47A together constitute a sample-and-hold circuit. The voltage holding circuits 622A and 622B each include a transistor and a capacitor.

The voltage holding circuits 622A and 622B can each hold an analog potential without power supply because of the OS transistors included therein. Accordingly, power supply to the reference voltage generation circuit 623A and 623B can be temporarily stopped. As a result, power consumption can be reduced as compared with the case of using a Si transistor.

Figure 47B:
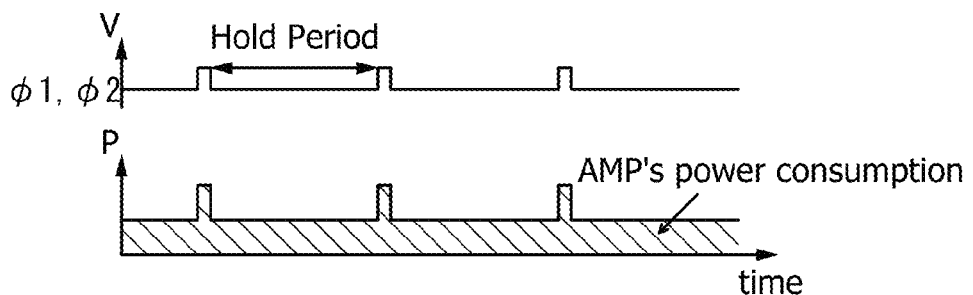

FIG. 47B is a timing chart illustrating the operation of the voltage holding circuits 622A and 622B. FIG. 47B shows a waveform showing a change of the voltage V of signals φ1 and φ2 supplied to the transistors in the voltage holding circuits 622A and 622B, and the power consumption of an amplifier functioning as the buffer circuit 621 ("AMP's power consumption" in the drawing) with the vertical axis representing the power consumption P and the horizontal axis representing time.

As shown in FIG. 47B, the signals φ1 and φ2 are periodically set high to have the voltage holding circuits 622A and 622B hold the reference voltages Vref_A and Vref_B. As described above, the OS transistor can hold the analog potential without power supply. Therefore, a period where the signals φ1 and φ2 are low ("Hold Period" in the drawing) can be lengthened. Therefore, the power consumption in the buffer circuit 621 can be reduced while the signals φ1 and φ2 are low. Note that the effect similar to the reduction in power consumption in the buffer circuit 621 can be obtained also in the digital-analog converter circuit 624.

Next, simulation was conducted to estimate the amount of reduction in power consumption of a semiconductor device.

Table 1 shows the specifications of a semiconductor device in the simulation. The graph in FIG. 48 shows estimation of current consumption (vertical axis) when the voltage holding circuits 622 and 622A are included ("With CAAC-OS" in the drawing) and when they are not included ("Without CAAC-OS" in the drawing).

TABLE 1

| Design Rule | 180-nm and 350-nm Si, and 180-nm CAAC-OS |
|---|---|
| Resolution | 10 Bits |
| Sampling Rate | 2 kSps |
| Supply Voltage | 3.3 V |
| AMP Gain | 26 dB |
| Latency | 500 ms |
| Clock Frequency | 26 kHz |

Figure 48:
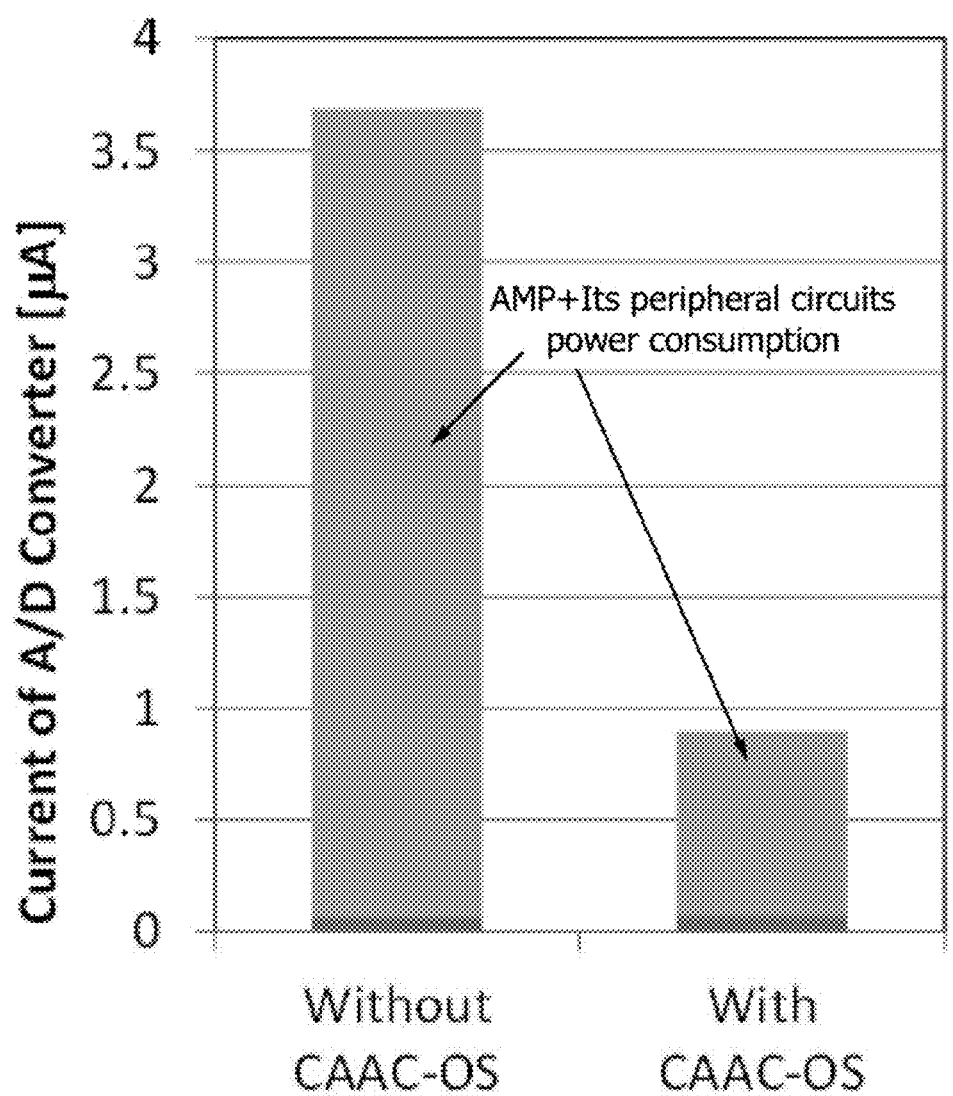
FIG. 48 is a graph for illustrating one embodiment of the present invention.

As shown in FIG. 48, owing to the voltage holding circuits 622 and 622A, the current consumption of the amplifier and its peripheral circuits ("AMP+Its peripheral circuits power consumption" in the drawing) that accounts for a large proportion of the current consumption can be greatly reduced.

As described above, the sample-and-hold circuit including the OS transistor has advantages in the less power consumption even when it is provided between the reference voltage generation circuit and the circuit that requires the reference voltage.

(Notes about the Description in the Specification and the Like)

Additional notes are provided below as to the above embodiments and the description of the structures in the above embodiments.

<Notes about One Embodiment of the Present Invention Described in the Embodiments>

The structure described in each embodiment can be used as appropriate in combination with any of the structures described in the other embodiments to make another embodiment of the present invention. In addition, in the case where a plurality of structural examples is given in one embodiment, any of the structure examples can be combined as appropriate.

Note that a content (or may be part of the content) described in one embodiment may be applied to, combined with, or replaced by a different content (or may be part of the different content) described in the embodiment and/or a content (or may be part of the content) described in one or a plurality of different embodiments.

Note that in each embodiment, a content described in the embodiment is a content described with reference to a variety of diagrams or a content described with a text described in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in one or a plurality of different embodiments, much more diagrams can be formed.

One embodiment of the present invention is described in each embodiment, but one embodiment of the present invention is not limited thereto. For example, although an example where the analog potential is held in the sample-and-hold circuit 101 by utilizing the transistor 112 and power supply to the buffer circuit 111 or the like is stopped is shown as one embodiment of the present invention in Embodiment 1, one embodiment of the present invention is not limited thereto. Depending on circumstances, a structure where the analog potential is held in the sample-and-hold circuit 101 without the use of the transistor 112 and power supply to the buffer circuit 111 or the like is stopped may be taken as one embodiment of the present invention. Alternatively, depending on circumstances, a structure where power supply to the buffer circuit 111 or the like is not stopped may be taken as one embodiment of the present invention.

<Notes about the Description for the Drawings>

In this specification and the like, terms for describing arrangement, such as "over" and "under", are used for convenience to indicate a positional relation between components with reference to drawings. The positional relation between components is changed as appropriate in accordance with the direction in which each component is described. Therefore, terms for describing arrangement are not limited to the terms used in the description in the specification, and can be appropriately reworded depending on situations.

Note that the term "over" or "under" does not necessarily mean that a component is placed directly above or directly below and directly in contact with another component. For example, the expression "electrode B over insulating layer A" does not necessarily mean that the electrode B is above and in direct contact with the insulating layer A and can mean the case where another component is provided between the insulating layer A and the electrode B.

In this specification and the like, components are classified on the basis of the functions, and shown as blocks independent of one another in block diagrams. However, in an actual circuit or the like, it may be difficult to separate components on the basis of the functions, so that one circuit may be associated with a plurality of functions and several circuits may be associated with one function. Therefore, the segmentation of a block in the block diagrams is not limited by any of the components described in the specification, and can be differently determined as appropriate depending on situations.

In the drawings, the size, the layer thickness, or the region has arbitrary magnitude for convenience for the description. Therefore, embodiments of the present invention are not limited to such a scale. Note that the drawings are schematically illustrated for clarity, and shapes or values are not limited to those illustrated in the drawings. For example, the following can be included: variation in signal, voltage, or current due to noise or difference in timing.

In a top view (also referred to as a plan view or a layout chart), a perspective view, and the like, some components are not illustrated for clarity of the drawing in some cases.

<Notes about the Description that can be Rephrased or Reworded>

In this specification or the like, in description of connections of a transistor, descriptions of "one of a source and a drain" (or a first electrode or a first terminal), and "the other of the source and the drain" (or a second electrode or a second terminal) are used. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In addition, in this specification and the like, the term such as an "electrode" or a "wiring" does not limit the function of a component. For example, an "electrode" is used as part of a "wiring" in some cases, and vice versa. Further, the term "electrode" or "wiring" can also mean a combination of a plurality of "electrodes" and "wirings" formed in an integrated manner.

In this specification and the like, the terms "voltage" and "potential" are interchangeable in appropriate cases. The term "voltage" refers to a potential difference between a given potential and a reference potential. When the reference potential is a ground potential, the term "voltage" can be replaced with the term "potential". The ground potential does not necessarily mean 0 V. Note that a potential is relative, and a potential supplied to wirings or the like may be changed depending on a reference potential.

In this specification and the like, the terms "film", "layer", and the like can be interchanged with each other depending on the case or circumstances. For example, the term "conductive layer" can be changed into the term "conductive film" in some cases. Also, the term "insulating film" can be changed into the term "insulating layer" in some cases.

Although a circuit structure where a charge is held with the use of one OS transistor and one capacitor is shown in this specification and the like, one embodiment of the present invention is not limited thereto. A charge can be held with a circuit structure including two or more transistors and two or more capacitors. Any of other various circuit structures including other wirings can be used.

<Notes about Definitions of Terms>

Definitions of terms that are not mentioned in the above embodiments are described below.

<<About Switch>>

In this specification and the like, a switch is an element that is brought into a conduction state or a non-conduction state (is turned on or off) to determine whether to have a current flow therethrough or not. Alternatively, the switch is an element having a function of selecting and changing a current path.

For example, an electrical switch, a mechanical switch, or the like can be used as a switch. That is, any element can be used as a switch as long as it can control current, without limitation to a certain element.

A transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), or a logic circuit in which such elements are combined can be used as an electrical switch.

When a transistor is used as a switch, an "on state" of the transistor refers to a state in which a source and a drain of the transistor are electrically short-circuited. Furthermore, an "off state" of the transistor refers to a state in which the source and drain of the transistor are electrically disconnected. Note that if the transistor operates just as a switch, there is no particular limitation on the polarity (conductivity type) of the transistor.

An example of a mechanical switch is a switch formed using a MEMS (micro electro mechanical system) technology, such as a digital micromirror device (DMD). Such a switch includes an electrode which can be moved mechanically, and operates by controlling conduction and non-conduction in accordance with movement of the electrode.

<<About Channel Length>>

In this specification and the like, the channel length refers to, for example, a distance between a source and a drain in a region where a semiconductor (or a portion where a current flows in the semiconductor when a transistor is on) and a gate overlap with each other or a region where a channel is formed in a top view of the transistor.

In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

<<About Channel Width>>

In this specification and the like, a channel width refers to, for example, the length of a portion where a source and a drain face each other in a region where a semiconductor (or a portion where a current flows in a semiconductor when a transistor is on) and a gate overlap with each other, or a region where a channel is formed in a top view of the transistor.

In one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Further, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, a value different from one in the case where an effective channel width is used for the calculation is obtained in some cases.

<<About Connection>>

In this specification and the like, the expression "A and B are connected" means the case where A and B are electrically connected to each other in addition to the case where A and B are directly connected to each other. Here, the expression "A and B are electrically connected" means the case where electric signals can be transmitted and received between A and B when an object having any electric action exists between A and B.

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Another example of the expressions is, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path". Another example of the expressions is "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and there is no limitation on expression. Here, X, Y, Z1, and Z2 each denote an object (e.g., a device, an element, a circuit, a wiring, an electrode, a terminal, a conductive film, and a layer).

This application is based on Japanese Patent Application serial no. 2014-195976 filed with Japan Patent Office on Sep. 26, 2014, Japanese Patent Application serial no. 2014-199685 filed with Japan Patent Office on Sep. 30, 2014, Japanese Patent Application serial no. 2014-208851 filed with Japan Patent Office on Oct. 10, 2014, and Japanese Patent Application serial no. 2014-242947 filed with Japan Patent Office on Dec. 1, 2014, the entire contents of which are hereby incorporated by reference.

What is claimed is:

1. A semiconductor device comprising:
a sample-and-hold circuit including a buffer circuit, a transistor including an oxide semiconductor containing indium and oxide in a channel formation region, and a capacitor;
a comparator;
a successive approximation register;
a digital-analog converter circuit; and
a timing controller,
wherein one of a source and a drain of the transistor is electrically connected to the buffer circuit,
wherein the other of the source and the drain of the transistor is configured to hold a charge by turning off the transistor, and
wherein the semiconductor device is configured to stop supply of a power supply voltage to the buffer circuit after holding the charge.

2. The semiconductor device according to claim 1,
wherein the timing controller is configured to output a signal for controlling an on/off state of the transistor.

3. An electronic device comprising:
the semiconductor device according to claim 1; and
a display portion.

4. A wireless sensor comprising:
the semiconductor device according to claim 1;
an antenna;
an integrated circuit portion including a memory circuit; and
a sensor circuit.

5. The wireless sensor according to claim 4,
wherein the memory circuit comprises a third transistor and a fourth transistor,
wherein one of a source and a drain of the third transistor is electrically connected to a gate of the fourth transistor,
wherein the one of the source and the drain of the third transistor is configured to hold a second charge by turning off the third transistor, and
wherein a channel formation region of the third transistor includes an oxide semiconductor.

6. The wireless sensor according to claim 5,
wherein a channel formation region of the fourth transistor includes silicon.

7. The semiconductor device according to claim 1,
wherein a normalized off-state current per micrometer in channel width of the transistor is $1 \times 10^{18}$ A or less at room temperature.

8. The semiconductor device according to claim 1,
wherein the oxide semiconductor include a crystal.

9. A semiconductor device comprising:
a sample-and-hold circuit including a buffer circuit, a first transistor including an oxide semiconductor containing indium and oxide in a channel formation region, and a first capacitor;
a comparator;
a successive approximation register;
a digital-analog converter circuit including a plurality of selectors, a second transistor, and a second capacitor; and
a timing controller,
wherein one of a source and a drain of the first transistor is electrically connected to the buffer circuit,
wherein the other of the source and the drain of the first transistor is configured to hold a first charge by turning off the first transistor,
wherein one of a source and a drain of the second transistor is electrically connected to the successive approximation register,
wherein the other of the source and the drain of the second transistor is configured to hold a second charge by turning off the second transistor, and
wherein the semiconductor device is configured to stop supply of power supply voltages to the buffer circuit, the successive approximation register, the comparator, and the digital-analog converter circuit after holding the first charge.

10. The semiconductor device according to claim 9,
wherein the timing controller is configured to output a signal for controlling on/off states of the first transistor and the second transistor.

11. An electronic device comprising:
the semiconductor device according to claim 9; and
a display portion.

12. A wireless sensor comprising:
the semiconductor device according to claim 9;
an antenna;
an integrated circuit portion including a memory circuit; and
a sensor circuit.

13. The wireless sensor according to claim 12,
wherein the memory circuit comprises a third transistor and a fourth transistor,
wherein one of a source and a drain of the third transistor is electrically connected to a gate of the fourth transistor,
wherein the one of the source and the drain of the third transistor is configured to hold a third charge, and
wherein a channel formation region of the third transistor includes an oxide semiconductor.

14. The wireless sensor according to claim 13,
wherein a channel formation region of the fourth transistor comprises silicon.

15. The semiconductor device according to claim 9,
wherein a normalized off-state current per micrometer in channel width of the first transistor is $1\times10^{18}$ A or less at room temperature.

16. The semiconductor device according to claim 9,
wherein the oxide semiconductor include a crystal.

17. A semiconductor device comprising:
a sample-and-hold circuit including a buffer circuit, a transistor including an oxide semiconductor containing indium and oxide in a channel formation region, and a capacitor;
a comparator electrically connected to one of a source and a drain of the transistor and the capacitor;
a successive approximation register electrically connected to the comparator;
a digital-analog converter circuit electrically connected to the successive approximation register and the comparator; and
a timing controller electrically connected to a gate of the transistor, the successive approximation register, and the digital-analog converter circuit,
wherein the other of the source and the drain of the transistor is electrically connected to the buffer circuit.

18. The semiconductor device according to claim 17,
wherein the timing controller is configured to output a signal for controlling an on/off state of the transistor.

19. An electronic device comprising:
the semiconductor device according to claim 17; and
a display portion.

20. A wireless sensor comprising:
the semiconductor device according to claim 17;
an antenna;
an integrated circuit portion including a memory circuit; and
a sensor circuit.

21. The wireless sensor according to claim 20,
wherein the memory circuit comprises a third transistor and a fourth transistor,
wherein one of a source and a drain of the third transistor is electrically connected to a gate of the fourth transistor,
wherein the one of the source and the drain of the third transistor is configured to hold a charge by turning off the third transistor, and
wherein a channel formation region of the third transistor includes an oxide semiconductor.

22. The wireless sensor according to claim 21,
wherein a channel formation region of the fourth transistor includes silicon.

23. The semiconductor device according to claim 17,
wherein a normalized off-state current per micrometer in channel width of the transistor is $1\times10^{18}$ A or less at room temperature.

24. The semiconductor device according to claim 17,
wherein the oxide semiconductor include a crystal.

* * * * *

UNITED STATES PATENT AND TRADEMARK OFFICE
CERTIFICATE OF CORRECTION

PATENT NO. : 9,859,905 B2  
APPLICATION NO. : 14/862284  
DATED : January 2, 2018  
INVENTOR(S) : Yutaka Shionoiri et al.

Page 1 of 1

It is certified that error appears in the above-identified patent and that said Letters Patent is hereby corrected as shown below:

In the Claims

Column 48, Claim 7, Line 14, "width of the transistor is $1 \times 10^{18}$ A" should read -- width of the transistor is $1 \times 10^{-18}$ A --

Column 49, Claim 15, Line 6, "width of the first transistor is $1 \times 10^{18}$ A" should read -- width of the first transistor is $1 \times 10^{-18}$ A --

Column 50, Claim 23, Line 25, "width of the transistor is $1 \times 10^{18}$ A" should read -- width of the transistor is $1 \times 10^{-18}$ A --

Signed and Sealed this  
Tenth Day of April, 2018

Andrei Iancu  
*Director of the United States Patent and Trademark Office*